US012394717B2

(12) United States Patent
Chin et al.

(10) Patent No.: US 12,394,717 B2
(45) Date of Patent: Aug. 19, 2025

(54) GRAPHITE-BASED INTERCONNECTS AND METHODS OF FABRICATION THEREOF

(71) Applicant: Taiwan Semiconductor Manufacturing Company, Ltd., Hsin-Chu (TW)

(72) Inventors: Shu-Cheng Chin, Hsinchu (TW); Chih-Chien Chi, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 549 days.

(21) Appl. No.: 17/827,500

(22) Filed: May 27, 2022

(65) Prior Publication Data

US 2023/0275024 A1    Aug. 31, 2023

Related U.S. Application Data

(60) Provisional application No. 63/314,021, filed on Feb. 25, 2022.

(51) Int. Cl.
*H01L 23/532* (2006.01)
*H01L 21/768* (2006.01)
(Continued)

(52) U.S. Cl.
CPC .. *H01L 23/53276* (2013.01); *H01L 21/76834* (2013.01); *H01L 21/76885* (2013.01);
(Continued)

(58) Field of Classification Search
CPC ......... H01L 23/53276; H01L 21/76834; H01L 21/76885; H01L 23/5226; H01L 23/564;
(Continued)

(56) References Cited

U.S. PATENT DOCUMENTS

| 2010/0327444 A1* | 12/2010 | Kondo | H01L 21/76885 |
|---|---|---|---|
| | | | 428/408 |
| 2013/0015583 A1* | 1/2013 | Hoeckele | H10N 70/8845 |
| | | | 438/618 |

(Continued)

FOREIGN PATENT DOCUMENTS

| KR | 20120035857 A | 4/2012 |
|---|---|---|
| TW | 202025388 A | 7/2020 |
| TW | 202109754 A | 3/2021 |

OTHER PUBLICATIONS

Xuekun Lu, "Patterning of Highly Oriented Pyrolytic Graphite by Oxygen Plasma Etching", Applied Physics Letters, vol. 75, No. 2, Jul. 12, 1999, 3 pages.

(Continued)

*Primary Examiner* — Fernando L Toledo
*Assistant Examiner* — Shawn Shaw Muslim
(74) *Attorney, Agent, or Firm* — HAYNES AND BOONE, LLP

(57) ABSTRACT

Barrier-free interconnects and methods of fabrication thereof are disclosed herein. An exemplary interconnect structure has a conductive line disposed over a conductive via. The conductive line has a first conductive plug disposed in a first dielectric layer, and the first conductive plug includes an electrically conductive non-metal material, such as graphite. The conductive via includes a second conductive plug disposed in a second dielectric layer, and the second conductive plug includes a metal material, such as tungsten, ruthenium, molybdenum, or combinations thereof. The first conductive plug physically contacts the second conductive plug and the second dielectric layer. The second conductive plug physically contacts the second dielectric layer. Spacers (which are insulators) may be disposed between sidewalls of the first conductive plug and the first (Continued)

dielectric layer. The spacers may further be disposed between the first dielectric layer and the second dielectric layer.

20 Claims, 32 Drawing Sheets

(51) Int. Cl.
*H01L 23/00* (2006.01)
*H01L 23/522* (2006.01)
*H01L 23/58* (2006.01)
*H01L 21/3213* (2006.01)

(52) U.S. Cl.
CPC ........ *H01L 23/5226* (2013.01); *H01L 23/564* (2013.01); *H01L 23/585* (2013.01); *H01L 21/32136* (2013.01); *H01L 21/32139* (2013.01); *H01L 21/76877* (2013.01); *H01L 23/53257* (2013.01)

(58) Field of Classification Search
CPC ............. H01L 23/585; H01L 21/32136; H01L 21/32139; H01L 21/76877; H01L 23/53257; H01L 21/31053; H01L 21/76865; H01L 21/76876; H01L 21/76879; H01L 23/5283; H01L 21/76802
See application file for complete search history.

(56) References Cited

U.S. PATENT DOCUMENTS

| 2017/0186732 A1* | 6/2017 | Chu .................. H01L 24/24 |
| 2022/0020688 A1* | 1/2022 | Xie .................. H01L 21/76852 |
| 2022/0139823 A1* | 5/2022 | Lin .................. H01L 21/76841 257/774 |

OTHER PUBLICATIONS

Riteshkumar Vishwakarma, et al., "Transfer Free Graphene Growth on Sio2 Substrate at 250° C.," Scientific Reports, Published Mar. 2, 2017, www.nature.com/scientific reports, 8 pages.

Shijing Wei, et al. "Water-Assisted Rapid Growth of Monolayer Graphene Films on Sio2/Si Substrates," Carbon 148 (2019), pp. 241-248.

Daniel Gall "The Search for the Most Conductive Metal for Narrow Interconnect Lines," J. Appl. Phys. 127, 050901 (2020), https://doi.org/10.1063/1.5133674, 11 pages.

* cited by examiner

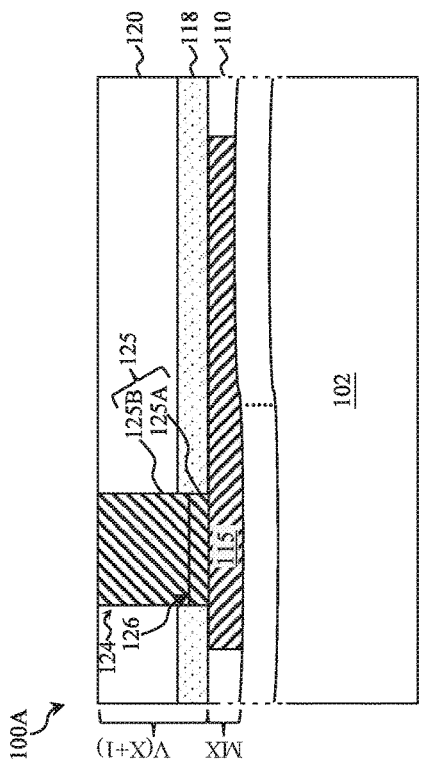
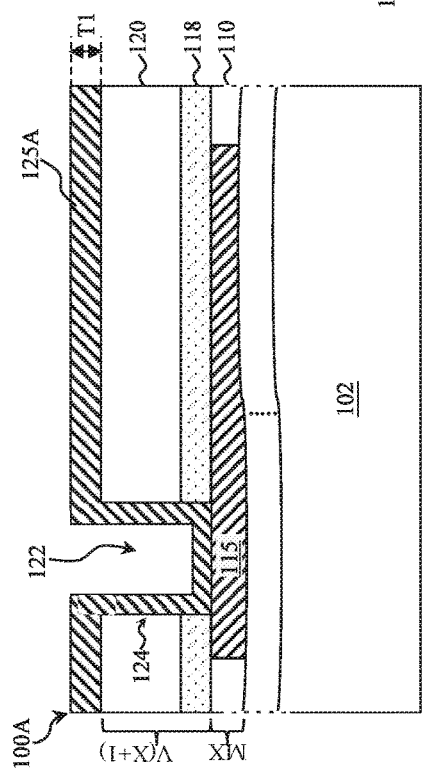
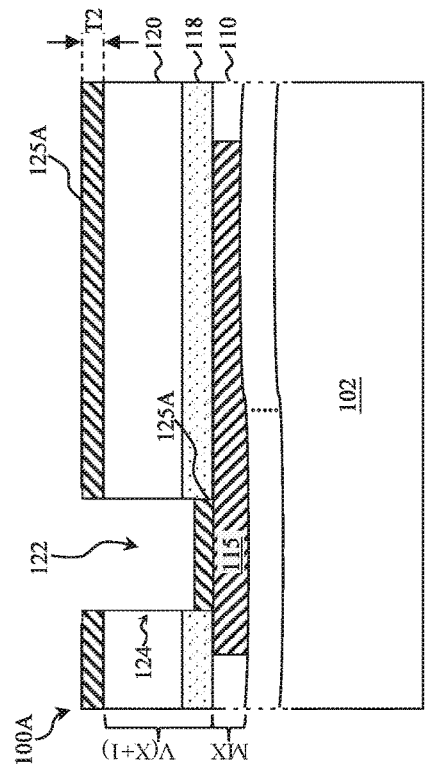
FIG. 3A
FIG. 3B
FIG. 3C

GRAPHITE-BASED INTERCONNECTS AND METHODS OF FABRICATION THEREOF

The present application is a non-provisional application of and claims benefit of U.S. Patent Application Ser. No. 63/314,021, filed Feb. 25, 2022, the entire disclosure of which is incorporated herein by reference.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected IC devices per chip area) has generally increased while geometry size (i.e., dimensions and/or sizes of IC features and/or spacings between these IC features) has decreased. Typically, scaling down has been limited only by an ability to lithographically define IC features at the ever-decreasing geometry sizes. However, resistance-capacitance (RC) delay has arisen as a significant challenge as reduced geometry sizes are implemented to achieve ICs with faster operating speeds (e.g., by reducing distances traveled by electrical signals), thereby negating some of the advantages achieved by scaling down and limiting further scaling down of ICs. RC delay generally indicates delay in electrical signal speed through an IC resulting from a product of resistance (R) (i.e., a material's opposition to flow of electrical current) and capacitance (C) (i.e., a material's ability to store electrical charge). Reducing both resistance and capacitance is thus desired to reduce RC delay and optimize performance of scaled down ICs. Interconnects of ICs, which physically and/or electrically connect IC components and/or IC features of the ICs, are particularly problematic in their contributions to RC delay. A need thus exists for improvements in interconnects of ICs and/or methods of fabricating interconnects of ICs.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A-3C are diagrammatic cross-sectional views of an interconnect structure, in portion or entirety, during fabrication according to various aspects of the present disclosure.

DETAILED DESCRIPTION

Figure 1:
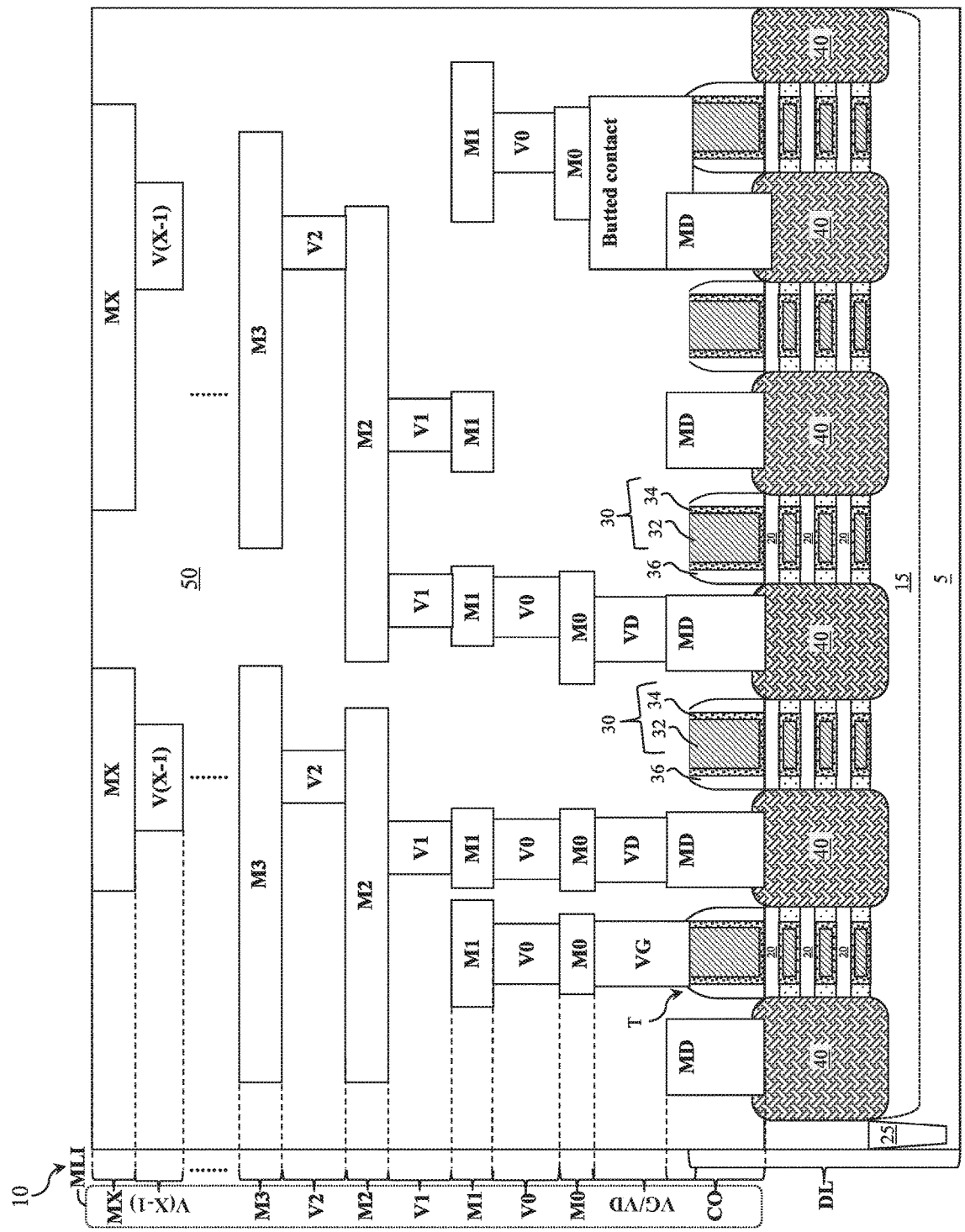
FIG. 1 is a diagrammatic cross-sectional view of various layers (levels) of a device, in portion or entirety, according to various aspects of the present disclosure.

The present disclosure relates generally to integrated circuit (IC) devices, and more particularly, to interconnect structures for IC devices.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Typically, scaling down has been limited only by an ability to lithographically define IC features at ever-decreasing geometry sizes. However, resistance-capacitance (RC) delay has arisen as a significant challenge as reduced geometry sizes are implemented to achieve ICs with faster operating speeds (for example, by reducing distances traveled by electrical signals), thereby negating some of the advantages achieved by scaling down and limiting further scaling. For example, as IC technology nodes expand into 20 nm and below, shrinking critical dimensions (CDs) at IC device layers (for example, gate lengths, gate pitches, fin pitches, etc.) have led to corresponding shrinking in interconnect CDs (for example, device-level contact dimensions, via dimensions, metal line dimensions, device-level contact pitches, via pitches, metal line pitches, etc.) of multi-layer interconnects (MLIs) of the ICs. Shrinking interconnects are becoming increasingly problematic when considering their contribution to RC delay. Solutions for reducing both resistance and capacitance associated with interconnects are thus desired to reduce RC delay and optimize performance of scaled down ICs.

RC delay generally indicates delay in electrical signal speed through an IC resulting from a product of resistance (R), a material's opposition to flow of electrical current, and capacitance (C), a material's ability to store electrical charge. For any two adjacent interconnects, capacitance is a function of a dielectric constant of dielectric material surrounding the two interconnects and a distance between the interconnects. Since decreased distances (spacing) between interconnects results from scaling down ICs (and thus results in increased capacitance), capacitance reduction techniques have focused on reducing a dielectric constant of insulating material of the interconnects. For example, low-k dielectric materials, such as dielectric materials having dielectric constants less than silicon oxide (for example, $SiO_2$), have been developed that reduce parasitic capacitance and/or capacitive coupling between interconnects and adjacent conductive features, such as adjacent interconnects or adjacent device features (for example, gates). Reducing resistance associated with interconnects has been achieved by implementing interconnect materials and/or interconnect configurations that exhibit decreased resistance and facilitate increased electrical current flow. For example, since copper interconnects exhibit lower electrical resistance, higher conductivity, and higher resistivity to electromigration than aluminum interconnects, aluminum interconnects are often replaced with copper interconnects to reduce RC delay and thereby increase IC speed. However, because copper ions/atoms of copper interconnects diffuse easily into low-k dielectric material (which have been implemented to reduce capacitance), diffusion/barrier layers/liners are often integrated in copper interconnects to separate copper layers of the copper interconnects from surrounding low-k dielectric material and reduce (or prevent) diffusion of copper atoms/ions from the copper layers into the surrounding low-k dielectric material. As interconnect CDs (i.e., conductive line widths) decrease, diffusion/barrier layers/liners in interconnects present challenges. For example, integrating diffusion/barrier layers/liners into an interconnect structure reduces a volume of copper interconnect in the interconnect structure, which reduces conductivity and increases resistance. Further, scattering at interfaces between copper interconnects and their diffusion/barrier/liner layers have been observed to undesirably increase resistivity, particularly as interconnect CDs reach about 10 nm and below.

To address these challenges, the present disclosure proposes barrier-free, graphite-based interconnects. Graphite-based interconnect structures disclosed herein include barrier-free graphite plugs and barrier-free metal via plugs, such as ruthenium plugs, tungsten plugs, or molybdenum plugs. The disclosed graphite-based interconnect structures have less metal-metal interfaces, and in some embodiments, have no metal-metal interfaces, which reduces scattering that can increase resistivity of an interconnect structure. Volumes of conductive plugs of the disclosed graphite-based interconnect structures are greater than volumes of conductive plugs in interconnect structures having barriers/liners, which increases conductivity and decreases resistance. Graphite-based interconnect structures disclosed herein exhibit reduced resistance compared to conventional interconnect structures, thereby decreasing RC delay and improving IC device performance for advanced IC technology nodes. The present disclosure contemplates other electrically conductive non-metal materials being substituted for graphite and/or graphene in the disclosed interconnect structures. In such embodiments, graphite plugs are replaced with electrically conducting, non-metal plugs and would provide similar improvements and/or advantages as the graphite plugs (e.g., less metal-metal interfaces, more plug volume, etc.).

FIG. 1 is a fragmentary diagrammatic cross-sectional view of various layers (levels) that can be fabricated over a semiconductor substrate (or wafer) 5 to form a device 10, or portion thereof, according to various aspects of the present disclosure. In FIG. 1, the various layers include a device layer DL and a multilayer interconnect MLI disposed over device layer DL. Device layer DL can include circuitry fabricated thereon and/or thereover by FEOL processing and multilayer interconnect MLI can include circuitry fabricated on and/or over device layer DL by MOL processing and/or BEOL processing. Device 10 may be included in a microprocessor, a memory, integrated circuit (IC) device, or combinations thereof. In some embodiments, device 10 is a portion of an IC chip and/or a system-on-chip (SoC) that includes various passive and active microelectronic devices such as resistors, capacitors, inductors, diodes, p-type FETs (PFETs), n-type FETs (NFETs), metal-oxide-semiconductor FETs (MOSFETs), complementary MOS (CMOS) transistors, bipolar junction transistors (BJTs), laterally diffused MOS (LDMOS) transistors, high voltage transistors, high frequency transistors, other suitable components, or combinations thereof. The transistors may be planar transistors or non-planar transistors, such as fin-like FETs (FinFETs) or gate-all-around (GAA) transistors. FIG. 1 has been simplified for the sake of clarity to better understand the inventive concepts of the present disclosure. Additional features can be added in device 10, and some of the features described below can be replaced, modified, or eliminated in other embodiments of device 10.

Device layer DL can include passive microelectronic devices and/or active microelectronic devices, such as resistors, capacitors, inductors, diodes, PFETs, NFETs, MOSFETs, CMOS transistors, BJTs, LDMOS transistors, high voltage transistors, high frequency transistors, other devices, or combinations thereof. The various microelectronic devices can be configured to provide functionally distinct regions of an IC, such as a logic region (i.e., a core region), a memory region, an analog region, a peripheral region (e.g., an input/output region), a dummy region, other suitable region, or combinations thereof. The logic region may be configured with standard cells, each of which can provide a logic device and/or a logic function, such as an inverter, an AND gate, an NAND gate, an OR gate, an NOR gate, a NOT gate, an XOR gate, an XNOR gate, other suitable logic device, or combinations thereof. The memory region may be configured with memory cells, each of which can provide a storage device and/or storage function, such as flash memory, non-volatile random-access memory, static random-access memory, dynamic random-access memory, other volatile memory, other non-volatile memory, other suitable memory, or combinations thereof. In some embodiments, memory cells and/or logic cells include transistors and interconnect structures that combine to provide storage devices/functions and logic devices/functions, respectively.

Device layer DL includes device components, such as substrate 5, doped regions/wells 15 (e.g., n-wells and/or p-wells), channels 20 disposed over and/or within substrate 5, isolation features 25 (e.g., shallow trench isolation (STI) structures and/or other suitable isolation structures), gate stacks 30 (e.g., gate electrodes 32 and gate dielectrics 34), gate spacers 36 along sidewalls of gate stacks 30, source/ drain features (e.g., epitaxial source/drains 40), other device components/features, or combinations thereof. In the depicted embodiment, device layer DL includes transistors T having channel layers 20 suspended over substrate 5 and extending between epitaxial source/drains 40, where gate stacks 30 of transistors T are disposed on and surround channel layers 20. In such embodiments, transistors T are GAA transistors. In some embodiments, device layer DL includes a planar transistor, where a channel of the planar transistor is formed in a semiconductor substrate between respective source/drains and a respective gate stack is disposed on the channel (e.g., on a portion of the semiconductor substrate in which the channel is formed). In some embodiments, device layer DL includes a non-planar transistor having a channel formed in a semiconductor fin that extends from the semiconductor substrate and between respective source/drains on/in the semiconductor fin, where a respective gate stack is disposed on and wraps the channel of the semiconductor fin (i.e., the non-planar transistor is a FinFET). The various transistors of device layer DL can be configured as planar transistors or non-planar transistors depending on design requirements.

Multilayer interconnect MLI electrically connects devices of device layer DL (e.g., transistors T), components of device layer DL, devices (e.g., a memory device) within multilayer interconnect MLI, components of multilayer interconnect MLI, or combinations thereof, such that the various devices and/or components can operate as specified by design requirements of device 10. Multilayer interconnect MLI includes a combination of dielectric layers (generally depicted as an insulation layer 50) and electrically conductive layers (e.g., patterned metal layers formed by conductive lines, conductive vias, conductive contacts, or combinations thereof) configured to form interconnect (routing) structures. The conductive layers form vertical interconnect structures, such as device-level contacts and/or vias, that connect horizontal interconnect structures, such as conductive lines, in different layers/levels (or different planes) of multilayer interconnect MLI. In some embodiments, the interconnect structures route electrical signals between devices and/or components of device layer DL and/or multilayer interconnect MLI. In some embodiments, the interconnect structures distribute electrical signals (for example, clock signals, voltage signals, and/or ground signals) to the devices and/or the device components of device layer DL and/or multilayer interconnect MLI.

In FIG. 1, multilayer interconnect MLI includes a device-level contact layer (CO level), a device-level via layer (VG/VD level), a metal zero layer (M0 level), a via zero layer (V0 level), a metal one layer (M1 level), a via one layer (V1 level), a metal two layer (M2 level), a via two layer (V2 level), a metal three layer (M3 level) and so on up to a via (X–1) layer (V(X–1) level) and a metal X layer (MX level). X is an integer greater than or equal to 1. Each level of multilayer interconnect MLI includes a respective electrically conductive layer (e.g., conductive lines, conductive vias, conductive contacts, or combinations thereof) disposed in a respective insulation layer (e.g., an interlayer dielectric (ILD) layer and/or a contact etch stop layer (CESL)). For example, CO level includes a portion of insulation layer 50 having source/drain contacts MD disposed therein. VG/VD level includes a portion of insulation layer 50 having gate vias VG, source/drain vias VD, and butted contacts disposed therein, where butted contacts connect respective gate stacks 30 and respective source/drain contacts MD (and thus respective source/drains 40). M0 level includes a portion of insulation layer 50 having M0 lines disposed therein, where gate vias VG connect gate stacks 30 to M0 lines, source/drain vias VD connect source/drain contacts MD to M0 lines, and butted contacts connect source/drain contacts MD and gate stacks 30 to M0 lines. V0 level includes a portion of insulation layer 50 having V0 vias disposed therein, where V0 vias connect M0 lines to M1 lines. M1 level includes a portion of insulation layer 50 having M1 lines disposed therein. V1 level includes a portion of insulation layer 50 having V1 vias disposed therein, where V1 vias connect M1 lines to M2 lines. M2 level includes a portion of insulation layer 50 having M2 lines disposed therein. V2 level includes a portion of insulation layer 50 having V2 vias disposed therein, where V2 vias connect M2 lines to M3 lines. M3 level includes a portion of insulation layer 50 having M3 lines disposed therein. V(X–1) level includes a portion of insulation layer 50 having V(X–1) vias disposed therein, where V(X–1) vias connect M(X–1) lines (not depicted) to MX lines. MX level includes a portion of insulation layer 50 having MX lines disposed therein. The present disclosure contemplates multilayer interconnect MLI having more or less layers and/or levels than depicted. In some embodiments, conductive features at a same level of multilayer interconnect MLI, such as M1 lines of M1 level, are formed simultaneously. In some embodiments, conductive features at a same level of multilayer interconnect MLI have top surfaces that are substantially planar with one another and/or bottom surfaces that are substantially planar with one another.

FIGS. 2A-2I are fragmentary diagrammatic cross-sectional views of an interconnect structure 100A, in portion or entirety, at various stages of fabrication thereof according to an embodiment of the present disclosure. FIGS. 2A-2I have been simplified for the sake of clarity to better understand the inventive concepts of the present disclosure. Additional features can be added in interconnect structure 100, and some of the features described below can be replaced, modified, or eliminated in other embodiments of interconnect structure 100.

Figure 2A:
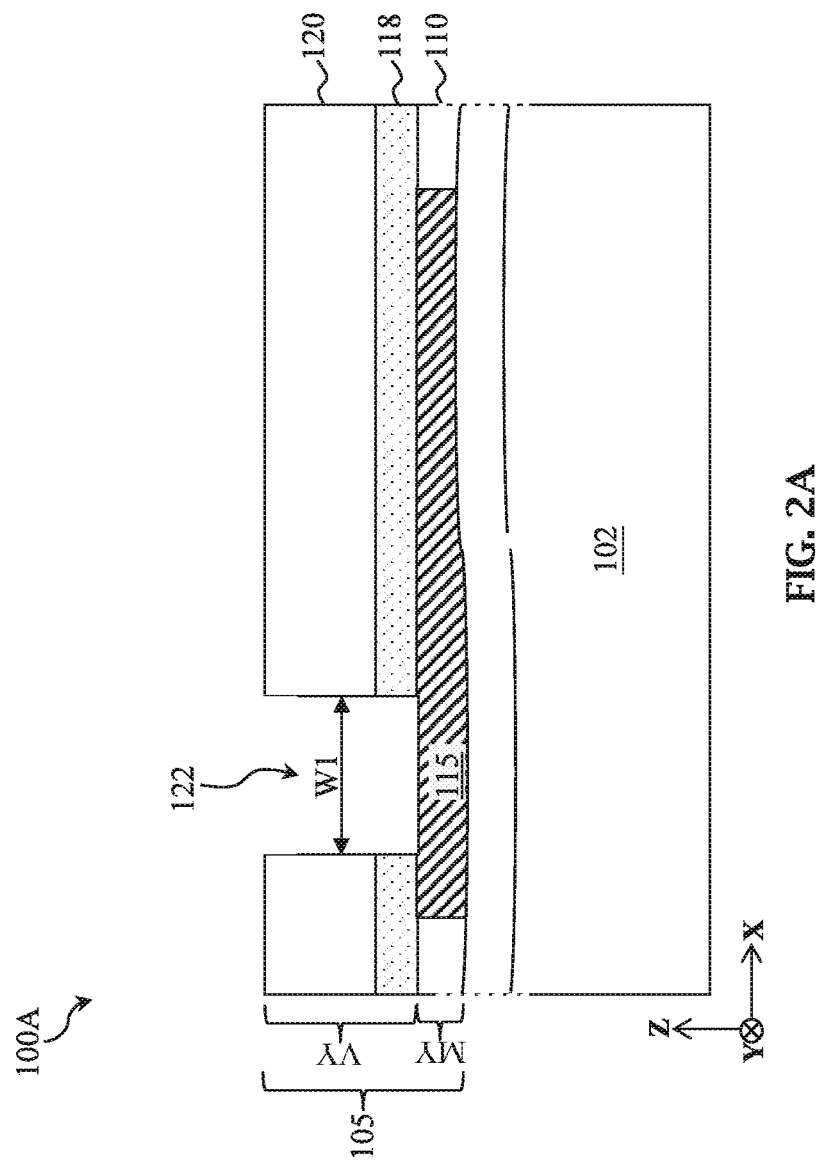
FIGS. 2A-2I are diagrammatic cross-sectional views of an interconnect structure, in portion or entirety, during fabrication according to various aspects of the present disclosure.

Turning to FIG. 2A, a device layer 102 having an MLI 105 disposed thereover is depicted. Device layer 102 may be similar to device layer DL of FIG. 1 and MLI 105 may be similar to multilayer interconnect MLI of FIG. 1. MLI 105 includes a Y routing layer (denoted as MY layer), and Y is an integer that is greater than or equal to zero. MY layer includes a patterned conductive layer (i.e., a group of conductive lines arranged in a desired pattern) disposed in a dielectric layer. A portion of MY layer is depicted in FIG. 2A, such as ILD layer 110 having a conductive line 115 disposed therein. ILD layer 110 includes a dielectric material, such as silicon oxide, tetraethylorthosilicate (TEOS) oxide, phosphosilicate glass (PSG), boron-doped silicate glass (BSG), boron-doped PSG (BPSG), low-k dielectric material (having, for example, a dielectric constant that is less than a dielectric constant of silicon oxide (e.g., k<3.9)), other suitable dielectric material, or combinations thereof. Exemplary low-k dielectric materials include fluorosilicate glass (FSG), carbon-doped oxide, Black Diamond® (Applied Materials of Santa Clara, California), xerogel, aerogel, amorphous fluorinated carbon, parylene, benzocyclobutene (BCB), SiLK (Dow Chemical, Midland, Michigan), polyimide, other low-k dielectric material, or combinations thereof. In some embodiments, ILD layer 110 includes a low-k dielectric material, such as carbon-doped oxide, or an extreme low-k dielectric material (e.g., k<2.5), such as porous carbon-doped oxide. In some embodiments, the dielectric layer of MY layer further includes a CESL between ILD layer 110 and device layer 102. Conductive line 115 may also be disposed in and/or extend through the CESL. The CESL includes a material different than a material of ILD layer 110, such as a dielectric material that is different than the dielectric material of ILD layer 110. For example, where ILD layer 110 is a low-k dielectric layer that includes silicon and oxygen (e.g., SiCOH, $SiO_x$, or other silicon-and-oxygen comprising material), the CESL can include silicon and nitrogen and/or carbon (e.g., SiN, SiCN, SiCON, SiON, SiC, and/or SiCO). The present disclosure further contemplates ILD layer 110 and/or the CESL having a multilayer structure and/or multiple dielectric materials.

In some embodiments, conductive line 115 includes a metal material including aluminum, copper, titanium, tantalum, tungsten, ruthenium, molybdenum, cobalt, iridium, palladium, platinum, nickel, tin, gold, silver, other suitable metals, alloys thereof, silicides thereof, or combinations thereof. In some embodiments, conductive line 115 includes an electrically conductive non-metal material, such as graphite. Conductive line 115 can include a bulk metal layer (also referred to as a metal fill layer, a conductive plug, and a metal plug), a barrier layer, an adhesion layer, other suitable layer, or combinations thereof. For example, conductive line 115 includes a metal plug and a barrier layer disposed between metal plug and ILD layer 110 (and/or the CESL). The metal plug can be a copper plug or a tungsten plug. The barrier layer can include titanium, tantalum, tungsten, ruthenium, molybdenum, cobalt, aluminum, copper, iridium, palladium, platinum, nickel, tin, gold, silver, other suitable metals, alloys thereof (e.g., TiN and/or TaN), silicides thereof, other suitable barrier material (e.g., a material that can prevent diffusion of metal constituents and/or other constituents from conductive line 115 into the dielectric layer), or combinations thereof.

In FIG. 2A, fabrication includes forming a Y via layer (denoted as VY layer) of MLI 105 over MY layer. VY layer will include a patterned via layer (i.e., a group of vias arranged in a desired pattern) disposed in a dielectric layer, and the patterned via layer will electrically and/or physically connect MY layer to an overlying routing layer. In some embodiments, VY layer is formed by depositing a CESL 118 over MY layer, depositing an ILD layer 120 over CESL 118, and patterning ILD layer 120 and CESL 118 to form a via opening 122 therein that exposes a conductive feature of MY layer, such as conductive line 115 (i.e., an underlying conductive feature). In the depicted embodiment, via opening 122 extends through ILD layer 120 and CESL 118 to conductive line 115, via opening 122 has sidewalls formed by ILD layer 120 and CESL 118, and via opening 122 has a bottom formed by conductive line 115. Via opening 122 has a rectangular shape, and a width W1 of via opening 122 is along the x-direction. In the depicted embodiment, width W1 is less than or equal to a width of conductive line 115 along the x-direction. In some embodiments, width W1 is about 8 nm to about 12 nm. In some embodiments, via opening 122 has other shapes, such as a trapezoidal shape.

ILD layer 120 includes a dielectric material, such as those described above with reference to ILD layer 110, and CESL 118 includes a dielectric material that is different than the dielectric material of ILD layer 120, such as those described above with reference to the CESL of MY layer. For example, ILD layer 120 is a low-k dielectric layer that includes silicon and oxygen (e.g., SiCOH, $SiO_x$, or other silicon-and-oxygen comprising material), and CESL 118 includes silicon and nitrogen and/or carbon (e.g., SiN, SiCN, SiCON, SiON, SiC, or SiCO). ILD layer 120 and/or CESL 118 are deposited by chemical vapor deposition (CVD), physical vapor deposition (PVD), atomic layer deposition (ALD), flowable CVD (FCVD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plasma enhanced ALD (PEALD), other suitable methods, or combinations thereof. In some embodiments, CESL 118 is formed over MY layer by CVD, and ILD layer 120 is formed over CESL 118 by FCVD or HPCVD. A CMP process and/or other planarization process can be performed after deposition of ILD layer 120 and/or CESL 118 to provide ILD layer 120 and/or CESL 118 with substantially planar top surfaces.

In some embodiments, forming via opening 122 includes performing a lithography process to form a patterned mask layer (having an opening therein that overlaps conductive line 115) over ILD layer 120 and performing an etching process to transfer a pattern defined in the patterned mask layer to ILD layer 120 and CESL 118. The lithography process can include forming a resist layer on ILD layer 120 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, reflects, or combination thereof radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern (having an opening therein that overlaps conductive line 115) that corresponds with the mask.

In some embodiments, the patterned resist layer is the patterned mask layer, and the patterned resist layer is used as an etch mask during the etching process to remove exposed portions of ILD layer 120 and/or CESL 118, thereby forming via opening 122. In some embodiments, a mask layer is deposited over ILD layer 120 before forming the patterned resist layer. In such embodiments, the patterned resist layer is formed over the mask layer, the patterned resist layer is used as an etch mask to pattern the mask layer, and the patterned mask layer is then used as an etch mask to remove exposed portions of ILD layer 120 and/or CESL 118, thereby forming via opening 122. The etching process can include a dry etch, a wet etch, other suitable etch, or combinations thereof. In some embodiments, the etching process is a reactive ion etch (RIE). In some embodiments, the etching process is a multistep process, such as a first etch step for removing ILD layer 120 and a second etch step for removing CESL 118. In some embodiments, the etching process removes the patterned resist layer and/or the patterned mask layer. In some embodiments, after the etching process, the patterned resist layer and/or the patterned mask layer is removed by a suitable process, such as a resist stripping process.

Figure 2B:
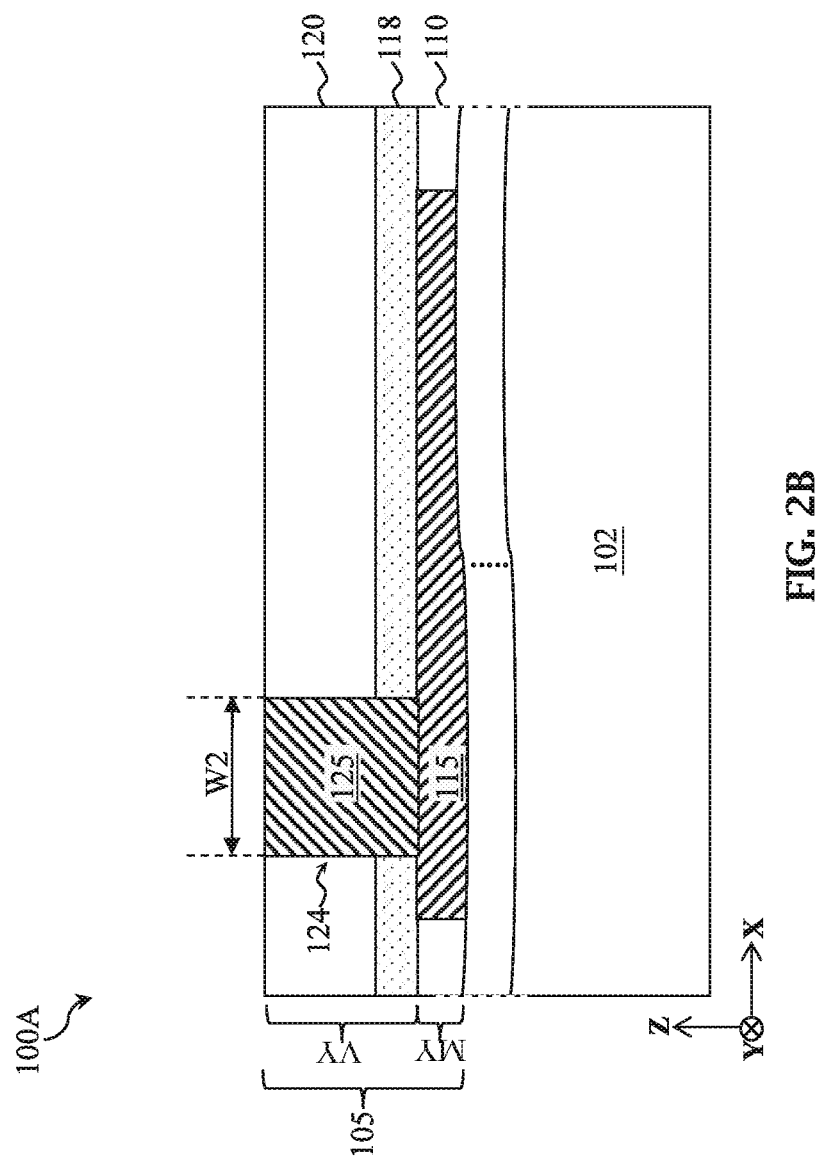

Turning to FIG. 2B, a via 124 is formed in via opening 122 by a bottom-up deposition process. Via 124 includes tungsten, ruthenium, molybdenum, cobalt, copper, aluminum, titanium, iridium, palladium, platinum, nickel, tin, gold, silver, other suitable metals, other suitable electrically conductive materials, alloys thereof, silicides thereof, or combinations thereof. Via 124 is a barrier-free via, which generally refers to a via that does not have a metal-comprising barrier layer/liner between its conductive plug and its surrounding dielectric layer and/or an underlying conductive feature. For example, via 124 includes a conductive plug 125 having a width W2 along the x-direction. In some embodiments, width W2 is about 8 nm to about 12 nm. In the depicted embodiment, width W2 is equal to width W1. Conductive plug 125 directly and/or physically contacts the dielectric layer of VY layer (e.g., ILD layer 120 and CESL 118) and an underlying conductive feature of MY layer (e.g., conductive line 115). In FIG. 2B, no metal-comprising barrier layer is between conductive plug 125 and ILD layer 120, conductive plug 125 and CESL 118, or conductive plug 125 and conductive line 115. Conductive plug 125 may thus directly contact a conductive plug of conductive line 115. In some embodiments, via 124 may be partially barrier-free, such as where a metal-comprising barrier layer is between a portion of conductive plug 125 and the dielectric layer. For example, via 124 can include a metal-comprising barrier layer between sidewalls of an upper portion of conductive plug 125 and ILD layer 120. In another example, via 124 can include a metal-comprising base (seed) layer between a bottom of conductive plug 125 and conductive line 115.

Conductive plug 125 is formed by performing a bottom-up deposition process to fill via opening 122 with a conductive material. A bottom-up deposition process generally refers to a deposition process that fills an opening from bottom to top (also referred to as a bottom-up fill of an opening). In some embodiments, the bottom-up deposition process is selective CVD or selective PVD, where parameters of the selective CVD or selective ALD are tuned to selectively grow conductive material from conductive line 115 while limiting (or preventing) growth of conductive material from ILD layer 120 and/or CESL 118. The deposition parameters that can be tuned include deposition precursors (for example, metal precursors and/or reactants), deposition precursor flow rates, deposition temperature, deposition time, deposition pressure, source power, radio frequency (RF) bias voltage, RF bias power, other suitable deposition parameters, or combinations thereof. In some embodiments, a carrier gas is used to deliver the metal precursors and/or reactants to the process chamber. The carrier gas may be an inert gas, such as an argon-containing gas, a helium-containing gas, a xenon-containing gas, other suitable inert gas, or combinations thereof. In some embodiments, multiple CVD cycles or ALD cycles are performed to form conductive plug 125. In some embodiments, the bottom-up deposition process includes multiple deposition/etch cycles, each of which can include depositing a conductive material (e.g., tungsten, ruthenium, or molybdenum) and etching back the conductive material successively. Alternatively, in some embodiments, conductive plug 125 is formed by blanket depositing a conductive material over ILD layer 120 that fills via opening 122 (not necessarily in a bottom-up fashion) and planarizing and/or etching back the conductive material. In such embodiments, the conductive material may be blanket deposited by PVD. In some embodiments, the planarizing and/or etching back removes conductive material deposited over and/or extending above top surface of ILD layer 220.

In some embodiments, conductive plug 125 is a tungsten plug, and parameters of the selective CVD or selective ALD are tuned to selectively grow tungsten. In such embodiments, the selective CVD or selective ALD includes flowing a tungsten-containing precursor (e.g., $WF_6$ and/or $WCl_5$) and a reactant precursor (e.g., $H_2$) into a process chamber. In some embodiments, conductive plug 125 is a ruthenium plug, and parameters of the selective CVD or selective ALD are tuned to selectively grow ruthenium. In such embodiments, the selective CVD includes flowing a ruthenium-containing precursor (e.g., $Ru(Cp)(CO)_2Et$, $Ru(Cp)_2$, $Ru(EtCp)_2$), CHORUS, or combinations thereof) and a reactant precursor (e.g., $H_2$, $NH_3$, $O_2$, $N_2$, or combinations thereof) into a process chamber. In some embodiments, conductive plug 125 is a molybdenum plug, and parameters of the selective CVD or selective ALD are tuned to selectively grow molybdenum. In such embodiments, the selective CVD includes flowing a molybdenum-containing precursor (e.g., $MoCl_5$, $MoCpO_2CH_3$, molybdenum carbonyl-based precursor, or combinations thereof) and a reactant precursor (e.g., $H_2$, $NH_3$, $O_2$, or combinations thereof) into a process chamber.

In some embodiments, a planarization process, such as a CMP process, is performed after the bottom-up deposition process. The CMP process removes any conductive material of via 124 that extends above top surface of ILD layer 120 and/or any conductive material that may form on top surface of ILD layer 120 during the bottom-up deposition process. ILD layer 120 can function as a CMP stop layer, and the CMP process is performed until reaching and exposing ILD layer 120. The CMP process can planarize a top surface of ILD layer 120 and a top surface of conductive plug 125. In some embodiments, top surface of ILD layer 120 and top surface of conductive plug 125 are substantially planar after the CMP process.

A process used for forming conductive plug 125 depends on a composition of an exposed surface of conductive line 115, which provides a deposition surface and/or a growth surface on/from which conductive plug 125 is deposited/grown. For example, where conductive line 115 includes a graphite plug, the exposed surface of conductive line 115 is a graphite surface. In such embodiments, bottom surface of via opening 122 is provided by the graphite surface, and a metal material (e.g., tungsten, ruthenium, molybdenum, other suitable metal, alloys thereof, or combinations thereof) is difficult to directly grow on/from the graphite surface by selective CVD. Accordingly, to facilitate bottom-up growth of conductive plug 125, a seed layer is formed over the graphite surface before performing a bottom-up deposition process. Such process is depicted and described with references to FIGS. 3A-3C, where a top surface of conductive line 115 exposed by via opening 122 is a graphite surface.

In FIG. 3A, fabrication includes blanket depositing a conductive layer 125A over ILD layer 120 by PVD. Conductive layer 125A has a thickness T1 and partially fills via opening 122. In some embodiments, thickness T1 is about 10 Å to about 30 Å. Conductive layer 125A conforms to via opening 122, such that conductive layer 125A lines sidewalls and bottom of via opening 122. Conductive line 125A is generally u-shaped, and conductive line 125A has a substantially uniform thickness. For example, conductive line 125A is disposed on portions of ILD layer 120 and CESL 118 that form sidewalls of via opening 122 and the top surface of conductive line 115 that forms a bottom of via opening 122. Conductive line 125A is further disposed on the top surface of ILD layer 120. In some embodiments, conductive layer 125A may be blanket deposited over ILD layer 120 by another deposition process.

In FIG. 3B, fabrication includes etching back conductive layer 125A to reduce a thickness of conductive layer 125A.

For example, after the etching back, conductive layer 125A has a thickness T2 that is less than thickness T1. In some embodiments, thickness T2 is about 10 Å to about 40 Å. Thickness T2 can be less than, greater than, or equal to a thickness of CESL 118. In the depicted embodiment, the etching back removes conductive layer 125A from vertically-oriented surfaces of IC device 100, such as sidewalls of ILD layer 120 and/or CESL 118 (which form sidewalls of via opening 122), but not horizontally-oriented (lateral) surfaces of IC device 100, such as top surface of ILD layer 120 and top surface of conductive line 115. The etching back is a dry etch, a wet etch, other suitable etching process, or combination thereof. In some embodiments, the etching back is an anisotropic etch. In some embodiments, the etching back removes material along the z-direction (e.g., vertically) without or minimally removing material along the x-direction and/or the y-direction (e.g., laterally).

In FIG. 3C, fabrication includes performing a bottom-up deposition process (e.g., a selective CVD such as described herein) to form a conductive material that fills a remainder of via opening 122 and performing a planarization process (e.g., CMP process) on the conductive material, thereby forming conductive layer 125B. Conductive layer 125A functions as a seed layer for the bottom-up deposition process, and parameters of the bottom-up deposition process (e.g., selective CVD or selective ALD) are tuned to selectively grow the conductive material from conductive layer 125A while limiting (or preventing) growth of the conductive material from ILD layer 120 and/or CESL 118. The CMP process removes conductive layer 125B and conductive layer 125A from over top surface of ILD layer 120 and any conductive material of via 124 that extends above top surface of ILD layer 120. ILD layer 120 can function as a CMP stop layer, and the CMP process is performed until reaching and exposing ILD layer 120. The CMP process can planarize a top surface of ILD layer 120 and a top surface of conductive layer 125B. In some embodiments, top surface of ILD layer 120 and top surface of conductive plug 125 (i.e., conductive layer 125B) are substantially planar after the CMP process.

Conductive layer 125B and conductive layer 125A (i.e., seed layer) combine to form conductive plug 125, and conductive layer 125A is between conductive layer 125B and conductive line 115. Since conductive layer 125A is removed from sidewalls of via opening 122, sidewalls of conductive plug 125 are formed by conductive layer 125B and conductive layer 125A. Conductive layer 125B physically and/or directly contacts ILD layer 120 and/or CESL 118. Conductive layer 125A physically and/or directly contacts conductive line 115, CESL 118, and/or ILD layer 120. In the depicted embodiment, conductive layer 125B and conductive layer 125A include the same material, such as tungsten, ruthenium, molybdenum, other suitable metal, alloys thereof, or combinations thereof. For example, conductive plug 125 is a ruthenium plug, and conductive layer 125A and conductive layer 125B are ruthenium layers. In another example, conductive plug 125 is a tungsten plug, and conductive layer 125A and conductive layer 125B are tungsten layers. In another example, conductive plug 125 is a molybdenum plug, and conductive layer 125A and conductive layer 125B are molybdenum layers. In FIGS. 3A-3C, because conductive plug 125 is formed by a two-step deposition process (e.g., PVD then CVD), an interface 126 may form between conductive layer 125A and conductive layer 125B. Such interface 126 may be negligible (i.e., indistinguishable). In some embodiments, conductive layer 125B and conductive layer 125A include the same material but different compositions (e.g., the same constituents but different atomic percentages of the constituents). In some embodiments, conductive layer 125B and conductive layer 125A include different materials.

Figure 2C:
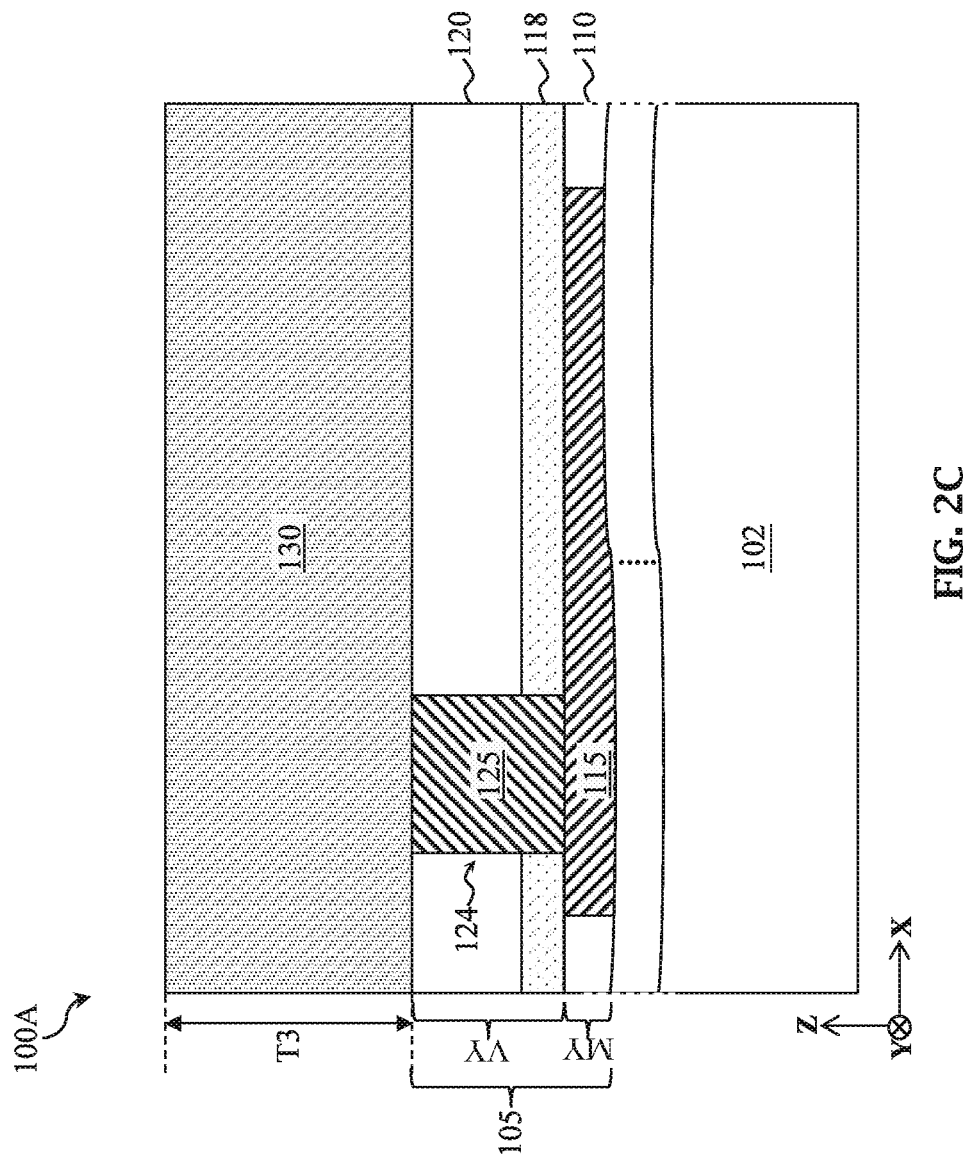

In FIG. 2C, a graphite layer 130 is formed over VY layer. Graphite layer 130 has a thickness T3 along the z-direction. In some embodiments, thickness T3 is about 100 Å to about 300 Å. Graphite layer 130 is a carbon-containing layer (generally referred to as a carbon layer) and is electrically conductive. In other words, graphite layer 130 is an electrically conductive non-metal layer. For example, graphite layer 130 includes carbon atoms arranged in a honeycomb lattice structure and/or a hexagonal lattice structure. In some embodiments, graphite layer 130 may be a single graphite (graphene) layer (i.e., an atomic layer of carbon atoms (e.g., $sp^2$ bonded carbon atoms) arranged in a honeycomb lattice structure and/or a hexagonal lattice structure). In some embodiments, graphite layer 130 includes multiple graphite/graphene layers. Graphite layer 130 may include other non-metal constituents.

Graphite layer 130 is formed directly on VY layer (and thus on a dielectric substrate (i.e., ILD layer 120)). In some embodiments, graphite layer 130 is formed on VY layer by water-assisted CVD, such as described in Wei, S. et al., Water-Assisted Rapid Growth of Monolayer Graphene Films on SiO$_2$/Si Substrates, Carbon 148, 241-248 (2019). In such embodiments, a carbon-containing precursor (e.g., $CH_4$), a carrier gas (e.g., $H_2$ and/or Ar), and water vapor are introduced into a CVD process chamber. An oxygen-containing precursor can also be introduced into the CVD process chamber to promote decomposition of the carbon-containing precursor and/or promote attachment of carbon atoms to ILD layer 120 and/or graphene layers formed thereon. The deposition parameters can be tuned to optimize graphene growth/deposition, including deposition precursors, deposition precursor flow rates, deposition temperature, deposition time, deposition pressure, source power, RF bias voltage, RF bias power, other suitable deposition parameters, or combinations thereof. In some embodiments, graphite layer 130 is formed on VY layer using solid-liquid-solid reactions, such as those described in Vishwakarma, R. et al., Transfer Free Graphene Growth on SiO$_2$ Substrate at 250° C., Scientific Reports 7, 43756 (2017). In such embodiments, forming graphite layer 130 can include forming an amorphous carbon layer (e.g., a carbon source) over VY layer, forming a catalyst layer (e.g., a tin (Sn) layer) over the amorphous carbon layer, and annealing the amorphous carbon layer and the catalyst layer. Catalysts (e.g., Sn) in the catalyst layer and carbon in the amorphous carbon layer move during the annealing, which results in graphitization (i.e., formation of graphene between the catalyst layer and VY layer (e.g., ILD layer 120) and over the catalyst layer). The catalyst layer and any remaining amorphous carbon layer are removed after the annealing. Pulsed layer deposition (PLD) techniques may be implemented to form the amorphous carbon layer and the catalyst layer. In some embodiments, graphite layer 130 is formed on VY layer by other transfer-free graphene growth/deposition methods. In some embodiments, graphite layer 130 is formed on VY layer by graphene transfer-based methods, which generally involve growing/depositing a graphite/graphene layer on a growth/deposition substrate (e.g., a metal substrate), for example, by CVD, and then transferring the graphite/graphene layer to another substrate (e.g., a dielectric substrate, such as ILD layer 120).

Figure 2D:
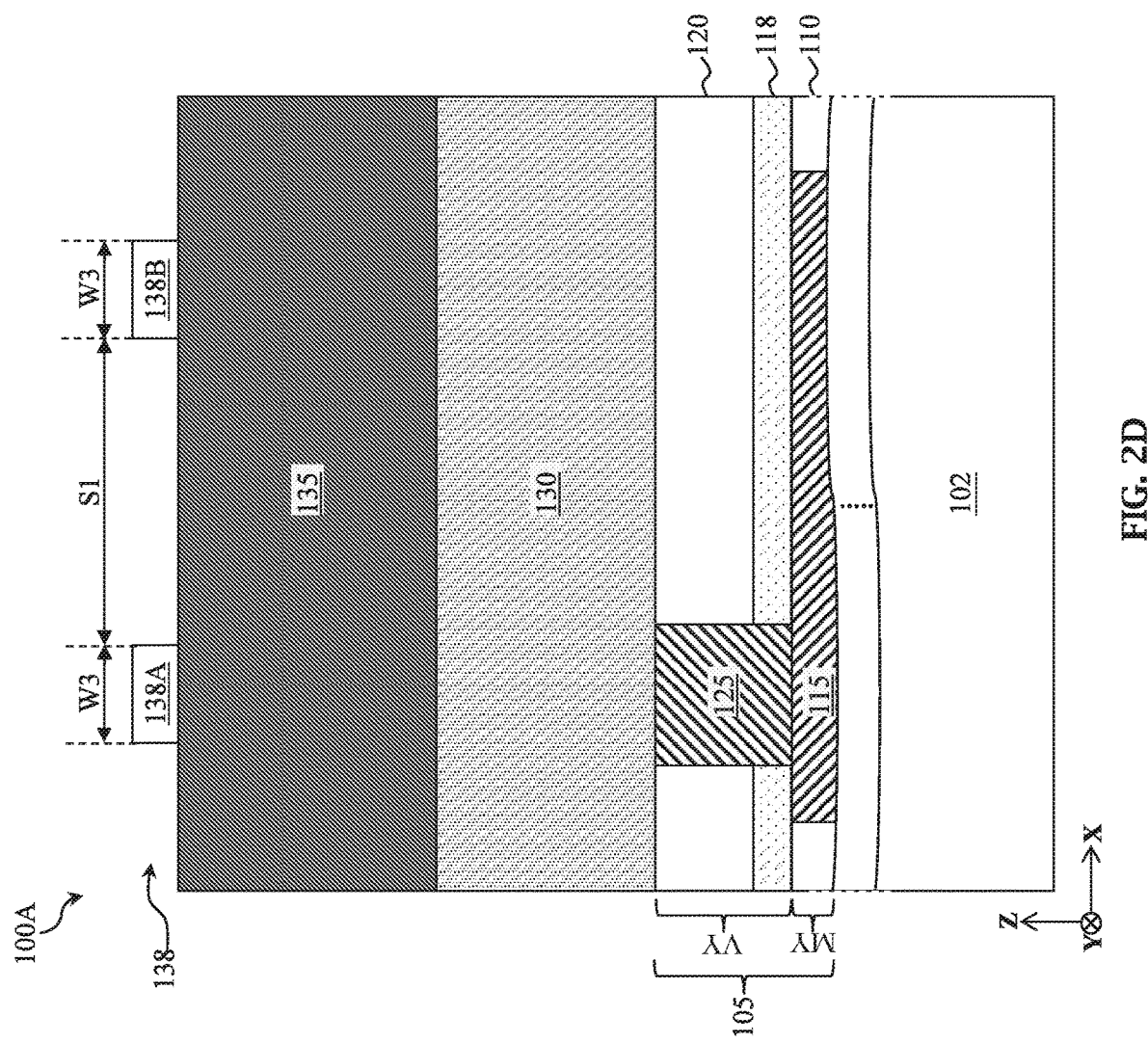

In FIG. 2D, a mask layer 135 is formed over graphite layer 130, and a patterned resist layer 138 is formed over mask layer 135. Mask layer 135 includes a material that can provide etch selectivity between mask layer 135 and graphite layer 130 during a subsequent etching process. In the depicted embodiment, mask layer 135 is a dielectric layer that includes silicon, oxygen, nitrogen, other suitable dielectric constituent, or combinations thereof. For example, mask layer 135 includes silicon and oxygen. Mask layer 135 is formed over graphite layer 130 by CVD, PVD, ALD, FCVD, HDPCVD, MOCVD, RPCVD, PECVD, LPCVD, ALCVD, APCVD, PEALD, other suitable methods, or combinations thereof. In some embodiments, mask layer 135 is a silicon oxide layer, such as an $SiO_x$ layer, formed over graphite layer 130 by PECVD. Mask layer 135 can have any number of materials, constituents, layers, or combination thereof that facilitate patterning of graphite layer 130 as described herein.

Patterned resist layer 138 is formed over mask layer 135 by a lithography process, such as those described herein. The lithography process can include forming a resist layer over mask layer 135, performing a pre-exposure baking process, performing an exposure process using a mask, performing a post-exposure baking process, and performing a developing process. During the exposure process, the resist layer is exposed to radiation energy, where the mask blocks, transmits, and/or reflects radiation to the resist layer depending on a mask pattern of the mask and/or mask type, such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process.

After development, patterned resist layer 138 has a resist pattern that corresponds with the mask. The resist pattern corresponds with and defines a conductive line pattern (also referred to as a routing pattern) to be formed in M(Y+1) layer. For example, patterned resist layer 138 includes a resist feature 138A and resist feature 138B, which correspond with and define locations and/or dimensions of conductive lines to be formed in M(Y+1) layer. Openings in patterned resist layer 138, such as an opening between resist feature 138A and resist feature 138B, may correspond with and define spacing of conductive lines to be formed in M(Y+1) layer. In FIG. 2D, resist feature 138A and resist feature 138B have a width W3, and a spacing S1 is between resist feature 138A and resist feature 138B. Spacing S1 corresponds with a width of an opening in patterned resist layer 138 along the x-direction. In some embodiments, patterned resist layer 138 defines a pitch of a conductive line pattern. In some embodiments, a pitch of the conductive line pattern generally refers to a sum of widths of its conductive lines and spacings between its directly adjacent conductive lines (for example, pitch=width W3+spacing S1) (i.e., a lateral distance between edges of directly adjacent conductive lines). In some embodiments, the pitch of conductive line pattern is defined as a lateral distance between centers of directly adjacent conductive lines. In some embodiments, widths, spacings, and/or pitches of the conductive line pattern are minimum widths, minimum spacings, and/or minimum pitches, which generally refer to smallest dimensions that can be fabricated on a wafer using a fabrication process. For example, a minimum pitch of conductive line pattern is a lateral distance between centers or edges of two minimum width conductive lines separated by a minimum spacing.

Figure 2E:
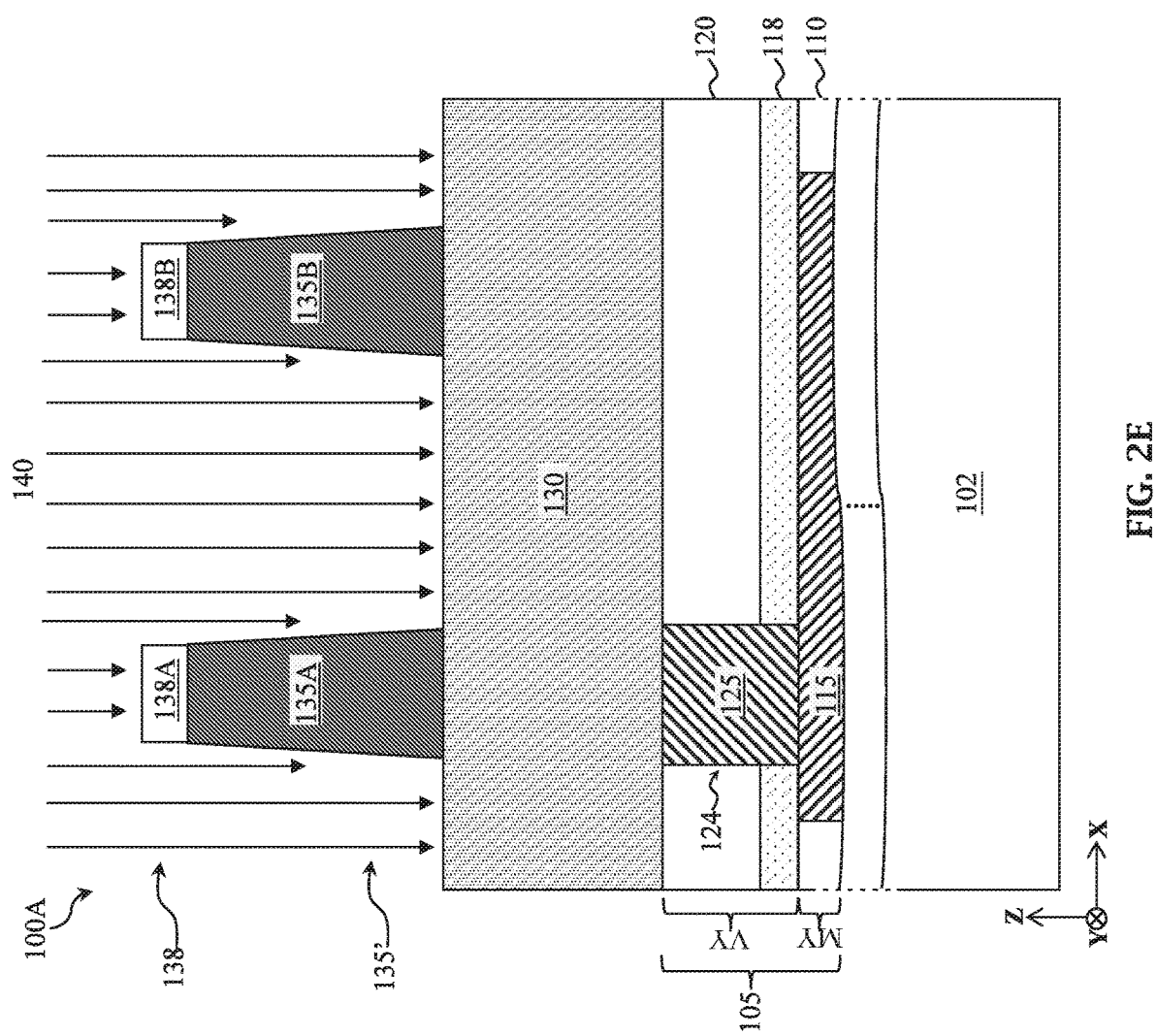

In FIG. 2E, mask layer 135 is patterned using patterned resist layer 138 as a patterning (etch) mask. For example, a mask etch 140 removes portions of mask layer 135 that are not covered by patterned resist layer 138 (i.e., exposed portions of mask layer 135). After mask etch 140, a mask feature 135A and a mask feature 135B remain under resist feature 138A and resist feature 138B, respectively. Mask feature 135A and mask feature 135B are collectively referred to as a patterned mask layer 135'. In the depicted embodiment, mask feature 135A and mask feature 135B have tapered sidewalls, such that widths of mask feature 135A and mask feature 135B along the x-direction increase from tops thereof (interfacing with patterned resist layer 138) to bottoms thereof (interfacing with graphite layer 130). For example, the widths increase along thicknesses of mask feature 135A and mask feature 135B from a width that is about width W3 at their tops to a width that is greater than width W3 at their bottoms. In such embodiments, mask feature 135A and mask feature 135B have trapezoidal profiles. In some embodiments, the widths decrease from tops to bottoms. In some embodiments, mask feature 135A and mask feature 135B have substantially vertical sidewalls, such that the widths of mask feature 135A and mask feature 135B are substantially uniform from their tops to bottoms. For example, widths of mask feature 135A and mask feature 135B are about width W3. In such embodiments, mask feature 135A and mask feature 135B have rectangular profiles.

Mask etch 140 selectively removes mask layer 135 with respect to patterned resist layer 138 and graphite layer 130. In other words, mask etch 140 removes mask layer 135 with minimal to no removal of patterned resist layer 138 and/or graphite layer 130. For example, an etchant is selected for the mask etch 140 that etches silicon oxide (i.e., mask layer 135) at a higher rate than resist (i.e., patterned resist layer 138) and graphite (i.e., graphite layer 130) (i.e., the etchant has a high etch selectivity with respect to silicon oxide). In some embodiments, an etch selectivity of the etchant for mask layer 135 over graphite layer 130 is greater than an etch selectivity of the etchant for mask layer 135 over patterned resist layer 138. In such embodiments, mask etch 140 may partially etch patterned resist layer 138, for example, reducing thicknesses of resist feature 138A and/or resist feature 138B along the z-direction. Mask etch 140 is a dry etch, a wet etch, other suitable etch, or combinations thereof. In some embodiments, mask etch 140 is a wet etch that implements a diluted hydrofluoric acid (DHF) solution, and the DHF solution removes exposed portions of mask layer 135. A concentration of constituents of the DHF solution, an etch temperature, an etch time (i.e., how long a workpiece that includes interconnect structure 100A is submersed in the etching solution), other wet etch parameter, or combinations thereof are tuned to achieve desired etch selectivity.

Figure 2F:
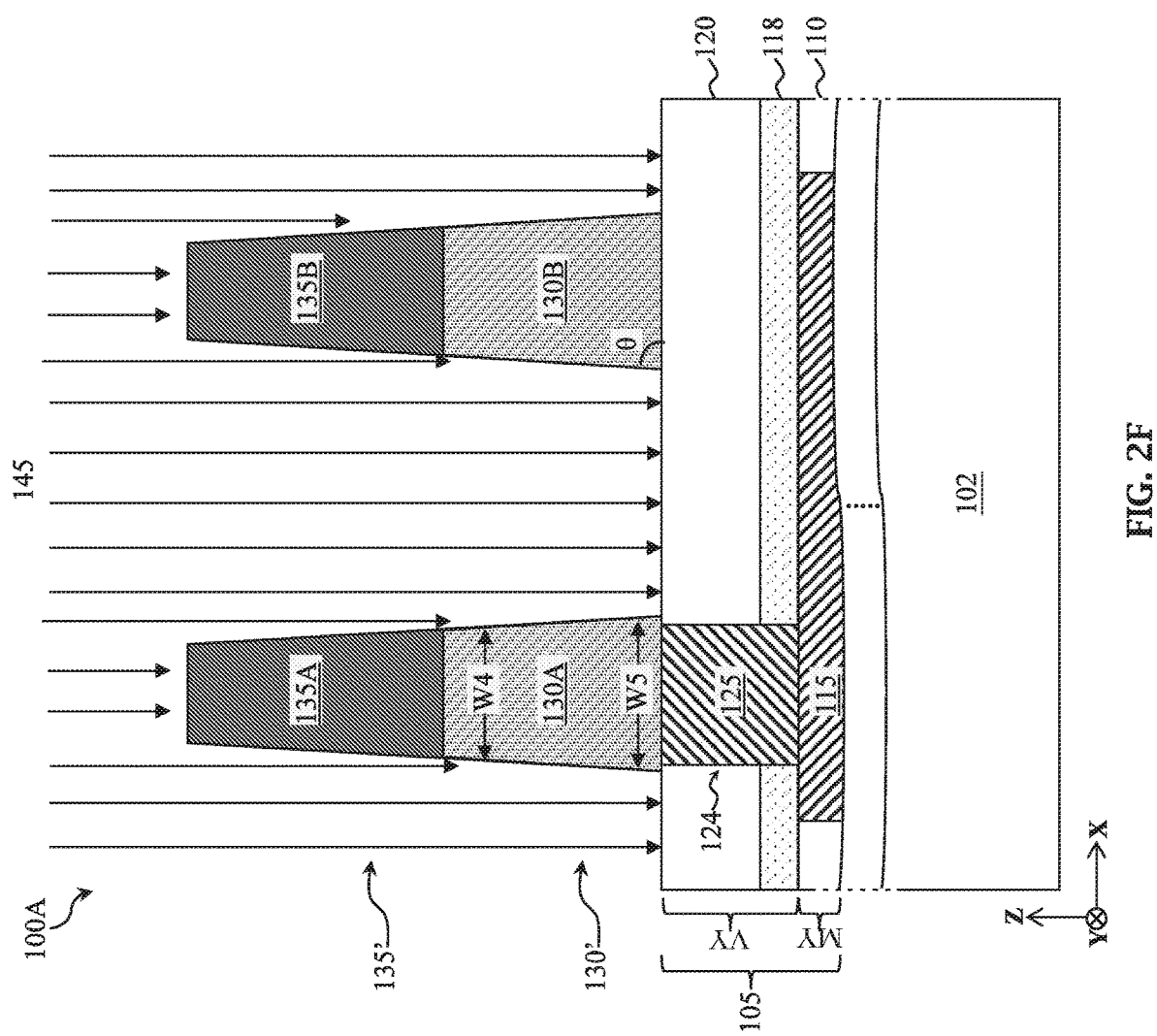

In FIG. 2F, graphite layer 130 is patterned using patterned mask layer 135' as a patterning (etch) mask. For example, a graphite etch 145 removes portions of graphite layer 130 that are not covered by patterned mask layer 135' (i.e., exposed portions of graphite layer 130). After graphite etch 145, a graphite plug 130A and a graphite plug 130B remain under mask feature 135A and mask feature 135B, respectively. Graphite plug 130A and graphite plug 130B are collectively referred to as a patterned graphite layer 130'. An angle θ is between a top surface of VY layer (i.e., top surface of ILD layer 120 or top surface of via 124) and sidewalls of graphite plugs of patterned graphite layer 130'. In some embodiments, angle θ is about 85° to about 90°. For example, in FIG. 2F, graphite plug 130A and graphite plug 130B have tapered sidewalls, and angle θ is less than 90°. In such embodiments, graphite plug 130A and graphite plug 130B have trapezoidal profiles, and widths of graphite plug 130A and graphite plug 130B along the x-direction increase from a width W4 at tops thereof (interfacing with patterned mask layer 135) to a width W5 at bottoms thereof (interfacing with VY layer). In some embodiments, widths of resist features of patterned resist layer 138, such as width W3, are designed to account for tapering of sidewalls (and thus increasing widths) that may occur during etching of mask layer 135 and/or graphite layer 130. For example, widths of resist features are configured less than desired widths of graphite plug 130A and graphite plug 130B. In some embodiments, width W4 is about 8.5 nm to about 12 nm. In some embodiments, width W5 is about 8.5 nm to about 12 nm. In some embodiments, the widths decrease from tops to bottoms. In some embodiments, graphite plug 130A and graphite plug 130B have substantially vertical sidewalls, and angle θ is about 90°. In such embodiments, the widths of graphite plug 130A and graphite plug 130B are substantially uniform from top to bottom. For example, widths of graphite plug 130A and graphite plug 130B are about width W4 from top to bottom. In such embodiments, graphite plug 130A and graphite plug 130B have rectangular profiles.

Graphite etch 145 selectively removes graphite layer 130 with respect to patterned mask layer 135' and ILD layer 120. In other words, graphite etch 145 removes graphite layer 130 with minimal to no removal of patterned mask layer 135' and/or ILD layer 120. For example, an etchant is selected for the graphite etch 145 that etches graphite (i.e., graphite layer 130) at a higher rate than dielectric materials (i.e., patterned mask layer 135' and ILD layer 120) (i.e., the etchant has a high etch selectivity with respect to graphite). In some embodiments, an etch selectivity of the etchant for graphite layer 130 over ILD layer 120 is greater than an etch selectivity of the etchant for graphite layer 130 over patterned mask layer 135'. In such embodiments, graphite etch 145 may partially etch patterned mask layer 135', for example, reducing thicknesses of mask feature 135A and/or mask feature 135B along the z-direction. Graphite etch 145 is a dry etch, a wet etch, other suitable etch, or combinations thereof.

In some embodiments, graphite etch 145 is a dry etch that uses an oxygen-containing plasma (e.g., an $O_2$ plasma etchant). For example, an oxygen-containing gas (e.g., $O_2$) is flowed into an etch chamber, a power is applied to the oxygen-containing gas (e.g., $O_2$) to generate an oxygen-containing plasma, and plasma-excited oxygen-containing species (i.e., ionized reactive oxygen-containing gas) are directed to graphite layer 130. A carrier gas, such as an argon-containing gas, may be used to deliver the oxygen-containing gas and/or other etch gas. In some embodiments, the plasma etch is a reactive ion etch (RIE). Various parameters of graphite etch 145 can be tuned to achieve selective etching of graphite layer 130, such as etch gas composition, carrier gas composition, etch gas flow rate, carrier gas flow rate, etch time, etch pressure, etch temperature, source power, radiofrequency (RF) bias voltage, direct current (DC) bias voltage, RF bias power, DC bias power, other suitable etch parameters, or combinations thereof. Graphite etch 145 may implement other etch gases and/or carrier gasses.

Figure 2G:
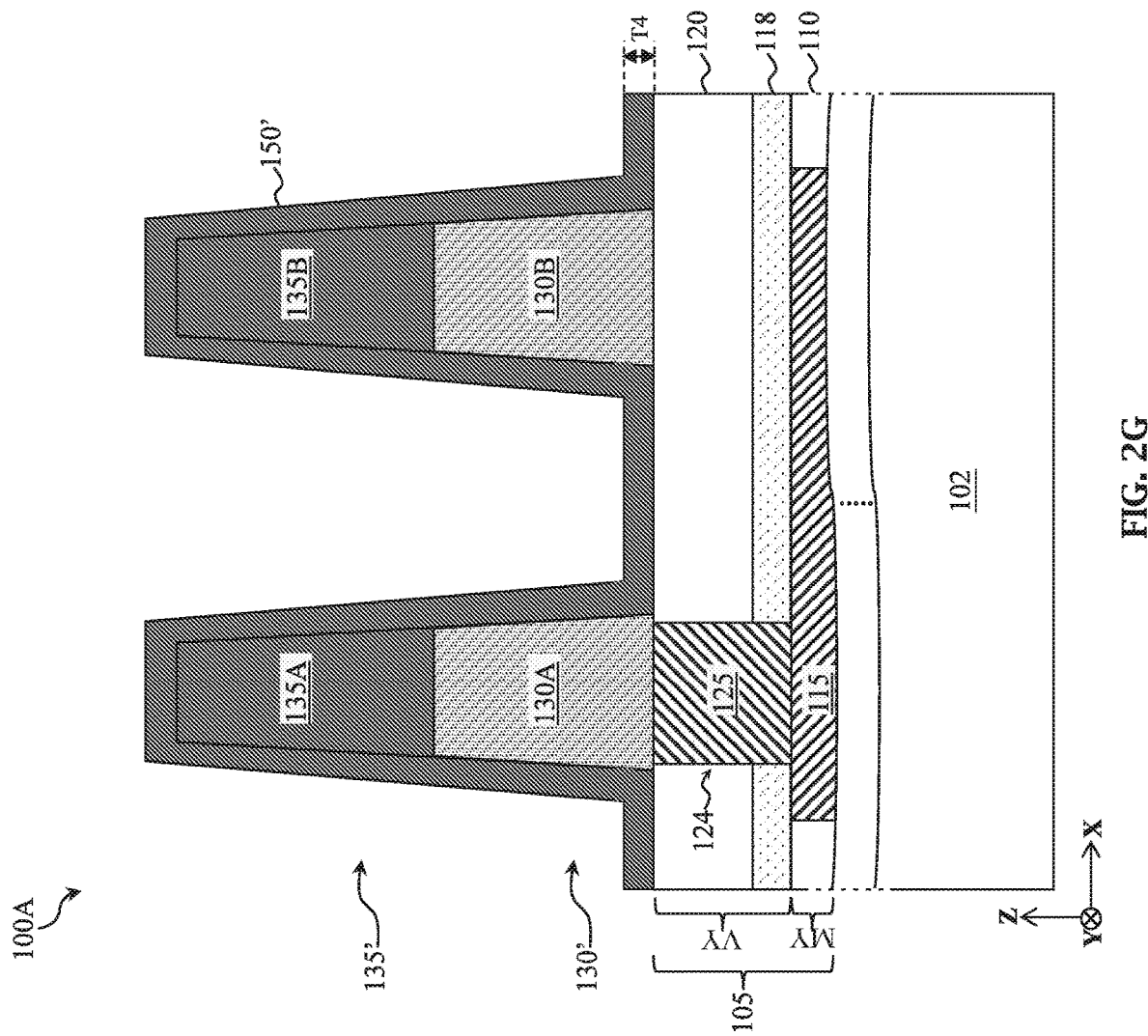

In FIG. 2G, a spacer layer 150' is formed over patterned mask layer 135', patterned graphite layer 130', and ILD layer 120. For example, spacer layer 150' is disposed along sidewalls of mask feature 135A and mask feature 135B, tops of mask feature 135A and mask feature 135B, sidewalls of graphite plug 130A and graphite plug 130B, and top surface of ILD layer 120. Spacer layer 150' has a thickness T4 that is substantially uniform along tops of mask feature 135A and mask feature 135B, sidewalls of mask feature 135A and mask feature 135B, sidewalls of graphite plug 130A and graphite plug 130B, and top surface of ILD layer 120. In some embodiments, thickness T4 is about 1 nm to about 2.5 nm.

Spacer layer 150' includes an electrically insulating material. For example, spacer layer 150' is a dielectric layer that includes silicon, oxygen, nitrogen, carbon, other suitable dielectric constituent, or combinations thereof. A dielectric material of spacer layer 150' is different than dielectric material of ILD layers of interconnect structure 100A, such as ILD layer 120. For example, spacer layer 150' and ILD layers of interconnect structure 100A (e.g., ILD layer 120 and a subsequently-formed ILD layer) can include dielectric materials that include silicon and oxygen but have different dielectric constants. In some embodiments, spacer layer 150' is a silicon-and-oxygen-containing layer having a first dielectric constant (e.g., an $SiO_x$ layer, such as $SiO_2$ layer, having a dielectric constant of about 3.7 to about 3.9), while ILD layers, such as ILD layer 120, are silicon-and-oxygen-containing layers having a second dielectric constant that is less than the first dielectric constant (e.g., a dielectric constant less than 3.7). In the depicted embodiment, spacer layer 150' and patterned mask layer 135' include the same material (e.g., they are both $SiO_x$ layers). In some embodiments, spacer layer 150' and patterned mask layer 135' include different materials. In some embodiments, spacer layer 150' includes metal and oxygen. For example, spacer layer 150' is a metal oxide layer. Spacer layer 150' can have any number of materials, constituents, layers, or combination thereof that can facilitate insulation and reduced resistance associated graphite plug(s) and/or can protect graphite plug(s) from damage during deposition of ILD layers (e.g., by PECVD). Spacer layer 150' is formed by CVD, PVD, ALD, FCVD, HDPCVD, MOCVD, RPCVD, PECVD, LPCVD, ALCVD, APCVD, PEALD, other methods, or combinations thereof.

Figure 2H:
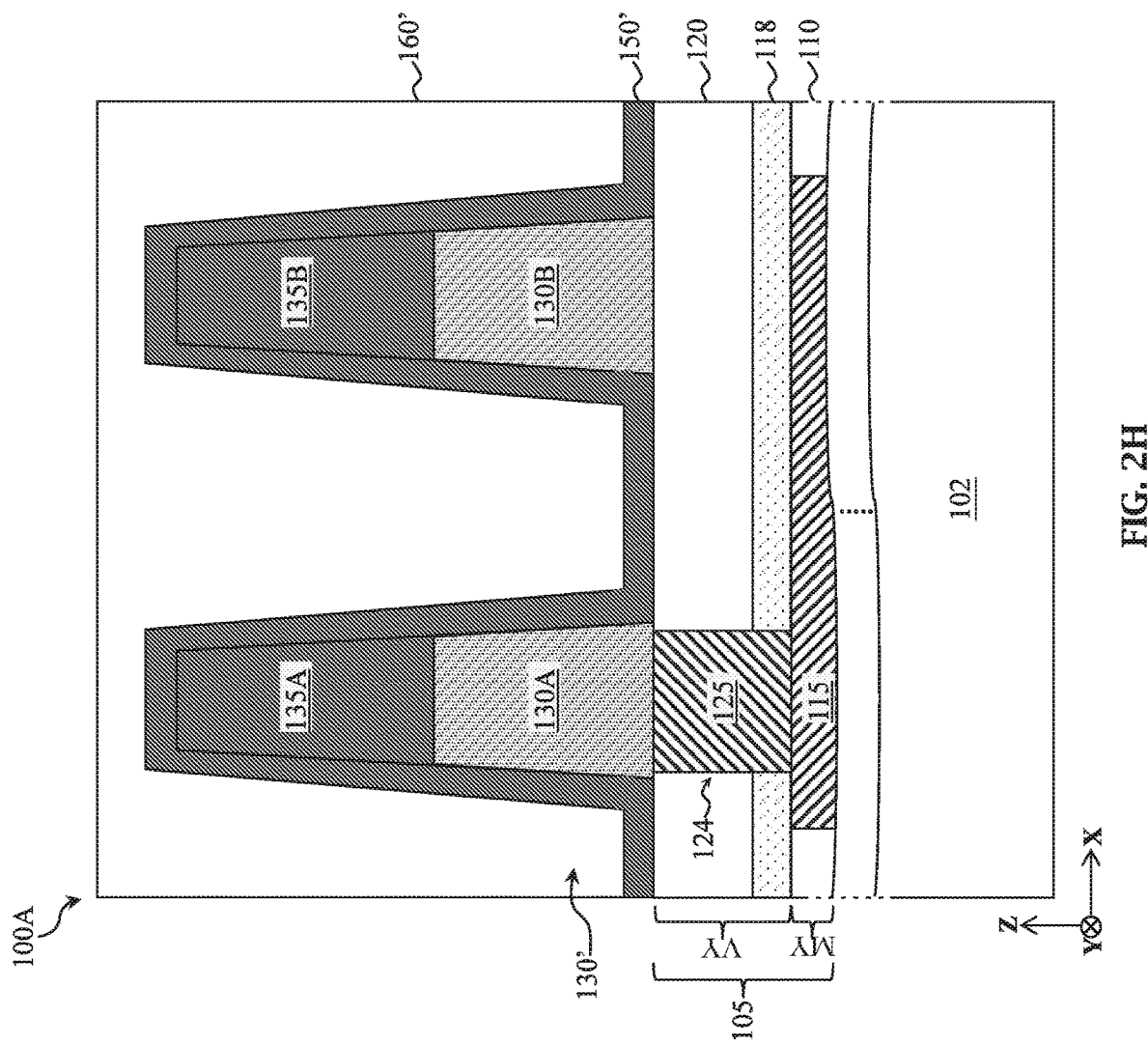

In FIG. 2H, a dielectric material 160' is formed over spacer layer 150'. Dielectric material 160' and spacer layer 150' fill spaces between graphite plugs of patterned graphite layer 130', such as a spacing between graphite plug 130A and graphite plug 130B. A thickness of dielectric material 160' along the z-direction is greater than a sum of a thickness of spacer layer 150', a thickness (height) of graphite plug 130A/graphite plug 130B, and a thickness (height) of mask feature 135A/mask feature 135B. Dielectric material 160' may be one of those described above with reference to ILD layer 110 and/or ILD layer 120. In the depicted embodiment, dielectric material 160' is a low-k dielectric material. For example, dielectric material 160' includes silicon, oxygen, carbon, nitrogen, other dielectric constituent, or combinations thereof and is tuned/configured to exhibit a dielectric constant less than about 3.9. In some embodiments, dielectric material 160' is an ELK dielectric material, such as porous silicon oxide, silicon carbide, carbon-doped oxide (e.g., an SiCOH-based material having, for example, Si—$CH_3$ bonds), or other material configured to have a dielectric constant less than about 2.5. In some embodiments, dielectric material 160' is formed by HDPCVD. In some embodiments, dielectric material 160' is formed by FCVD. In some embodiments, dielectric material 160' is formed by a high aspect ratio deposition process (HARP). In some embodiments, dielectric material 160' is formed by CVD, PVD, ALD, MOCVD, RPCVD, PECVD, LPCVD, ALCVD, APCVD, PEALD, other suitable methods, or combinations thereof.

Figure 2I:
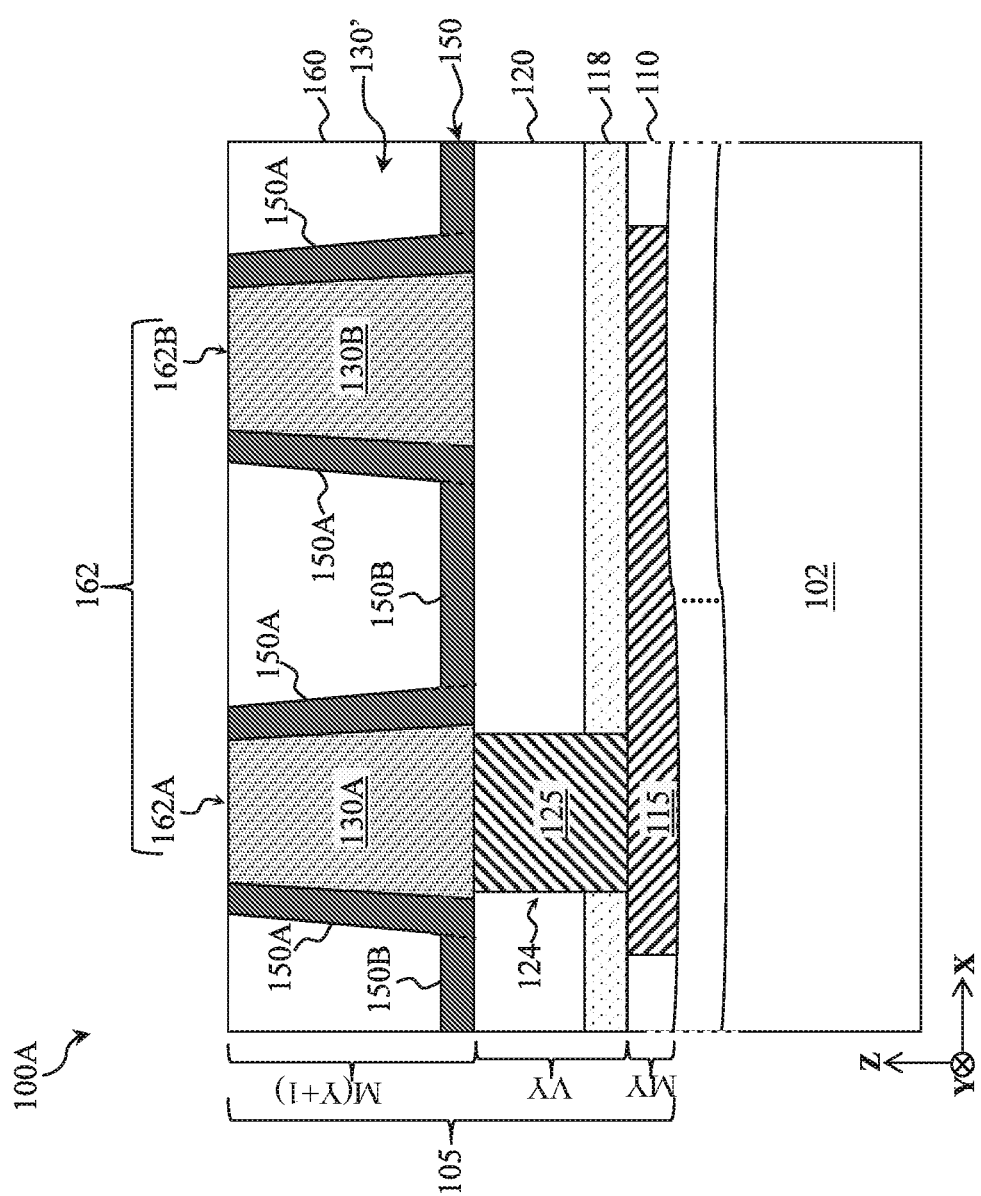

In FIG. 2I, a CMP process and/or other planarization process is performed on dielectric material 160'. The CMP process is performed until reaching and exposing graphite plug 130A and/or graphite plug 130B. The CMP process thus removes portions of dielectric material 160', portions of spacer layer 150', and patterned mask layer 135' (e.g., mask feature 135A and mask feature 135B) from over a top surface of patterned graphite layer 130'. A remainder of spacer layer 150' forms spacers 150, and a remainder of dielectric material 160' forms an ILD layer 160 having patterned graphite layer 130' and spacers 150 embedded therein. Spacers 150 have portions 150A and portions 150B. Portions 150A are along sidewalls of graphite plug 130A and sidewalls of graphite plug 130B. Portions 150B are along top surface of ILD layer 120. In some embodiments, portions 150B connect portions 150A along sidewalls of directly adjacent graphite plugs. For example, one of portions 150B connects a respective portion 150A along a right sidewall of graphite plug 130A and a respective portion 150A along a left sidewall of graphite plug 130B. In such example, spacers 150 have a u-shaped profile and wrap a portion of ILD layer 160. Patterned graphite layer 130' can function as a CMP stop layer. The CMP process can planarize a top surface of ILD layer 160, top surfaces of conductive lines therein (e.g., graphite plug 130A and graphite plug 130B), and top surfaces of spacers 150 (e.g., top surfaces of spacers 150A). In some embodiments, top surface of ILD layer 160, top surface of graphite plug 130A, top surface of graphite plug 130B, and top surfaces of spacers 150 are substantially planar after the CMP process. In some embodiments, an annealing process is performed after the CMP to further cure and/or densify ILD layer 160.

In some embodiments, instead of removing patterned mask layer 135' with the planarization process, patterned mask layer 135' is removed after graphite etch 145 and before forming spacer layer 150'. In such embodiments, patterned mask layer 135' is removed by a dry etch, a wet etch, other suitable etch, or combinations thereof. For example, patterned mask layer 135' (or remainder thereof, such as in embodiments where graphite etch 145 partially removes patterned mask layer 135') are removed by a wet etch that implements a DHF solution.

In FIGS. 2C-2I, a (Y+1) routing layer (denoted as M(Y+1) layer) of MLI 105 is formed over VY layer. M(Y+1) layer includes a patterned conductive layer (i.e., conductive lines 162, such as a conductive line 162A and a conductive line 162B, arranged in a desired pattern) disposed in a dielectric layer (e.g., ILD layer 160). VY layer electrically and/or physically connects M(Y+1) layer to MY layer (i.e., conductive lines 162 are connected to conductive line(s) 115 by via(s) 124). Conductive lines 162 are barrier-free. For example, conductive line 162A includes graphite plug 130A having a bottom that directly and/or physically contacts a dielectric layer and an underlying conductive feature of VY layer (e.g., ILD layer 120 and conductive plug 125, respectively) and sidewalls that directly and/or physically contact spacers 150. No metal-comprising barrier layer/liner is between graphite plug 130A and conductive plug 125, graphite plug 130A and ILD layer 120, or graphite plug 130A and spacers 150, in some embodiments. Similarly, conductive line 162B includes graphite plug 130B having a bottom that directly and/or physically contacts a dielectric layer and an underlying conductive feature of VY layer (e.g., ILD layer 120 and conductive plug of VY layer not shown in the cross-sectional view of FIG. 2I) and sidewalls that directly and/or physically contact spacers 150. No metal-comprising barrier layer is between graphite plug 130B and ILD layer 120, graphite plug 130B and underlying conductive plug, or graphite plug 130B and spacers 150.

In FIG. 2I, conductive line 162A (i.e., graphite plug 130A) and via 124 (i.e., conductive plug 125) form an M(Y+1)/VY interconnect structure that is barrier-free. In some embodiments, eliminating barriers/liners between graphite plug 130A and its surrounding dielectric layers (e.g., spacers 150 and/or ILD layer 160) and barriers/liners between conductive plug 125 and its surrounding dielectric layers (e.g., ILD layer 120 and/or CESL 118) increases a volume of the conductive plugs of M(Y+1)/VY interconnect structure, thereby increasing conductivity thereof compared to interconnect structures having barriers/liners. In some embodiments, eliminating the barrier/liners from M(Y+1)/VY interconnect structure also eliminates metal-liner interfaces that cause scattering associated with increases in an interconnect structure's resistivity, such as electron surface scattering and/or grain boundary scattering. For example, because graphite can be directly formed on VY layer without an adhesion layer and/or a diffusion layer, conductive line 162A does not need a barrier/liner, such as a metal nitride barrier/liner (e.g., TiN and/or TaN). M(Y+1)/VY interconnect structure thus does not include any metal-liner interfaces, and in particular, does not include any metal-metal nitride interfaces, which have been observed to cause electron scattering that undesirably increase an interconnect structure's resistivity. Instead, M(Y+1)/VY interconnect structure includes an interface between metal and an electrically conductive non-metal (i.e., graphite plug 130A/conductive plug 125 interface) and various metal-insulator interfaces, such as between graphite plug 130A and spacers 150, graphite plug 130 and ILD layer 120, conductive plug 125 and ILD layer 120, and conductive plug 125 and CESL 118. Metal-electrically conductive non-metal interfaces and metal-insulator interfaces have not been observed to cause the types of scattering associated with increased resistivity. Accordingly, resistance and RC delay associated with interconnect structure 100A is less than resistance and/or RC delay associated with conventional interconnect structures having barriers/liners, and devices having interconnect structure 100A may exhibit improved performance (e.g., faster propagation of electrical signals). Different embodiments may have different advantages, and no particular advantage is required of any embodiment.

Conductive features of a routing layer, such as conductive lines of M(Y+1) layer, and conductive features of an underlying via layer, such as vias of VY layer, are often fabricated by a dual damascene process, which involves depositing conductive material of the conductive lines of the routing layer and the vias of the underlying via layer at the same time. In such cases, the conventional conductive lines and the vias share a conductive plug and/or a barrier layer (and thus include the same materials), instead of having respective and distinct conductive plugs and/or barrier layers. In contrast, in the depicted embodiment, conductive lines of M(Y+1) layer and vias of VY layer are fabricated by single damascene processes to provide barrier-free interconnect structures that can reduce contact resistance (i.e., interconnect structures having barrier-free vias and barrier-free graphite lines). In other words, vias 124 are formed separately from conductive lines 162. For example, vias 124 and conductive lines 162 are not fabricated by a shared deposition process, a shared lithography process, or a shared etching process. Instead, as described herein, vias 124 are formed by a bottom-up barrier-free metal via first process, and then conductive lines 162 are formed by a graphite deposition and etch process.

FIGS. 4A-4I are fragmentary diagrammatic cross-sectional views of an interconnect structure 100B, in portion or entirety, at various stages of fabrication thereof according to another embodiment of the present disclosure. Interconnect structure 100B is similar in many respects to interconnect structure 100A and is fabricated in a similar manner as interconnect structure 100A, such as in the manner described with reference to FIGS. 2A-2J. Accordingly, similar features in FIGS. 4A-4I and FIGS. 2A-2J are identified by the same reference numerals for clarity and simplicity. FIGS. 4A-4I have been simplified for the sake of clarity to better understand the inventive concepts of the present disclosure. Additional features can be added in interconnect structure 100B, and some of the features described below can be replaced, modified, or eliminated in other embodiments of interconnect structure 100B.

Figure 4A:
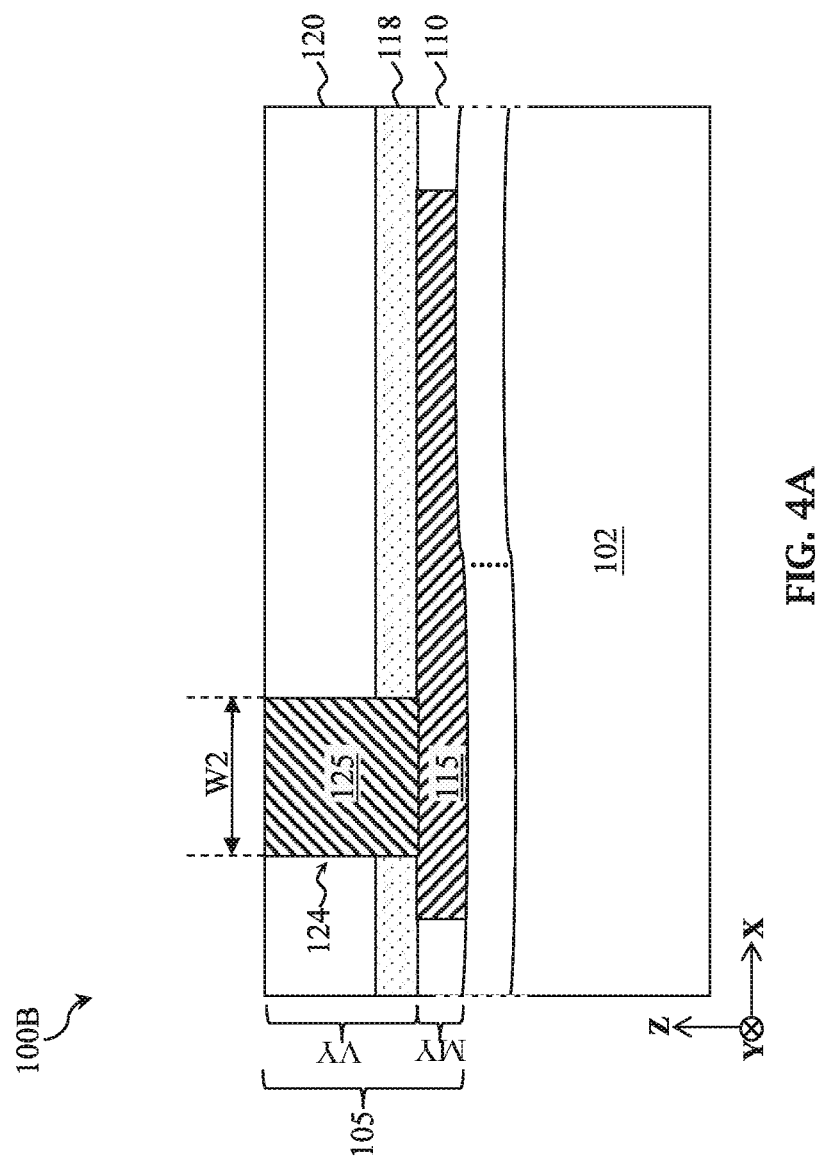
FIGS. 4A-4I are diagrammatic cross-sectional views of an interconnect structure, in portion or entirety, during fabrication according to various aspects of the present disclosure.
Figure 4B:
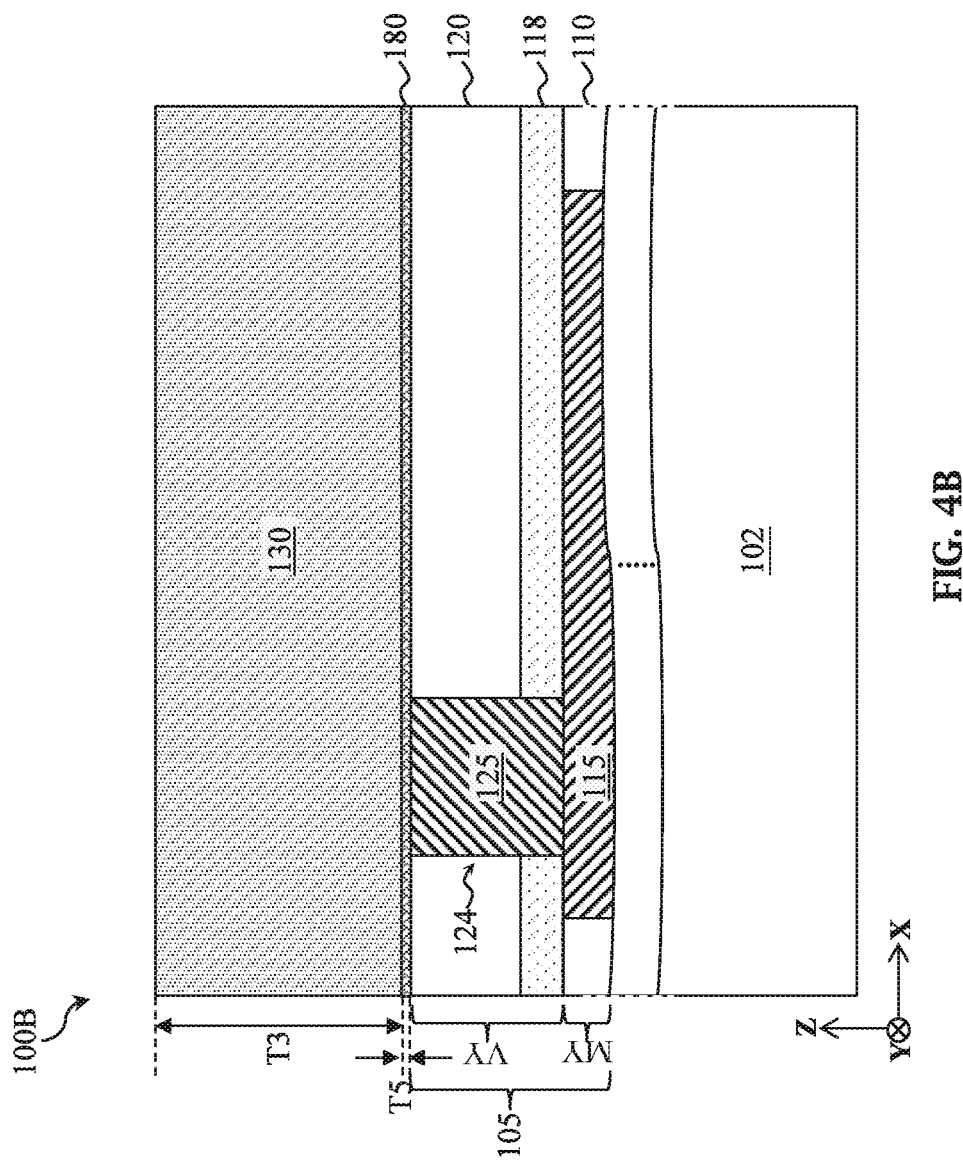
Figure 4C:
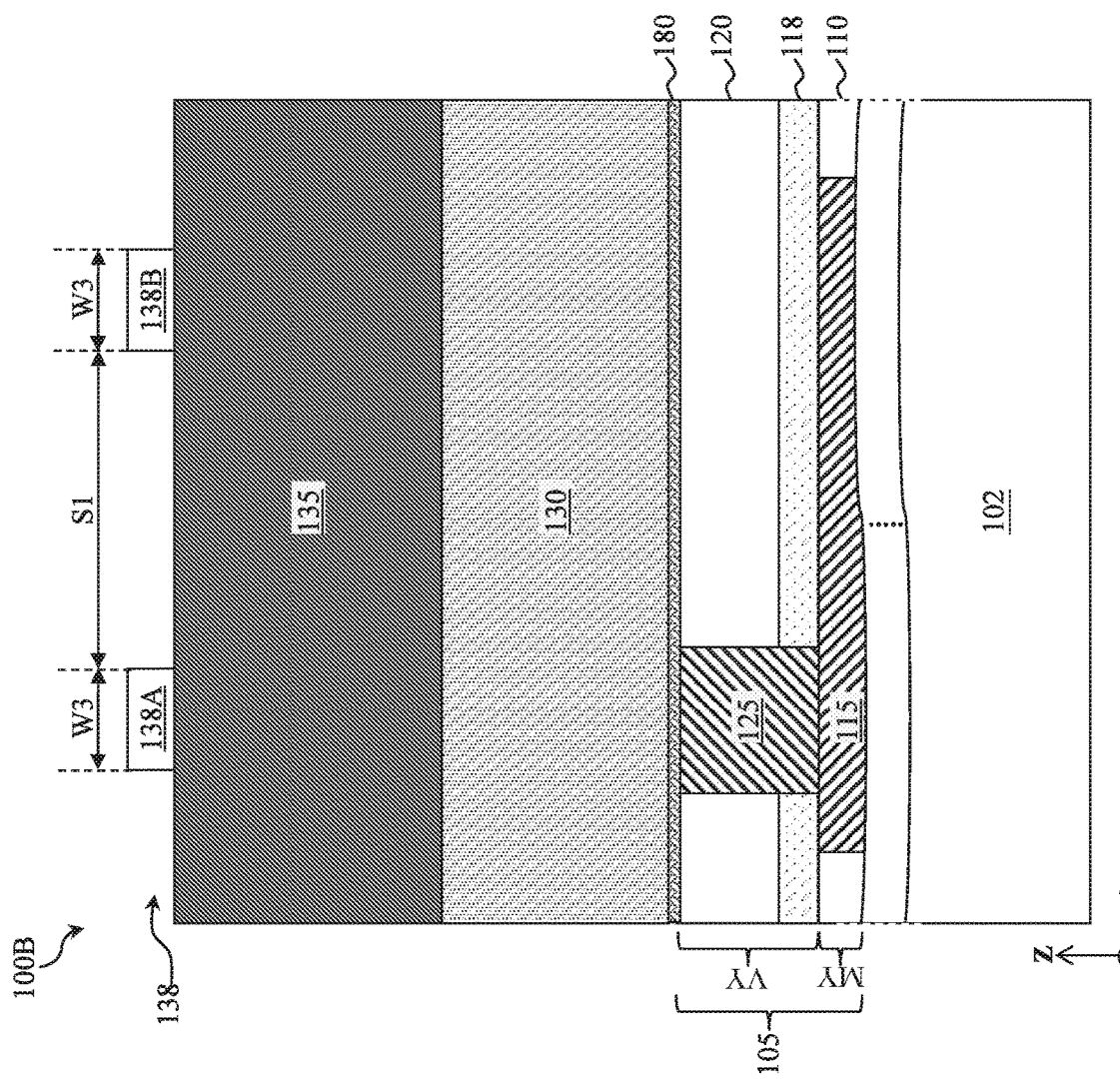
Figure 4D:
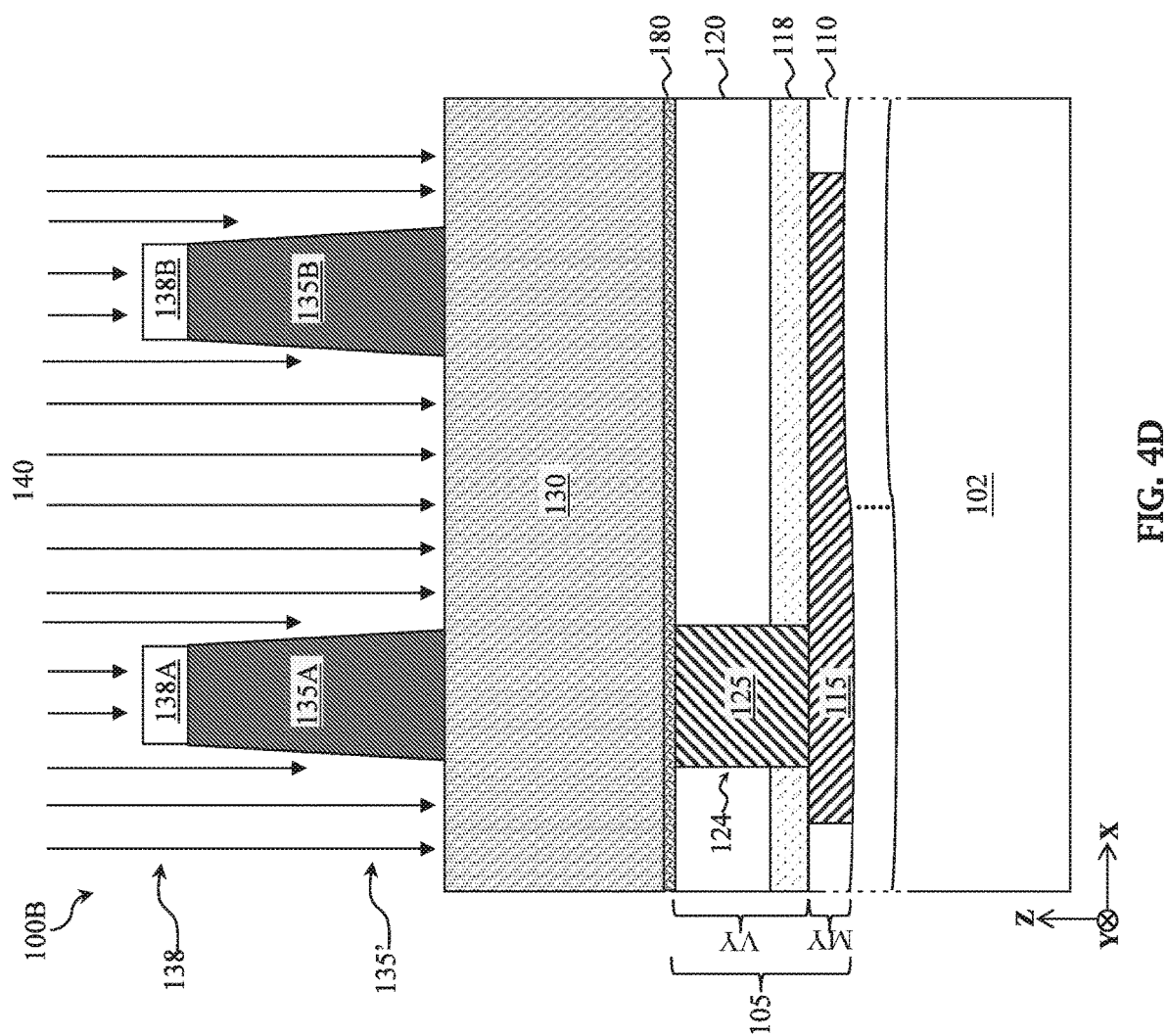

Turning to FIG. 4A, an interconnect structure 100B has undergone processing described with reference to FIG. 2A and FIG. 2B, and interconnect structure 100B includes MY layer and VY layer of MLI 105. Turning to FIG. 4B, a ruthenium layer 180 is formed over VY layer before forming graphite layer 130. Ruthenium layer 180 may provide a better growth surface for graphite layer 130 than ILD layer 120. For example, graphite growth/deposition on ILD layer 120 is limited by an ability of precursors implemented for graphite growth/deposition (for example, PECVD precursors) to adsorb on top surface of ILD layer 120, such as an $SiO_x$ surface. In some embodiments, ruthenium layer 180 has a hexagonal close-packed (HCP) crystal lattice structure, which can improve precursor adsorption during graphite growth/deposition and/or improve growth/deposition of graphite having a hexagonal lattice structure and/or a honeycomb lattice structure. Ruthenium layer 180 has a thickness T5 along the z-direction. In some embodiments, thickness T5 is about 1 nm to about 3 nm. Ruthenium layer 180 includes ruthenium or ruthenium alloy (for example, including titanium, tantalum, tungsten, cobalt, copper, aluminum, iridium, palladium, platinum, nickel, low resistivity metal constituent, other suitable ruthenium alloying constituent, alloys thereof, or combinations thereof). Ruthenium layer 180 is formed by CVD, PVD, ALD, HDPCVD, MOCVD, RPCVD, PECVD, LPCVD, ALCVD, APCVD, PEALD, plating, other suitable method, or combinations thereof. In some embodiments, ruthenium layer 180 is deposited over VY layer by CVD.

Figure 4E:
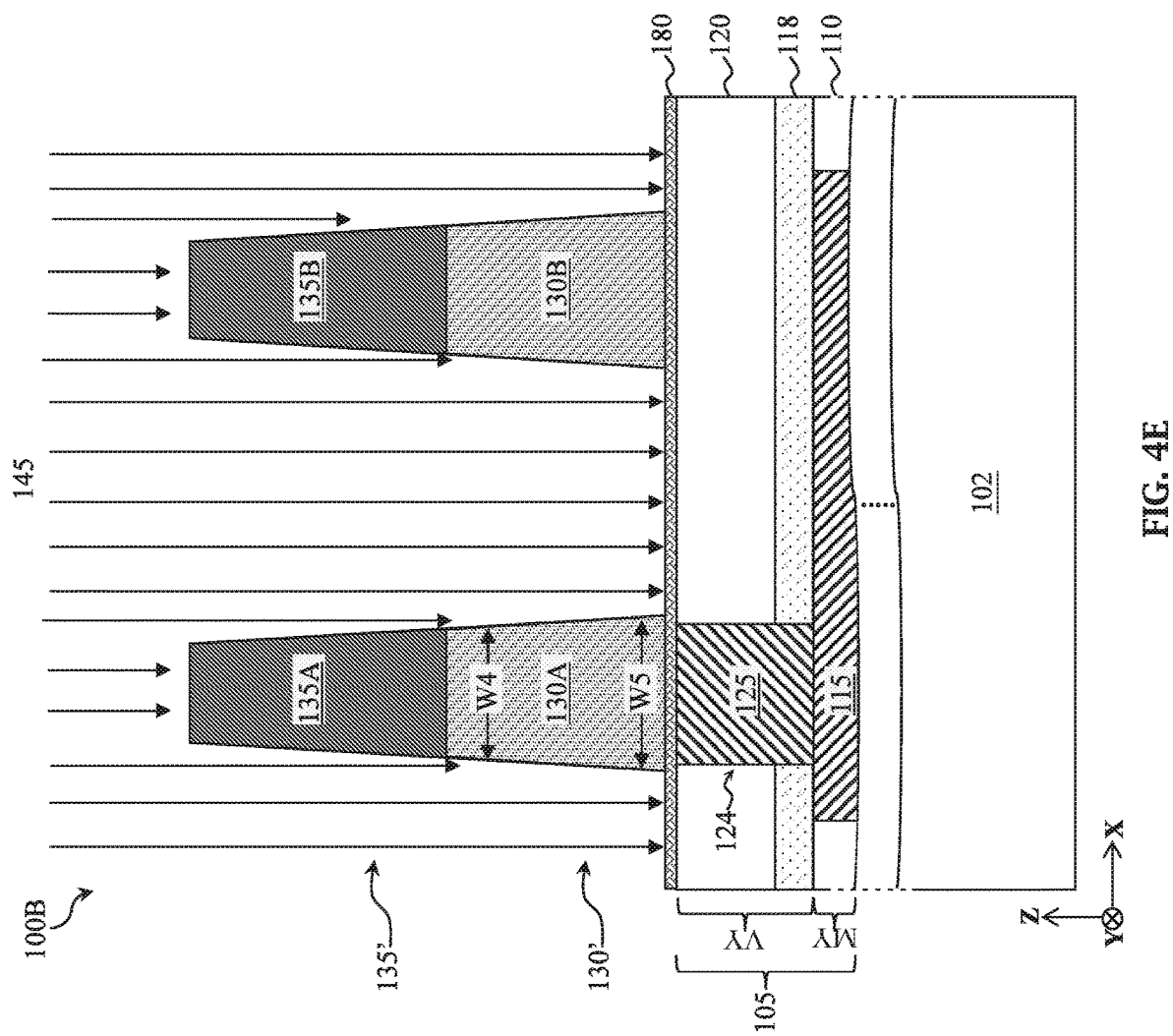

In FIGS. 4B-4E, fabrication of interconnect structure 100B proceeds similar to fabrication of interconnect structure 100A in FIGS. 2C-2F. For example, graphite layer 130 is formed over ruthenium layer 180 (FIG. 4B), mask layer 135 is formed over graphite layer 130 (FIG. 4C), patterned mask layer 138 is formed over mask layer 135 (FIG. 4C), mask etch 140 is performed on mask layer 135 to provide patterned mask layer 135' (FIG. 4D), and graphite etch 145 is performed on graphite layer 130 to provide patterned graphite layer 130' (and thus graphite plug 130A and graphite plug 130B) (FIG. 4E). In FIG. 4E, graphite etch 145 selectively removes graphite layer 130 with respect to patterned mask layer 135, ILD layer 120, and ruthenium layer 180. In other words, graphite etch 145 removes graphite layer 130 with minimal to no removal of patterned mask layer 135', ILD layer 120, and/or ruthenium layer 180. For example, an etchant is selected for the graphite etch 145 that etches graphite (i.e., graphite layer 130) at a higher rate than dielectric materials (i.e., patterned mask layer 135' and ILD layer 120) and ruthenium (i.e., ruthenium layer 180) (i.e., the etchant has a high etch selectivity with respect to graphite). Graphite etch 145 is a dry etch, a wet etch, other suitable etch, or combinations thereof. In some embodiments, graphite etch 145 is an RIE, such as an $O_2$ plasma etch.

Figure 4F:
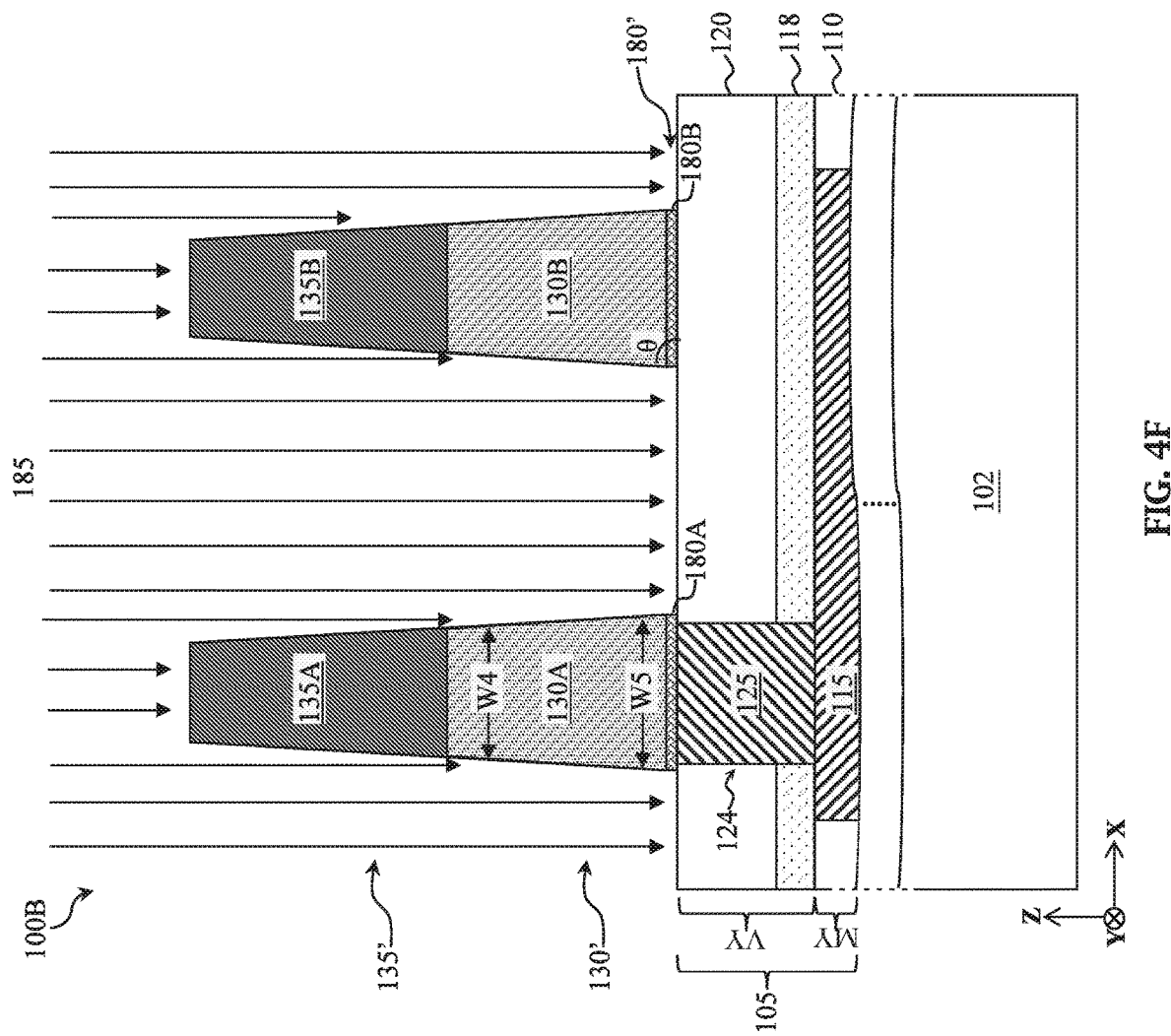

Turning to FIG. 4F, ruthenium layer 180 is patterned using patterned mask layer 135' and/or patterned graphite layer 130' as a patterning (etch) mask. For example, a ruthenium etch 185 removes portions of ruthenium layer 180 that are not covered by patterned mask layer 135' and/or patterned graphite layer 130' (i.e., exposed portions of ruthenium layer 180). After ruthenium etch 185, a ruthenium layer 180A remains between graphite plug 130A and conductive plug 125 and a ruthenium layer 180B remains between graphite plug 130B and a conductive plug of a via in VY layer (not shown). Ruthenium layer 180A and ruthenium layer 180B are also between ILD layer 120 and graphite plug 130A and graphite plug 130B, respectively. Ruthenium layer 180A and ruthenium layer 180B are collectively referred to as a patterned ruthenium layer 180'. In the depicted embodiment, ruthenium layer 180A and ruthenium layer 180B have tapered sidewalls. In some embodiments, ruthenium layer 180A and ruthenium layer 180B have substantially vertical sidewalls or other suitable sidewall profile.

Ruthenium etch 185 selectively removes ruthenium layer 180 with respect to patterned mask layer 135', patterned graphite layer 130', ILD layer 120, conductive plug 125 of via 124, or combinations thereof. In other words, ruthenium etch 185 removes ruthenium layer 180 with minimal to no removal of patterned mask layer 135', patterned graphite layer 130', ILD layer 120, conductive plug 125, or combinations thereof. For example, an etchant is selected for ruthenium etch 185 that etches ruthenium (i.e., ruthenium layer 180) at a higher rate than dielectric materials (i.e., patterned mask layer 135' and/or ILD layer 120) and other metal materials (i.e., conductive plug 125) (i.e., the etchant has a high etch selectivity with respect to ruthenium). In the depicted embodiment, where ruthenium layer 180 is implemented between graphite layer 130 and VY layer, conductive plug 125 includes a metal different than ruthenium to ensure etch selectivity between ruthenium layer 180 and conductive plug 125. For example, conductive plug 125 is a tungsten plug or a molybdenum plug in interconnect structure 100B to prevent etching and/or other damage to conductive plug 125 during ruthenium etch 185. In some embodiments, an etch selectivity of the etchant for ruthenium layer 180 over ILD layer 120 and/or conductive plug 125 is greater than an etch selectivity of the etchant for ruthenium layer 180 over patterned mask layer 135'. In such embodiments, ruthenium etch 185 may partially etch patterned mask layer 135', for example, reducing thicknesses of mask feature 135A and/or mask feature 135B along the z-direction. Ruthenium etch 185 is a dry etch, a wet etch, other suitable etch, or combinations thereof. In some embodiments, ruthenium etch 185 is a dry etch that uses an etch precursor (e.g., $Cl_2$, $O_2$, $CF_4/CH_3OH$ and Ar, other etch precursors, or combinations thereof) and a carrier precursor (e.g., $H_2$, $N_2$, $NH_3$, other carrier precursor, or combinations thereof). In some embodiments, ruthenium etch 185 is a RIE. Various parameters of ruthenium etch 185 can be tuned to achieve selective etching of ruthenium layer 190, such as etch gas composition, carrier gas composition, etch gas flow rate, carrier gas flow rate, etch time, etch pressure, etch temperature, source power, RF bias voltage, DC bias voltage, RF bias power, DC bias power, other suitable etch parameters, or combinations thereof. Ruthenium etch 185 may implement other etch gases and/or carrier gasses.

Figure 4G:
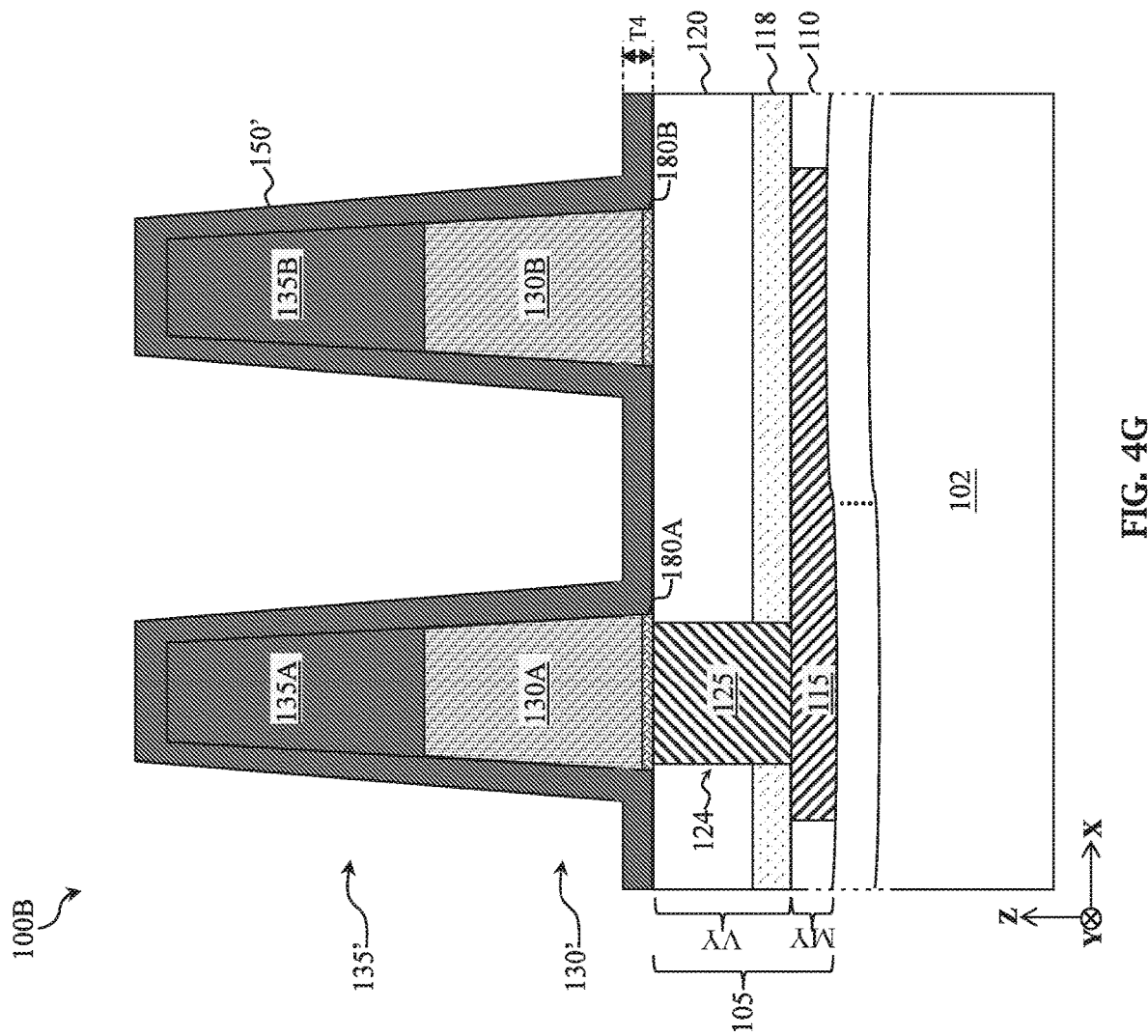
Figure 4H:
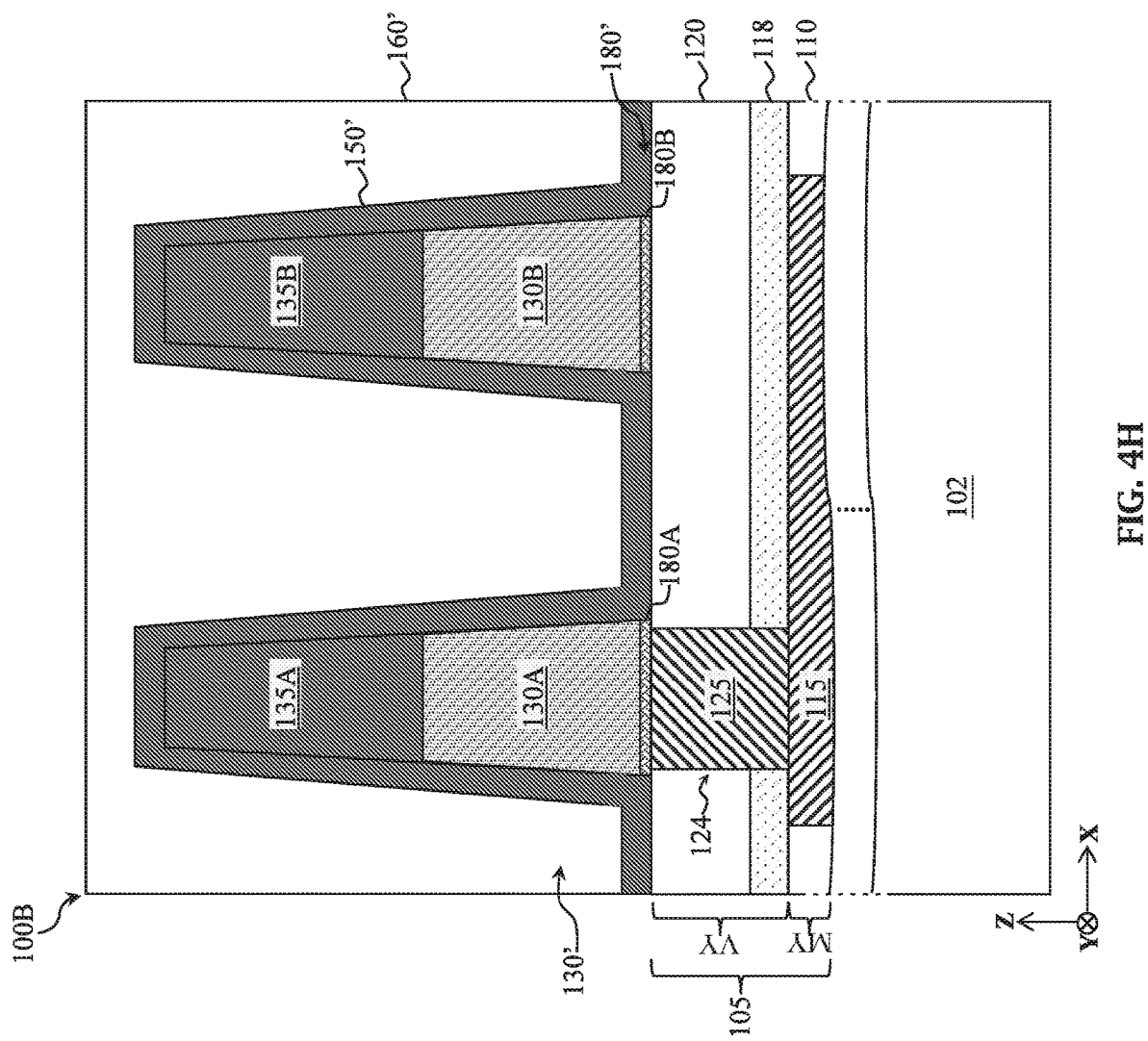
Figure 4I:
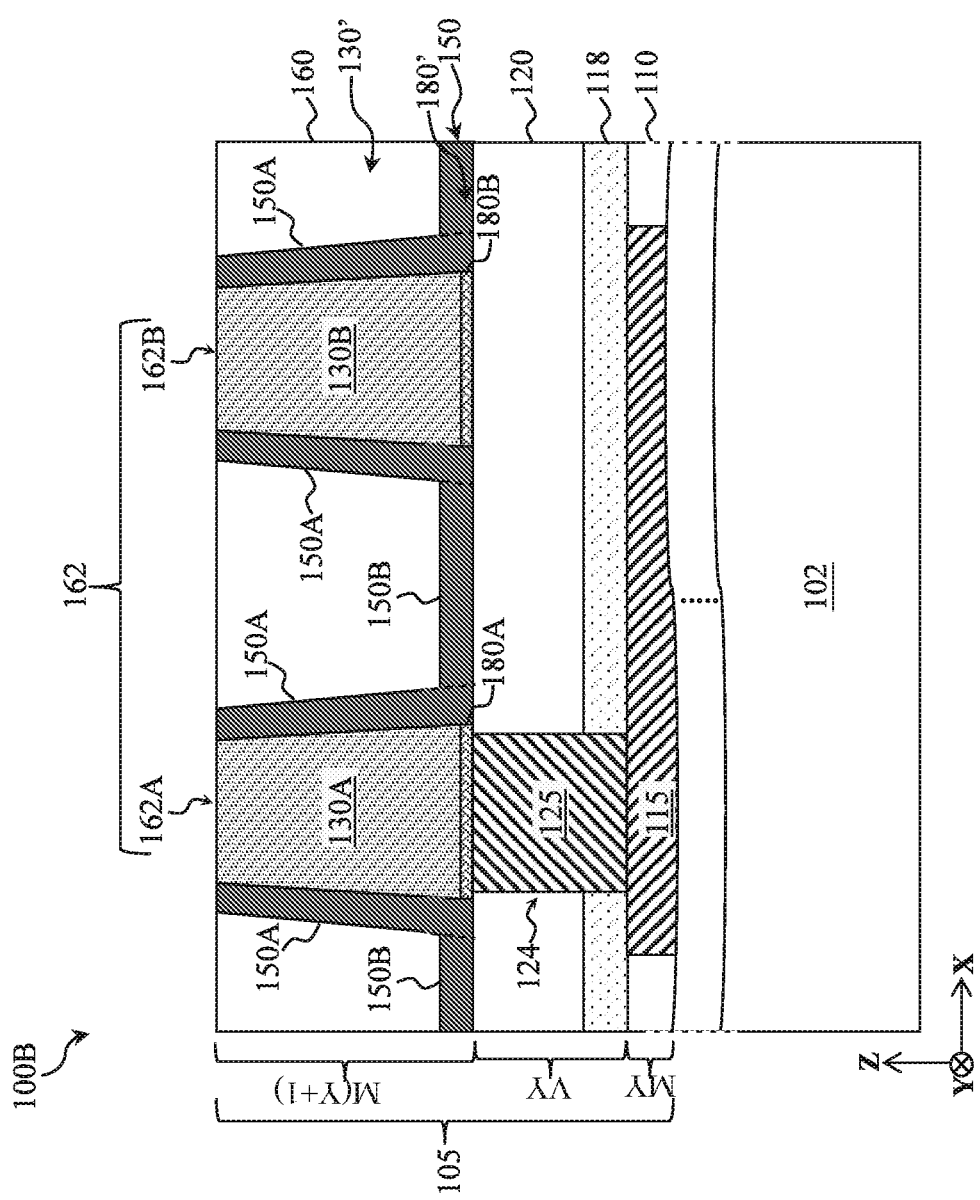

In FIGS. 4G-4I, fabrication of interconnect structure 100B proceeds similar to fabrication of interconnect structure 100A in FIGS. 2G-2J. For example, spacer layer 150' is formed over patterned ruthenium layer 180', patterned mask layer 135', patterned graphite layer 130', and ILD layer 120 (FIG. 4G), and dielectric material 160' is formed over spacer layer 150' (FIG. 4H). A CMP process and/or other planarization process then removes portions of dielectric material 160', portions of spacer layer 150', and patterned mask layer 135' from over a top surface of patterned graphite layer 130', thereby forming ILD layer 160 having patterned graphite layer 130', spacers 150, and patterned ruthenium layer 180' embedded therein (FIG. 4I). In such embodiments, conductive line 162A further includes ruthenium layer 180A and conductive line 162B further includes ruthenium layer 180B. Ruthenium layer 180A is between graphite plug 130A and conductive plug 125 of via 124 and between graphite plug 130A and ILD layer 120. Ruthenium layer 180B is between graphite plug 130B and ILD layer 120 and may be between graphite plug 130B and a via of VY layer (not shown).

In FIG. 4I, interconnect structure 100B includes an M(Y+1)/VY interconnect structure that is barrier-free and reduces resistance and/or RC delay similar to interconnect structure 100A, as described above. In interconnect structure 100B, M(Y+1)/VY interconnect structure includes an interface between metal and an electrically conductive non-metal (i.e., graphite plug 130A/ruthenium layer 180A interface) and various metal-insulator interfaces, such as between graphite plug 130A and spacers 150, graphite plug 130 and ILD layer 120, ruthenium layer 180A and spacers 150, ruthenium layer 180A and ILD layer 120, conductive plug 125 and ILD layer 120, and conductive plug 125 and CESL 118. Any scattering (e.g., electron scattering) associated with such interfaces negligibly impacts resistivity (i.e., does not or minimally increases resistivity). M(Y+1)/VY interconnect structure of interconnect structure 100B further includes a metal-metal interface, such as between ruthenium layer 180A and conductive plug 125. Though the metal-metal interface may cause scattering that impacts resistivity of M(Y+1)/VY interconnect structure, any such scattering is less than scattering that has been observed with metal-metal nitride interfaces (e.g., TiN—Ru interfaces). Further, M(Y+1)/VY interconnect structure of interconnect structure 100B has a single metal-metal interface, so that interconnect structure 100B has less metal-metal interfaces than conventional interconnect structures. Accordingly, even with ruthenium layer 180A, resistance and/or RC delay associated with interconnect structure 100B is less than resistance and/or RC delay associated with conventional interconnect structures having barriers/liners, and devices having interconnect structure 100B may exhibit improved performance (e.g., faster propagation of electrical signals) compared to conventional interconnect structures. Different embodiments may have different advantages, and no particular advantage is required of any embodiment.

The present disclosure proposes implementing interconnect structures having barrier-free graphite lines and barrier-free metal vias as described herein at various layers (levels) of an MLI. FIGS. 5-10 are fragmentary diagrammatic cross-sectional views of MLIs, in portion or entirety, having at least one barrier-free graphite line/metal via interconnect structure according to various embodiments of the present disclosure. The MLIs and interconnect structures therein are similar in many respects to multilayer interconnect MLI of FIG. 1, interconnect structures of multilayer interconnect MLI of FIG. 1, interconnect structure 100A of FIGS. 2A-2J and FIGS. 3A-3B, interconnect structure 100B of FIGS. 4A-4J, or combinations thereof. Accordingly, similar features in FIGS. 5-10 and FIG. 1, FIGS. 2A-2J, FIGS. 3A-3C, and FIGS. 4A-4J are identified by the same reference numerals for clarity and simplicity. FIGS. 5-10 have been simplified for the sake of clarity to better understand the inventive concepts of the present disclosure. Additional features can be added in the MLIs, and some of the features described below can be replaced, modified, or eliminated in other embodiments of the MLIs.

Figure 5:
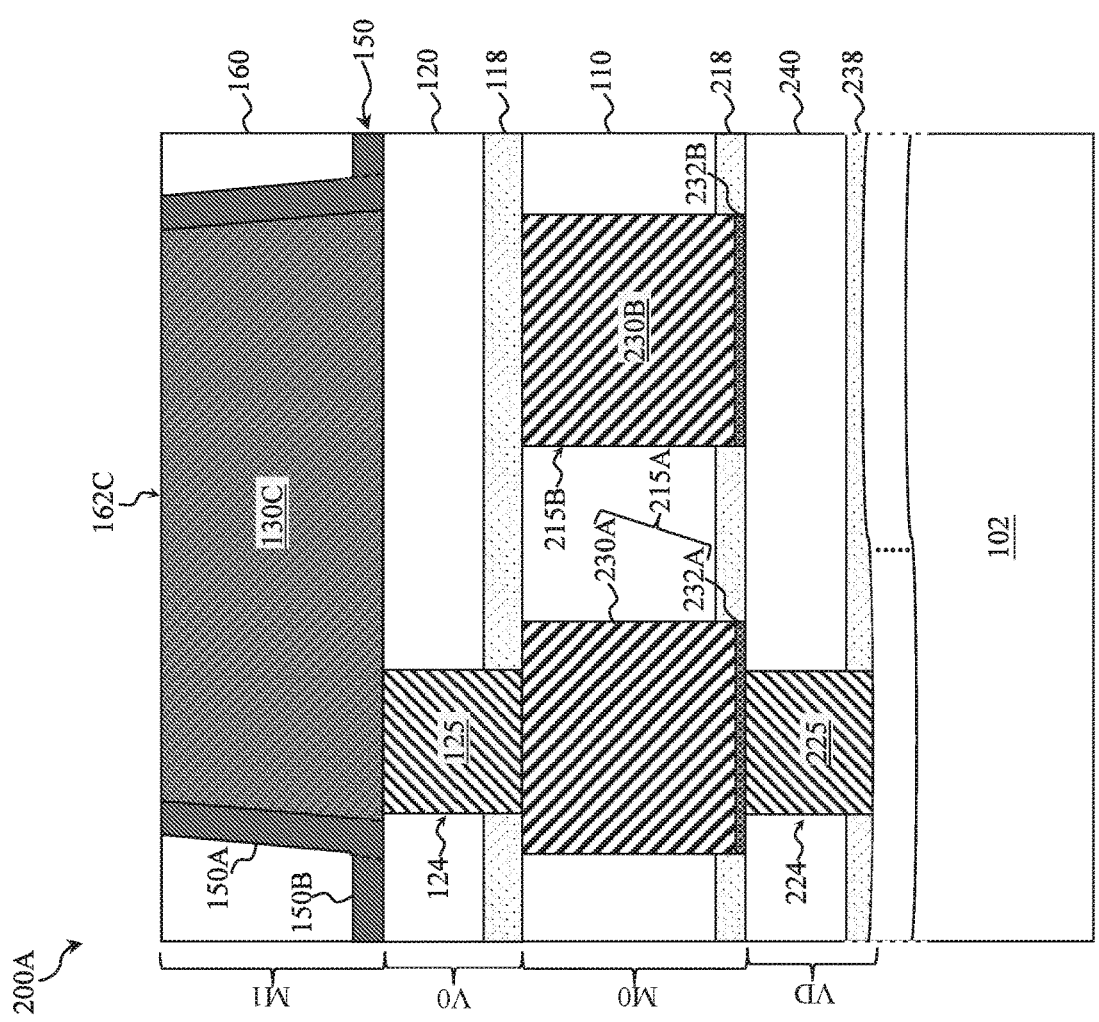
FIGS. 5-10 are diagrammatic cross-sectional views of multilayer interconnects, in portion or entirety, having at least interconnect structure configured as depicted in FIG. 2I and/or FIG. 4I according to various embodiments of the present disclosure.

Turning to FIG. 5, FIG. 5 depicts a portion of an MLI 200A having a VD layer, an M0 layer, a V0 layer, and a M1 layer. M1 layer includes a barrier-free conductive line 162C including a graphite plug 130C (similar to conductive line 162A including graphite plug 130A) in ILD layer 160, where spacers 150 are between graphite plug 130C and ILD layer 160. V0 layer includes barrier-free via 124 (including conductive plug 125) in ILD layer 120 and CESL 118. M0 layer includes a conductive line 215A and a conductive line 215B in ILD layer 110 and a CESL 218 (similar to CESL 118). VD layer includes a barrier-free via 224 including a conductive plug 225 (similar to via 124 including conductive plug 125) in an ILD layer 240 (similar to ILD layer 120) and a CESL 238 (similar to CESL 118). Via 224 physically and/or directly contacts an underlying device-level contact, such as a source/drain contact MD, which may be connected to device layer 102. Via 124 and via 224 can include the same materials. For example, conductive plug 125 and conductive plug 225 may be tungsten plugs, ruthenium plugs, or molybdenum plugs. Via 124 and via 224 can include different materials. For example, conductive plug 125 is a tungsten plug, and conductive plug 225 is a ruthenium plug, etc.

Conductive line 215A includes a ruthenium plug 230A and an adhesion layer 232A, and conductive line 215B includes a ruthenium plug 230A and an adhesion layer 232B. Ruthenium plug 230A and ruthenium plug 230B include ruthenium or ruthenium alloy (for example, including aluminum, copper, tungsten, molybdenum, cobalt, iridium, palladium, platinum, nickel, tin, gold, silver, other suitable ruthenium alloying constituent, or combinations thereof). Adhesion layer 232A and adhesion layer 232B include a material that promotes adhesion between ruthenium plugs and underlying vias and/or dielectric layers. For example, adhesion layer 232A and adhesion layer 232B include titanium, tantalum, cobalt, ruthenium, molybdenum, other constituent that can promote and/or enhance adhesion between ruthenium and underlying features, alloys thereof, silicides thereof, or combinations thereof. In some embodiments, adhesion layer 232A and/or adhesion layer 232B are titanium nitride layers. In some embodiments, adhesion layer 232A and/or adhesion layer 232B are titanium layers. In some embodiments, adhesion layer 232A and/or adhesion layer 232B include multiple layers, such as a titanium nitride layer disposed over a titanium layer.

Accordingly, M0 layer has ruthenium conductive lines (i.e., conductive line 215A and conductive line 215B) connected to underlying routing layers and/or device layer 102 by barrier-free tungsten, ruthenium, or molybdenum vias (i.e., via 224), and M1 layer has barrier-free graphite conductive lines (i.e., conductive line 162C) connected to underlying routing layers and/or device layer 102 by barrier-free tungsten, ruthenium, or molybdenum vias (i.e., via 124). In such embodiments, a barrier-free graphite line/metal via interconnect structure includes graphite plug 130C in M1 layer connected to conductive plug 125 of via 124 in V0 layer, and a barrier-free ruthenium line/metal via interconnect structure includes ruthenium plug 230A/adhesion layer 232A in M0 layer connected to conductive plug 225 of via 224 in VD layer. The barrier-free graphite line/metal via interconnect structure and the barrier-free ruthenium line/metal via interconnect structure are physically and electrically connected to one another by via 124. In some embodiments, MLI 200A further includes M2 layer to MX layer over M1 layer and V1 layer to V(X−1) layer. M2 layer, MX layer, and routing layers therebetween can be configured similar to M1 layer (i.e., M2 layer to MX layer have barrier-free graphite lines), and V1 layer, V(X−1) layer, and via layers therebetween can be configured similar to V0 layer (i.e., V1 layer to V(X−1) layer have barrier-free ruthenium, tungsten, or molybdenum vias). In such embodiments, VD layer, M0 layer to MX layer, and V0 layer to V(X−1) layer are formed by single damascene processes. In some embodiments, M2 layer, MX layer, one or more of the routing layers therebetween, or combinations thereof are configured with different materials than M1 layer. In some embodiments, V1 layer, V(X−1) layer, one or more of the via layers therebetween, or combinations thereof are configured with different materials than V0 layer.

Figure 6:
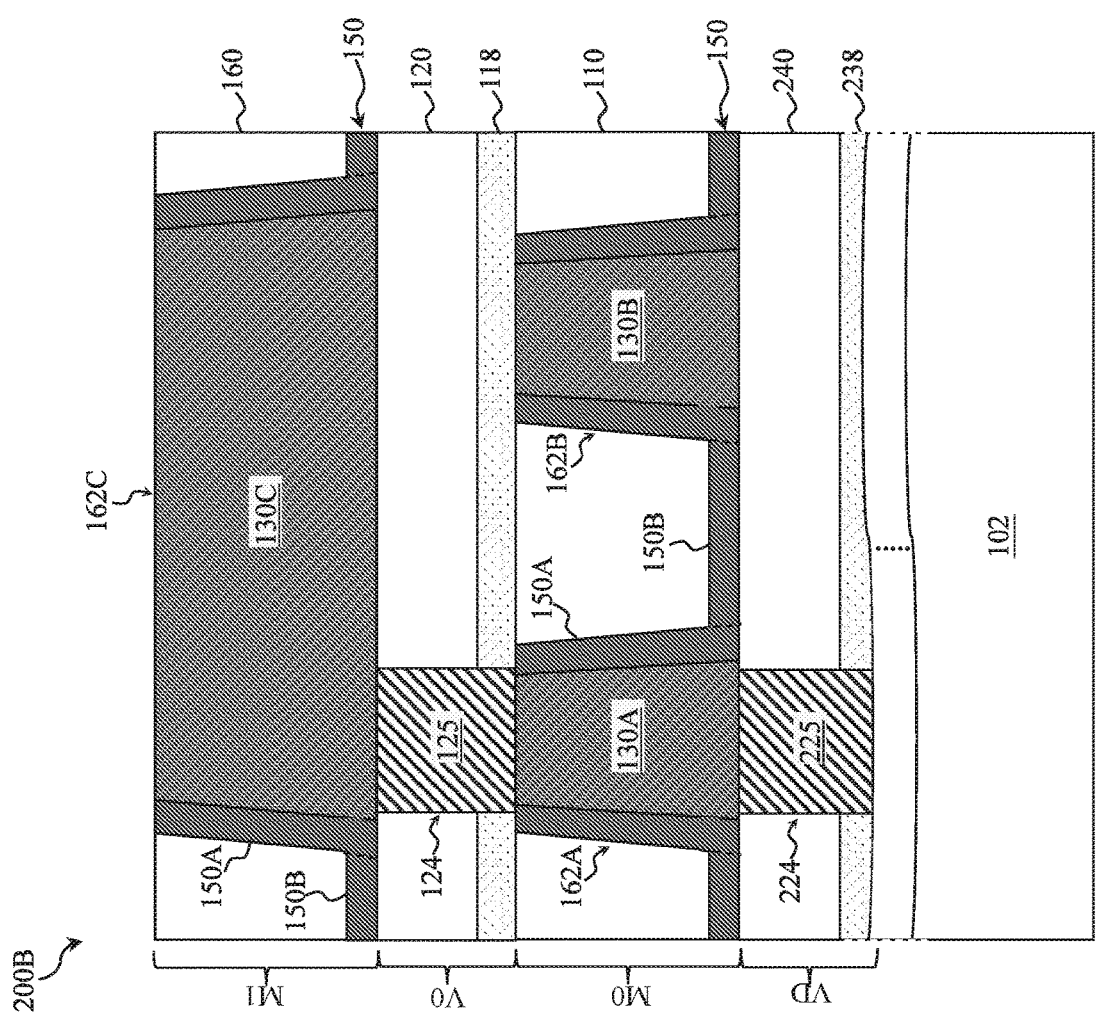

Turning to FIG. 6, FIG. 6 depicts a portion of an MLI 200B having a VD layer, an M0 layer, a V0 layer, and a M1 layer. MLI 200B is similar to MLI 200A, except M0 layer of MLI 200B includes graphite lines, instead of ruthenium lines. For example, M0 layer includes barrier-free conductive line 162A including graphite plug 130A and barrier-free conductive line 162B including graphite plug 130B in ILD layer 110, where spacers 150 are between graphite plug 130A and ILD layer 110 and between graphite plug 130B and ILD layer 110. In such embodiments, M1/V0 interconnect structures and M0/VD interconnect structures are barrier-free graphite line/metal via interconnect structures. In some embodiments, MLI 200B includes M2 layer to MX layer having barrier-free graphite lines and V1 layer to V(X−1) layer having barrier-free metal vias. Materials of the barrier-free metal vias (e.g., tungsten, ruthenium, molybdenum, other suitable metal, or combinations thereof) can be selected based on design requirements of a device to which MLI 200B belongs. In some embodiments, vias of VD layer and vias of V0 layer to V(X−1) layer include the same materials. In some embodiments, vias of VD layer and vias of V0 layer to V(X−1) layer include different materials. For example, vias of VD layer and vias of V0 layer to V(X−1) layer include different metals. In another example, vias of V0 layer and vias of V1 layer to V(X−1) layer include different metals.

Figure 7:
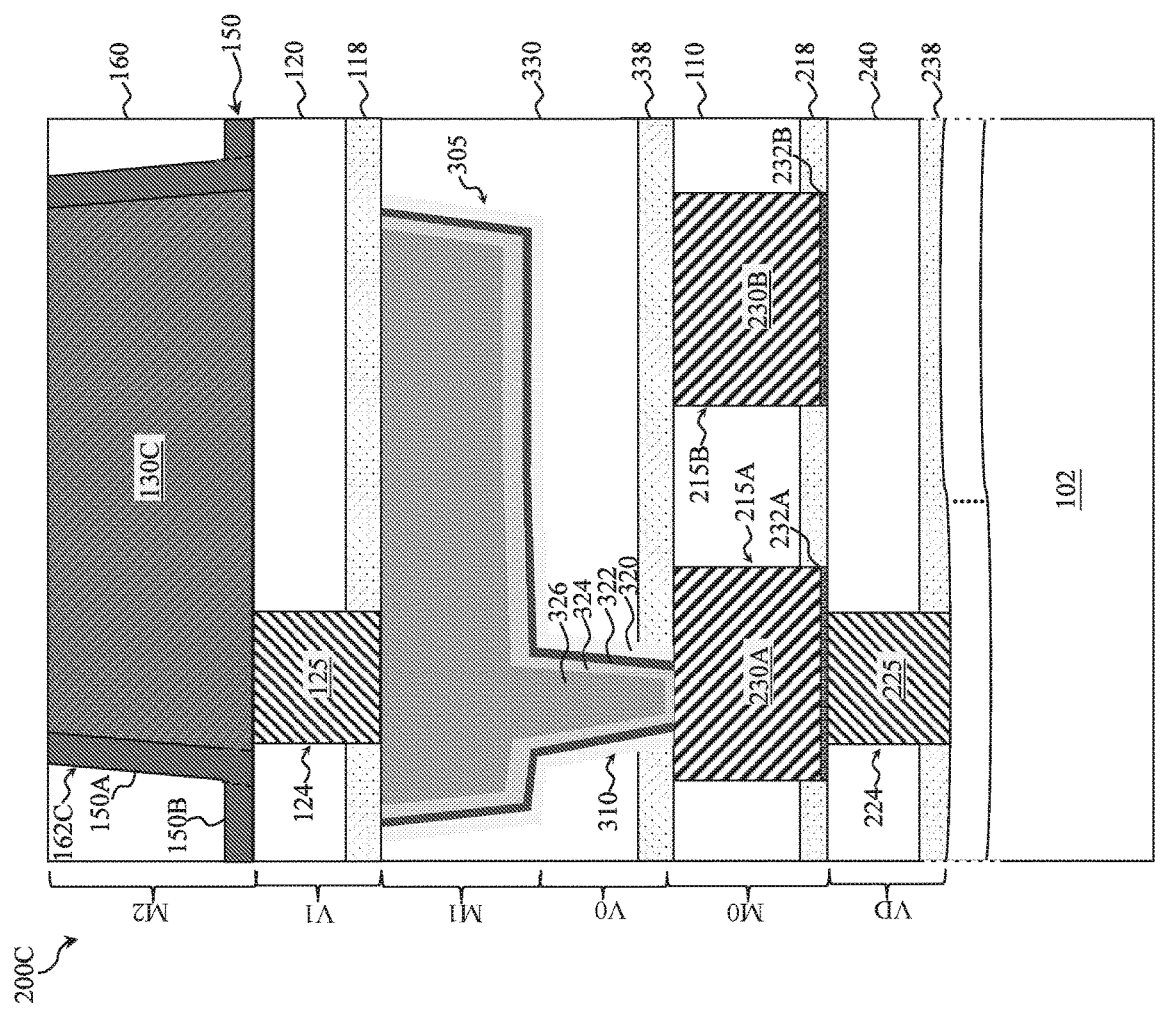

Turning to FIG. 7, FIG. 7 depicts a portion of an MLI 200C having a VD layer, an M0 layer, a V0 layer, a M1 layer, a V1 layer, and an M2 layer. M2 layer includes barrier-free conductive line 162C including graphite plug 130C in ILD layer 160, where spacers 150 are between graphite plug 130C and ILD layer 160. V1 layer includes barrier-free via 124 (including conductive plug 125) in ILD layer 120 and CESL 118. M0 layer includes conductive line 215A (having ruthenium plug 230A and adhesion layer 232A) and conductive line 215B (having ruthenium plug 230B and adhesion layer 232B) in ILD layer 110 and CESL 218. VD layer includes barrier-free via 224 (including conductive plug 225) in ILD layer 240 and CESL 238. M2 layer, V1 layer, M0 layer, and VD layer are formed by single damascene processes.

M1 layer and V0 layer are formed by a dual damascene process. For example, conductive material for conductive lines of M1 layer, such as a conductive line 305, and vias of V0 layer, such as a via 310, are deposited and/or formed at the same time. In such embodiments, conductive line 305 and via 310 share conductive layers, such as a barrier layer 320, a metal liner 322, a metal liner 324, and a metal plug 326, instead of each having a respective and distinct barrier layer, metal liner(s), and plug. The dual damascene process can include performing a patterning process to form an interconnect opening that extends through an ILD layer 330 (similar to ILD layer 120) and a CESL 338 (similar to CESL 118) to expose an underlying conductive feature of M0 layer, such as conductive line 215A. The patterning process can include a first lithography step and a first etch step to form a trench opening of the interconnect opening (which corresponds with and defines conductive line 305) in ILD layer 330, a second lithography step and a second etch step to form a via opening of the interconnect opening (which corresponds with and defines via 310) in ILD layer 330 that exposes CESL 338, and a third etch step to remove the exposed portion of CESL 338, thereby exposing conductive line 215A. The first lithography/first etch step and the second lithography/second etch step can be performed in any order (e.g., trench first via last or via first trench last). The first etch step and the second etch step are each configured to selectively remove ILD layer 330 with respect to a patterned mask layer and CESL 338, while the third etch step is configured to selectively remove CESL 338 with respect to ILD layer 330, ILD layer 110, and conductive line 215A.

After performing the patterning process, the dual damascene process includes performing a first deposition process to form a barrier material over ILD layer 330 that partially fills the interconnect opening, performing a second deposition process to form a first metal liner material over the barrier material that partially fills the interconnect opening, performing a third deposition process to form a second metal liner material over the first metal liner material that partially fills the interconnect opening, and performing a fourth deposition process to form a bulk metal material over the second metal liner material, where the bulk metal material fills a remainder of the interconnect opening. In such embodiments, the barrier material, the first metal liner material, the second metal liner material, and the bulk metal material are disposed in the interconnect opening and over a top surface of ILD layer 330. The first deposition process, the second deposition process, the third deposition process, and the fourth deposition process can include CVD, PVD, ALD, HDPCVD, MOCVD, RPCVD, PECVD, LPCVD, ALCVD, APCVD, PEALD, electroplating, electroless plating, other suitable methods, or combinations thereof. In some embodiments, the barrier material, the first metal liner material, the second metal liner material, or combinations thereof may be formed by conformal deposition processes and have substantially uniform thicknesses along sidewalls and bottom of the interconnect opening.

The barrier material is a material that promotes adhesion between a surrounding dielectric material (e.g., ILD layer 330 and/or CESL 338) and metal layers of the interconnect structure (e.g., metal liner 322, metal liner 324, and metal plug 326). The barrier material may further prevent diffusion of metal constituents from the interconnect structure into the surrounding dielectric material. For example, the barrier material includes tantalum, tantalum nitride, tantalum aluminum nitride, tantalum silicon nitride, tantalum carbide, titanium, titanium nitride, titanium silicon nitride, titanium aluminum nitride, titanium carbide, tungsten, tungsten nitride, tungsten carbide, molybdenum nitride, cobalt, cobalt nitride, ruthenium, palladium, or combinations thereof. The first metal liner material, the second metal liner material, and the bulk metal material include aluminum, copper, titanium, tantalum, tungsten, ruthenium, molybdenum, cobalt, iridium, palladium, platinum, nickel, tin, gold, silver, other suitable metals, alloys thereof, silicides thereof, or combinations thereof. For example, the barrier material includes titanium or tantalum, the first metal liner material includes ruthenium, the second metal liner material includes cobalt, and the bulk metal material includes copper.

A planarization process (e.g., CMP) is then performed to remove excess bulk metal material, second metal liner material, first metal liner material, and barrier material, for example, from over a top surface of ILD layer 330, resulting in an interconnect structure that includes conductive line 305 and via 310. The CMP can planarize a top surface of the interconnect structure and ILD layer 330, such that in some embodiments, a top surface of ILD layer 330 and a top surface of conductive line 305 form a substantially planar surface. The barrier material, the first metal liner material, the second metal liner material, and the bulk metal material fill the trench opening and the via opening of the interconnect opening without interruption. Barrier layer 320, metal liner 322, metal liner 324, and metal plug 326 thus each extend continuously from conductive line 305 to via 310 without interruption. In the depicted embodiment, barrier layer 320 is a tantalum nitride layer or a titanium nitride layer, metal liner 322 is a ruthenium layer, metal liner 324 is a cobalt layer, and metal plug 326 is a copper layer.

Accordingly, conductive line 305 of M1 layer has metal plug 326 (e.g., a copper plug), metal liner 324, metal liner 322, and barrier layer 320, and via 310 of V0 layer has metal plug 326, metal liner 324, metal liner 322, and barrier layer 320, where barrier layer 320, metal liner 322, and metal liner 324 are between metal plug 326 and surrounding dielectric layers (e.g., ILD layer 330 and/or CESL 338). In such embodiments, M2/V1 interconnect structures are barrier-free graphite line/metal via interconnect structures, M1/V0 interconnect structures are dual damascene metal interconnect structures, such as copper interconnect structures, and M0/VD interconnect structures are barrier-free ruthenium line/metal via interconnect structures. In some embodiments, MLI 200C includes M3 layer, MX layer, one or more routing layers therebetween, or combinations thereof having barrier-free graphite lines, and V2 layer, V(X−1) layer, one or more via layers therebetween, or combinations thereof having barrier-free metal vias. Materials of the barrier-free metal vias (e.g., tungsten, ruthenium, molybdenum, other suitable metal, or combinations hereof) can be selected based on design requirements of a device to which MLI 200D belongs. In some embodiments, M3 layer, MX layer, one or more routing layers therebetween, V2 layer, V(X−1) layer, one or more via layers therebetween, or combinations thereof may be configured with dual damascene interconnect structures.

Figure 8:
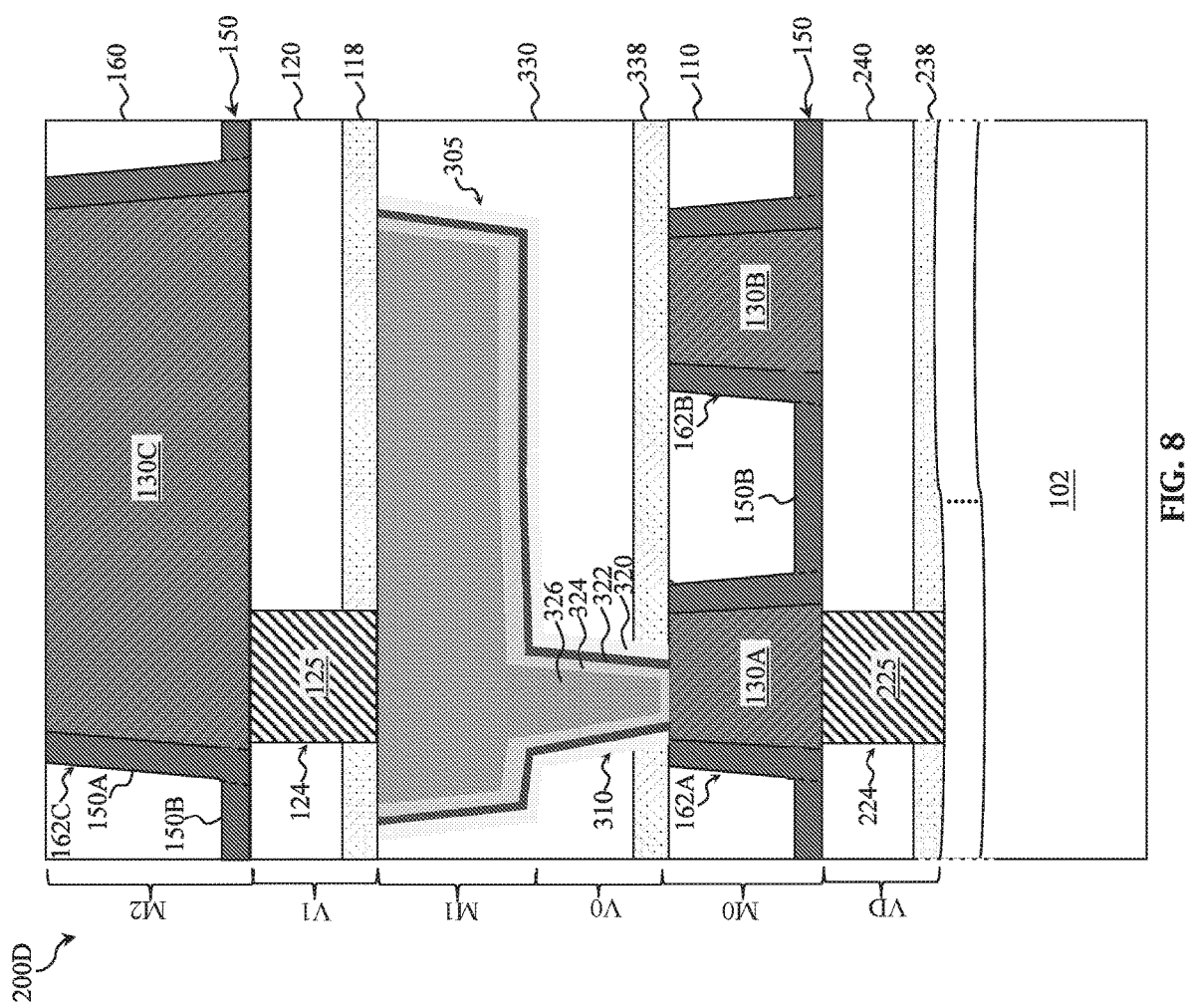

Turning to FIG. 8, FIG. 8 depicts a portion of an MLI 200D having a VD layer, an M0 layer, a V0 layer, a M1 layer, a V1 layer, and an M2 layer. MLI 200D is similar to MLI 200C, except M0 layer of MLI 200D includes graphite lines, instead of ruthenium lines. For example, M0 layer includes barrier-free conductive line 162A including graphite plug 130A and barrier-free conductive line 162B including graphite plug 130B in ILD layer 110, where spacers 150 are between graphite plug 130A and ILD layer 110 and between graphite plug 130B and ILD layer 110. In such embodiments, M2/V1 interconnect structures are barrier-free graphite line/metal via interconnect structures, M1/V0 interconnect structures are dual damascene interconnect structures, such as dual damascene copper interconnect structures, and M0/VD interconnect structures are barrier-free graphite line/metal via interconnect structures. In some embodiments, MLI 200D includes M3 layer, MX layer, one or more routing layers therebetween, or combinations thereof having barrier-free graphite lines, and V2 layer, V(X−1) layer, one or more via layers therebetween, or combinations thereof having barrier-free metal vias. Materials of the barrier-free metal vias (e.g., tungsten, ruthenium, molybdenum, other suitable metal, or combinations hereof) can be selected based on design requirements of a device to which MLI 200D belongs. In some embodiments, M3 layer, MX layer, one or more routing layers therebetween, V2 layer, V(X−1) layer, one or more via layers therebetween, or combinations thereof may be configured with dual damascene interconnect structures.

Figure 9:
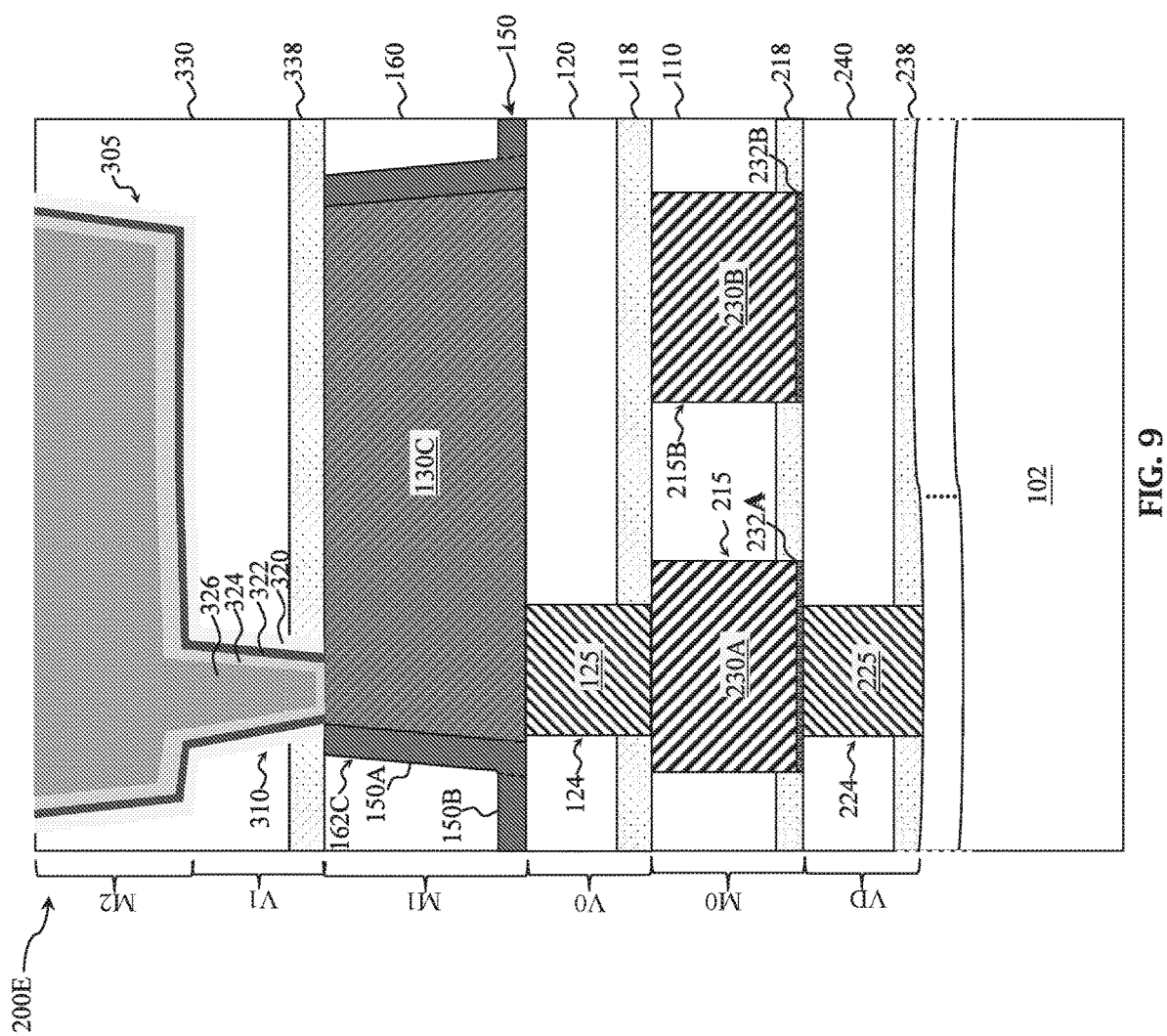

Turning to FIG. 9, FIG. 9 depicts a portion of an MLI 200E having a VD layer, an M0 layer, a V0 layer, a M1 layer, a V1 layer, and an M2 layer. MLI 200E is similar to MLI 200A, except MLI 200E further includes M2 layer having conductive line 305 and V1 layer having via 310. In such embodiments, M2/V1 interconnect structures are dual damascene interconnect structures, M1/V0 interconnect structures are barrier-free graphite line/metal via interconnect structures, and M0/VD interconnect structures are barrier-free ruthenium line/metal via interconnect structures. In some embodiments, MLI 200E includes M3 layer, MX layer, one or more routing layers therebetween, or combinations thereof having barrier-free graphite lines, and V2 layer, V(X−1) layer, one or more via layers therebetween, or combinations thereof having barrier-free metal vias. Materials of the barrier-free metal vias (e.g., tungsten, ruthenium, molybdenum, other suitable metal, or combinations hereof) can be selected based on design requirements. In some embodiments, M3 layer, MX layer, one or more routing layers therebetween, V2 layer, V(X−1) layer, one or more via layers therebetween, or combinations thereof may be configured with dual damascene interconnect structures.

Figure 10:
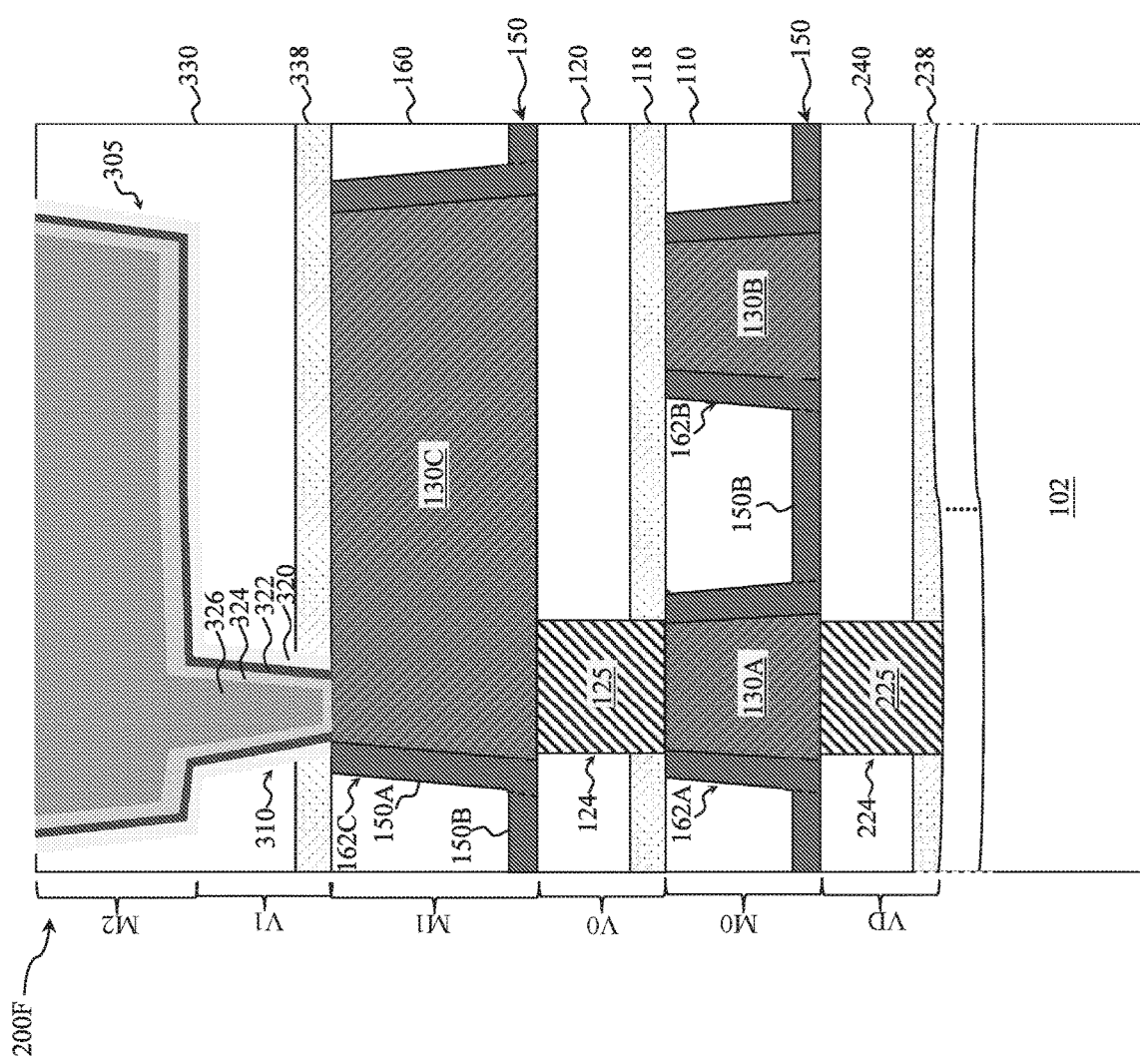

Turning to FIG. 10, FIG. 10 depicts a portion of an MLI 200F having a VD layer, an M0 layer, a V0 layer, a M1 layer, a V1 layer, and an M2 layer. MLI 200F is similar to MLI 200B, except MLI 200F further includes M2 layer having conductive line 305 and V1 layer having via 310. In such embodiments, M2/V1 interconnect structures are dual damascene interconnect structures, M1/V0 interconnect structures are barrier-free graphite line/metal via interconnect structures, and M0/VD interconnect structures are barrier-free graphite line/metal via interconnect structures. In some embodiments, MLI 200F includes M3 layer, MX layer, one or more routing layers therebetween, or combinations thereof having barrier-free graphite lines, and V2 layer, V(X−1) layer, one or more via layers therebetween, or combinations thereof having barrier-free metal vias. Materials of the barrier-free metal vias (e.g., tungsten, ruthenium, molybdenum, other suitable metal, or combinations hereof) can be selected based on design requirements. In some embodiments, M3 layer, MX layer, one or more routing layers therebetween, V2 layer, V(X−1) layer, one or more via layers therebetween, or combinations thereof may be configured with dual damascene interconnect structures.

The present disclosure contemplates configuring MLIs with barrier-free graphite line/metal via interconnect structures, barrier-free metal line/metal via interconnect structures, and dual damascene interconnect structures based on pitches of the routing layers, pitches of the via layers, dimensions of conductive lines, dimensions of the vias, or combinations thereof. For example, since copper can function as a low resistance metal at pitches greater than about 20 nm, MLIs can be configured with barrier-free graphite line/metal via interconnect structures and/or barrier-free metal line/metal via interconnect structures in routing layers/via layers having pitches less than about 20 nm and dual damascene copper interconnect structures in routing layers/via layers having pitches greater than about 20 nm. In another example, since copper can function as a low resistance metal at dimensions greater than about 10 nm, MLIs can be configured with barrier-free graphite line/metal via interconnect structures and/or barrier-free metal line/metal via interconnect structures in routing layers/via layers having line widths and/or via widths that are less than about 10 nm and dual damascene copper interconnect structures in routing layers/via layers having line widths and/or via widths that are greater than about 10 nm. In some embodiments, pitches and/or dimensions of upper routing layers/via layers are greater than pitches and/or dimensions of lower routing layers/via layers. In some embodiments, upper routing layers/via layers include copper interconnects while lower routing layers/via layers include graphite-based interconnects, such as described herein.

The present disclosure proposes implementing interconnect structures having barrier-free graphite lines and barrier-free metal vias as described herein in various devices to improve their performance by reducing contact resistance in MLIs of the various devices. FIGS. 11-14 are fragmentary diagrammatic cross-sectional views of devices, in portion or entirety, having at least one barrier-free graphite line/metal via interconnect structure according to various embodiments of the present disclosure. MLIs and interconnect structures therein are similar in many respects to multilayer interconnect MLI of FIG. 1, interconnect structures of multilayer interconnect MLI of FIG. 1, interconnect structure 100A of FIGS. 2A-2J and FIGS. 3A-3B, interconnect structure 100B of FIGS. 4A-4J, or combinations thereof. Accordingly, similar features in FIGS. 11-14 and FIG. 1, FIGS. 2A-2J, FIGS. 3A-3C, FIGS. 4A-4J, and FIGS. 5-10 are identified by the same reference numerals for clarity and simplicity. FIGS. 11-14 have been simplified for the sake of clarity to better understand the inventive concepts of the present disclosure. Additional features can be added in the devices, and some of the features described below can be replaced, modified, or eliminated in other embodiments of the devices.

Figure 11:
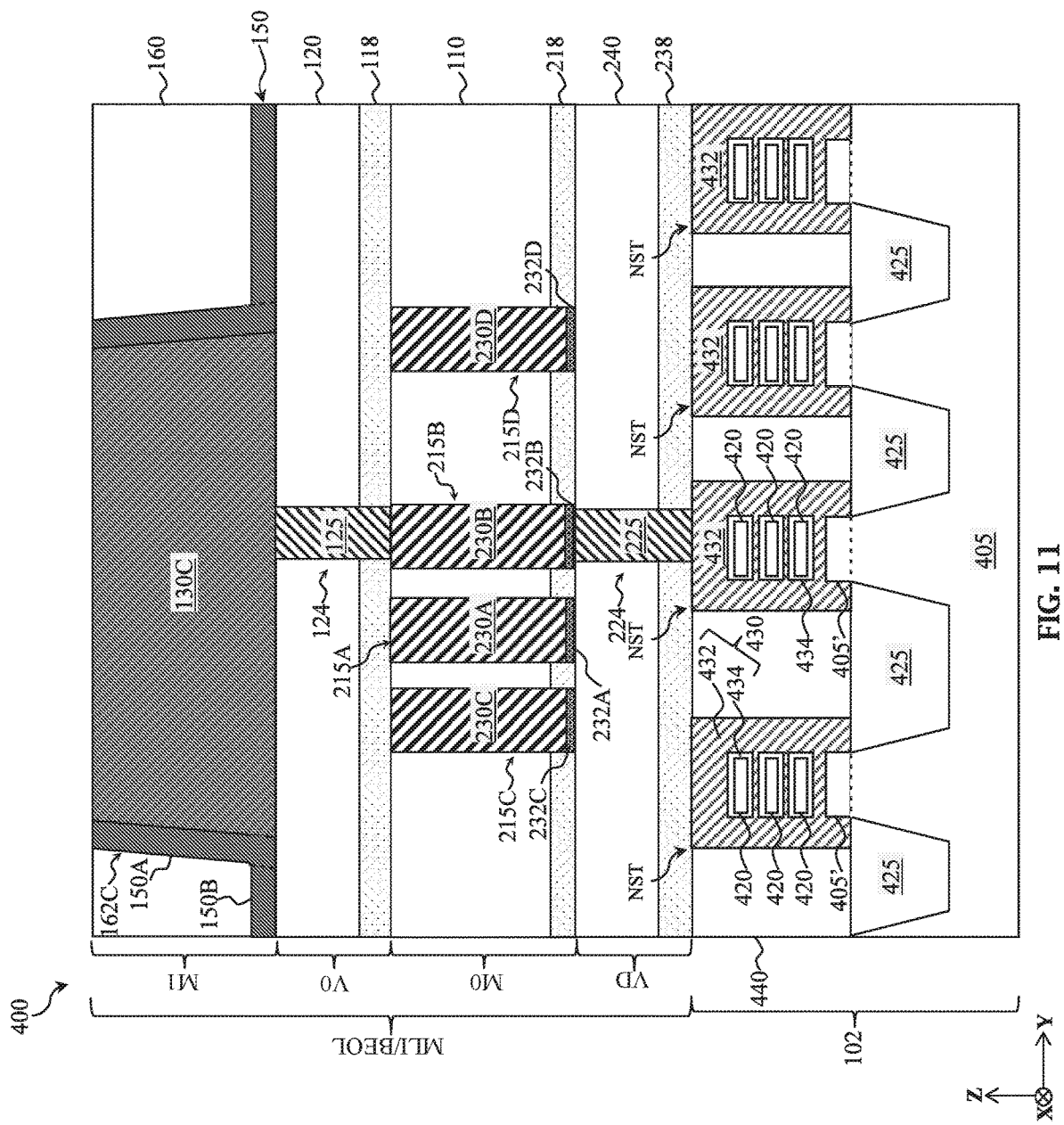
FIGS. 11-14 are diagrammatic cross-sectional views of devices, in portion or entirety, having multilayer interconnects having at least interconnect structure configured as depicted in FIG. 2I and/or FIG. 4I according to various aspects of the present disclosure.

In FIG. 11, a device 400 includes nanosheet transistors NST. For example, device 400 includes device substrate 102/device layer DL, which includes a substrate 405 (similar to substrate 5), mesas 405' (also referred to as substrate extensions), sheet-like channels 420 vertically stacked over mesas 405', isolation features 425 (similar to isolation features 25), gate stacks 430 (e.g., gate electrodes 432 and gate dielectrics 434), gate spacers along sidewalls of gate stacks 430 (not shown in depicted view), epitaxial source/drains (not shown in depicted view), a dielectric layer 440 (which can have a multilayer structure and/or include multiple dielectric materials), other device components/features, or combinations thereof. Each nanosheet transistor NST has a respective stack of sheet-like channels 420 suspended over a respective mesa 405' and extending between respective epitaxial source/drains along the x-direction, and a respective gate stack 430 disposed on and surrounding its sheet-like channels 420.

Device 400 further includes an MLI (also referred to as a back-end-of-line (BEOL) structure and/or BEOL layers) having a VD layer, a M0 layer, a V0 layer, and a M1 layer configured as described herein. For example, M1 layer includes barrier-free conductive line 162C including graphite plug 130C in ILD layer 160, where spacers 150 are between graphite plug 130C and ILD layer 160. V0 layer includes barrier-free via 124 (including conductive plug 125) in ILD layer 120 and CESL 118. M0 layer includes conductive lines 215A-215D (having ruthenium plugs 230A-230D and adhesion layers 232A-232D, respectively) in ILD layer 110 and a CESL 218. VD layer includes barrier-free via 224 including conductive plug in ILD layer 240 and CESL 238. Via 224 physically and/or directly contacts gate stack 430 (in particular, its gate electrode 432) of one of the nanosheet transistors NST. Accordingly, M1/V0 interconnect structures are barrier-free graphite line/metal via interconnect structures, and M0/VD interconnect structures are barrier-free ruthenium line/metal via interconnect structures, both of which can reduce interconnect resistance and improve performance of device 400.

Figure 12:
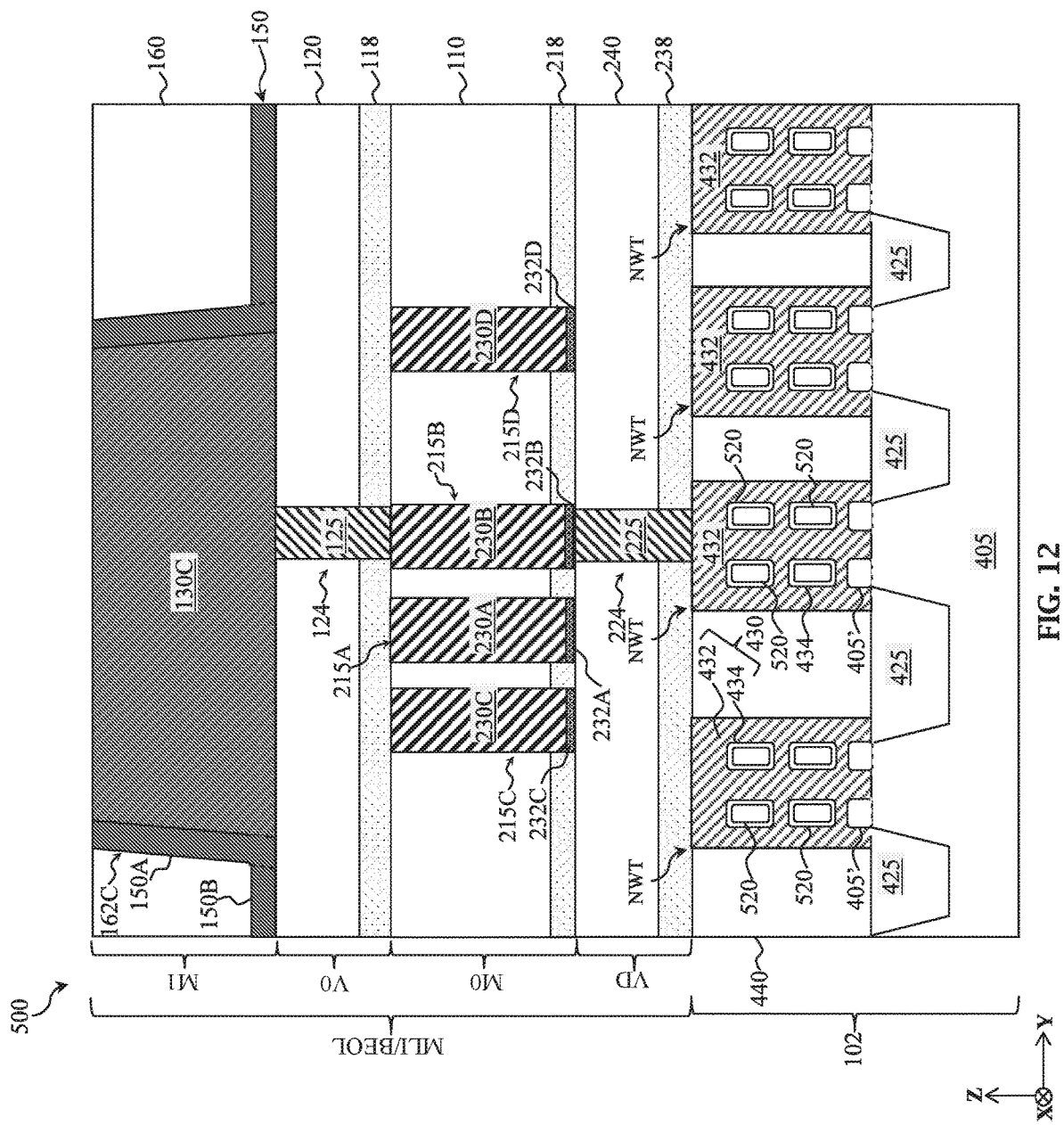

In FIG. 12, a device 500 includes nanowire transistors NWT. Device 500 is similar to device 400, except device 500 includes wire-like channels 520 instead of sheet-like channels 420. Each nanowire transistor NWT has a respective stack of wire-like channels 520 suspended over a respective mesa 405' and extending between respective epitaxial source/drains along the x-direction, and a respective gate stack 430 disposed on and surrounding its wire-like channels 520. Device 500 also includes M1/V0 interconnect structures that are barrier-free graphite line/metal via interconnect structures, and M0/VD interconnect structures that are barrier-free ruthenium line/metal via interconnect structures, both of which can reduce interconnect resistance and improve performance of device 500 as described herein.

Figure 13:
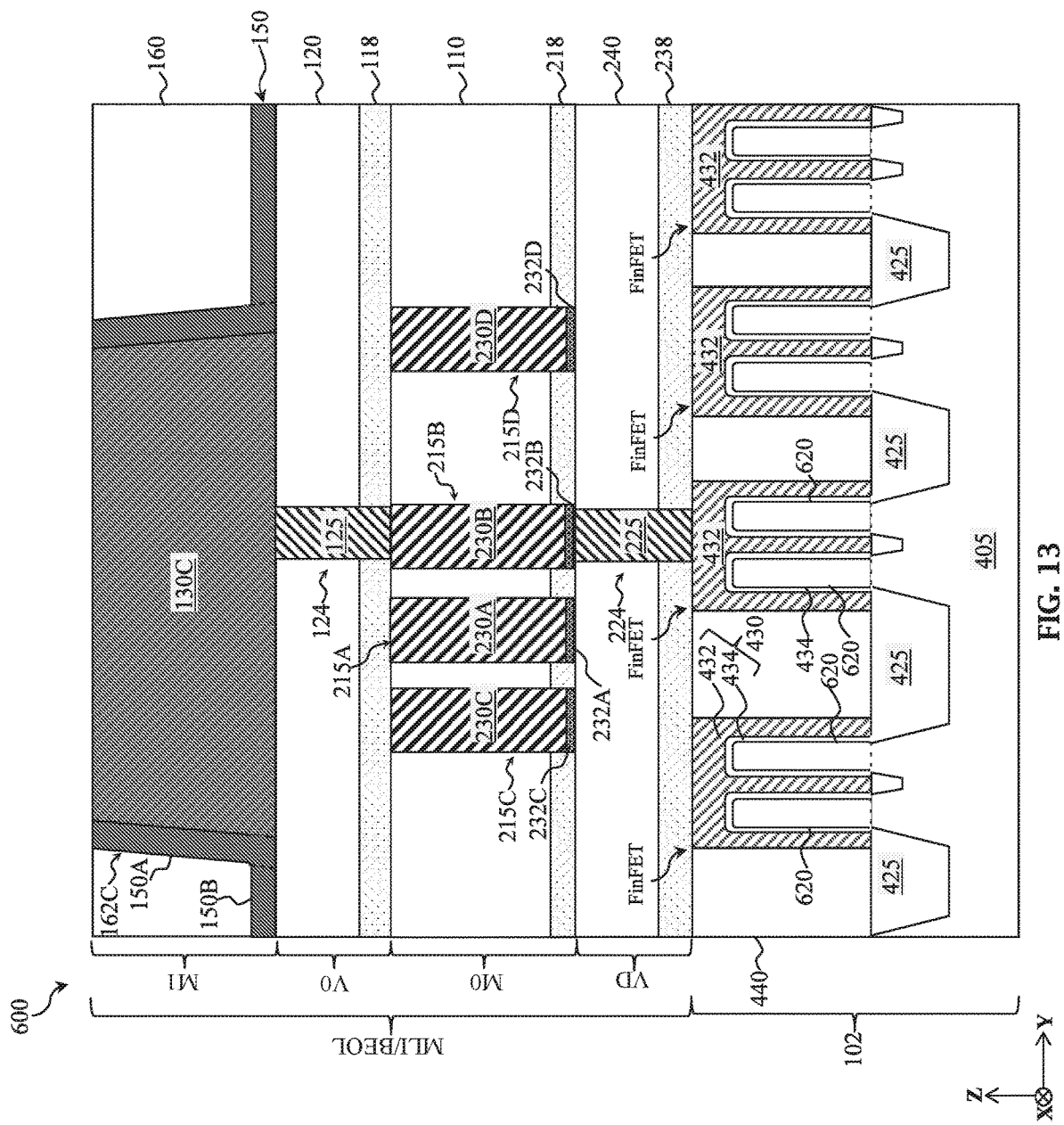

In FIG. 13, a device 600 includes FinFET transistors. Device 600 is similar to device 400, except device 600 includes fin-like channels 620 instead of sheet-like channels 420. Each FinFET transistors has respective fin-like channels 620 extending from substrate 405. Fin-like channels 620 extend between respective epitaxial source/drains of the FinFET transistors along the x-direction, and each FinFET transistor has a respective gate stack 430 disposed on and wrapping its fin-like channels 620. Device 600 also includes M1/V0 interconnect structures that are barrier-free graphite line/metal via interconnect structures, and M0/VD interconnect structures that are barrier-free ruthenium line/metal via interconnect structures, both of which can reduce interconnect resistance and improve performance of device 600.

Figure 14:
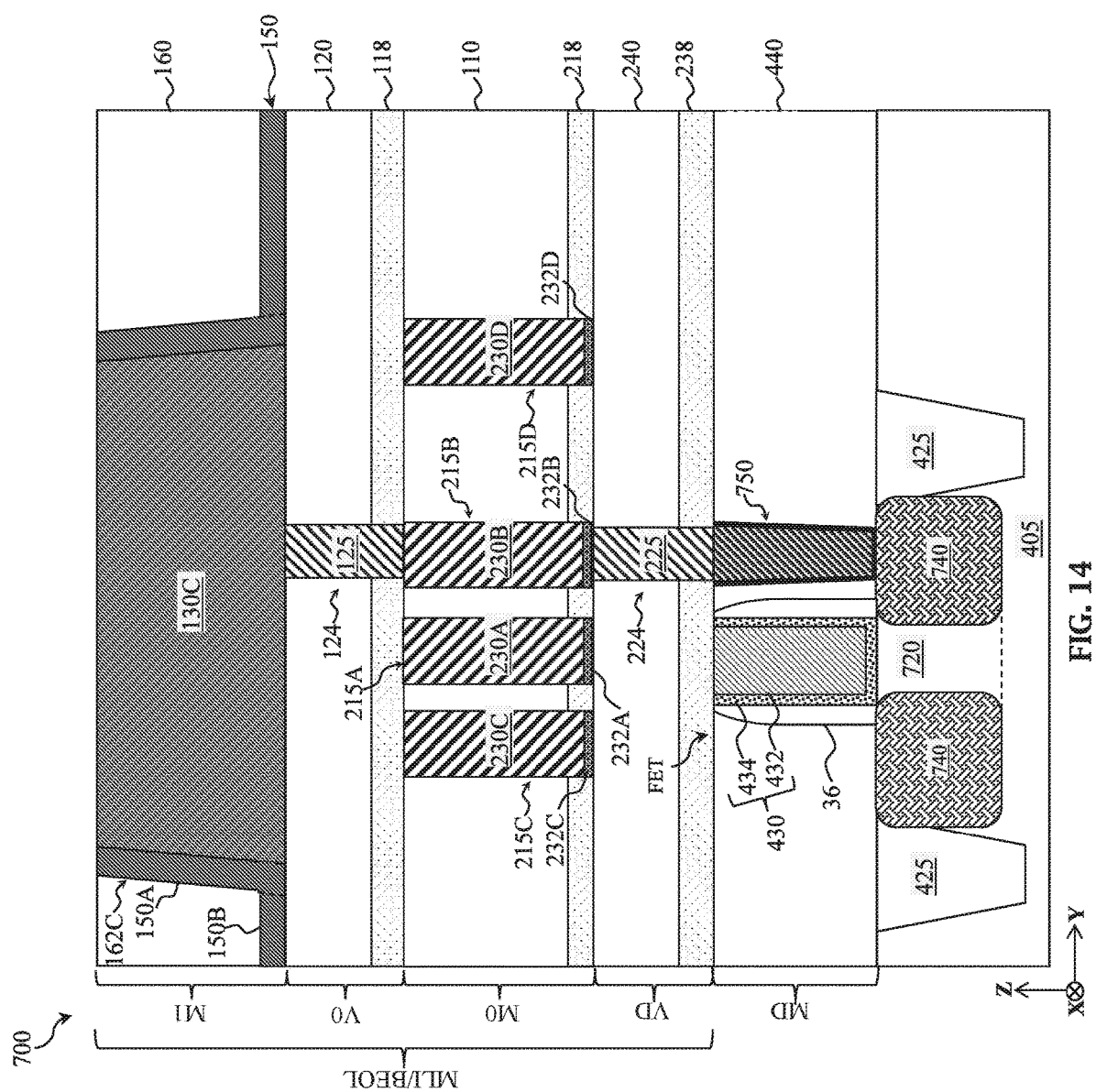

In FIG. 14, a device 700 includes planar transistors, such as a field effect transistor FET. Device 700 is similar to device 400, except device 700 includes channels 720, which are portions of substrate 405 between epitaxial source/drains 740, instead of sheet-like channels 420. Each FET has a respective gate stack 430 disposed on a respective channel 720 defined in a portion of substrate 405. Device 700 also includes M1/V0 interconnect structures that are barrier-free graphite line/metal via interconnect structures, and M0/VD interconnect structures that are barrier-free ruthenium line/metal via interconnect structures, both of which can reduce interconnect resistance and improve performance of device 700 as described herein. MLI of device 700 further includes an MD layer, which includes a source/drain contact 750 disposed in dielectric layer 440. Source/drain contact 750 connects one of FET's epitaxial source/drains 740 to via 224. In some embodiments, source/drain contact 750 includes a contact plug disposed over a contact barrier layer. In some embodiments, source/drain contact 750 is barrier-free. Source/drain contact 750 includes any of the conductive materials described herein.

Figure 15A:
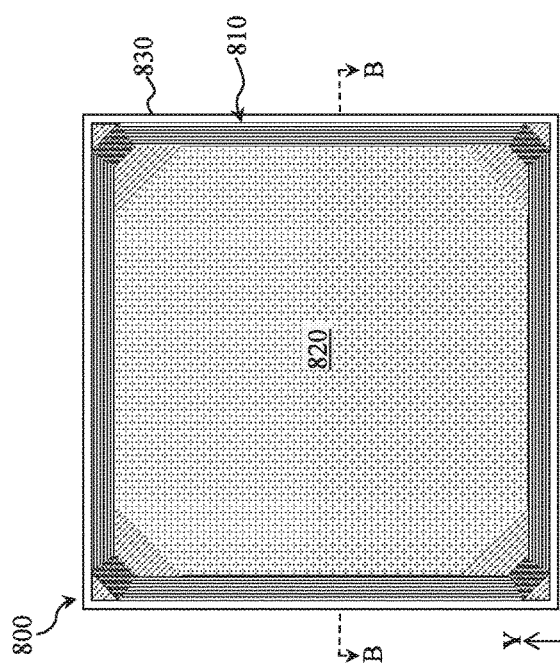
FIG. 15A and FIG. 15B are a top plan view and a cross-sectional view, respectively, of a semiconductor structure having a seal ring, in portion or entirety, formed from at least interconnect structure configured as depicted in FIG. 2I and/or FIG. 4I according to various aspects of the present disclosure.
Figure 15B:
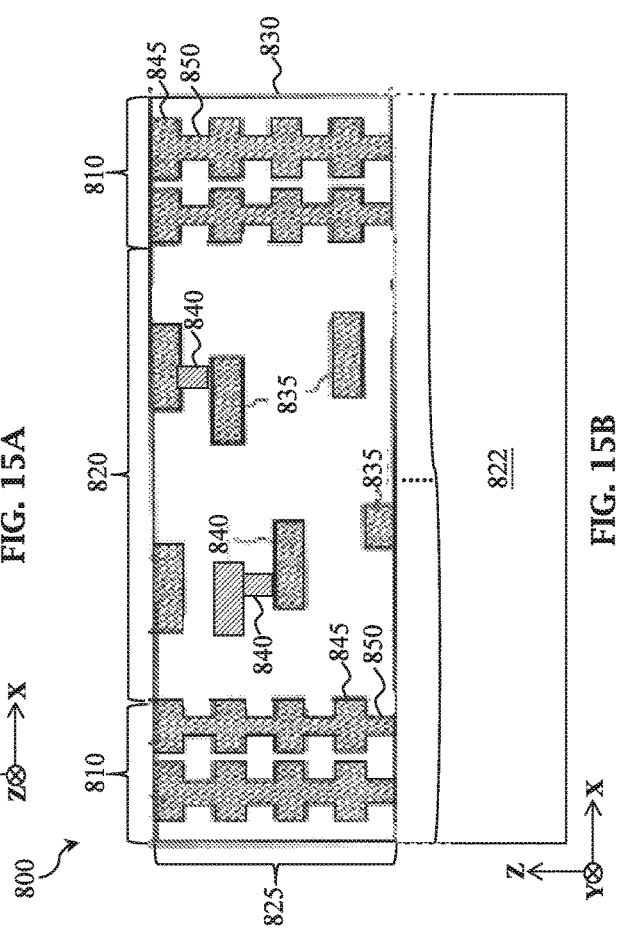

Interconnect structures described herein may have different dimensions in different regions of an IC. FIG. 15A is a top plan view of an IC chip (die) 800 having a seal ring 810, in portion or entirety, formed from at least one barrier-free graphite line/metal via interconnect structure according to various aspects of the present disclosure. FIG. 15B is a fragmentary cross-sectional view of IC die 800 along line B-B, in portion or entirety, according to various aspects of the present disclosure. FIG. 15A and FIG. 15B have been simplified for the sake of clarity to better understand the inventive concepts of the present disclosure. Additional features can be added in IC chip 800 and/or seal ring 810, and some of the features described below can be replaced, modified, or eliminated in other embodiments of IC chip 800 and/or seal ring 810.

Seal ring 810 encloses a circuit region 820, which includes at least one functional IC, such as an IC configured to perform a logic function, a memory function, a digital function, an analog function, a mixed signal function, an RF function, an input/output (I/O) function, a communications function, a power management function, other function, or combinations thereof. In some embodiments, circuit region 820 provides a system-on-chip (SoC), which generally refers to a single chip or monolithic die having multiple functions. In some embodiments, the SoC is a single chip having an entire system, such as a computer system, fabricated thereon. For example, circuit region 820 may have circuitry and/or circuits for a system having a central processing unit (CPU), a graphics processing unit (GPU), a memory unit, a communications unit, and a power management unit. Circuit region 820 includes a device substrate 822 and an MLI 825 electrically connected to device substrate 822. Device substrate 822 is similar to device substrate 102 and/or device layer DL. For example, devices substrate 822 includes transistors and/or other devices, such as those described herein. MLI 825 is similar to MLIs and/or MLI 105 described herein. For example, MLI 825 includes a dielectric layer 830 having conductive lines 845, which can be arranged and configured into an MD layer and M0 layer to MX layer, and conductive vias 840, which can be arranged and configured into a VD/VG layer and a V0 layer to V(X−1) layer, disposed therein. Dielectric layer 830, conductive lines 835, and conductive vias 840 are similar to the dielectric layers, conductive lines, and conductive vias described herein. For example, dielectric layer 830, conductive lines 835, and conductive vias 840 can be configured and arranged to provide MN/V(N−1) interconnect structures that are barrier-free graphite line/metal via interconnect structures, barrier-free ruthenium line/metal via interconnect structures, dual damascene interconnect structures, or combinations thereof, such as described herein.

Seal ring 810 can protect circuit region 820 from moisture degradation, ionic contamination, other damage (e.g., that may arise during a dicing process or other fabrication process) and/or contamination, or combinations thereof. Seal ring 810 is along a periphery and/or perimeter of IC chip 800 and is a continuous structure that surrounds circuit region 820. In the depicted embodiment, seal ring 810 has a substantially rectangular or substantially square shape in a top view, though the present disclosure contemplates seal ring 810 having other shapes in a top down view (e.g., circle, hexagon, etc.). In some embodiments, seal ring 810 may have a discontinuous structure that forms a ring around circuit region 820. In some embodiments, seal ring 810 is electrically isolated from active devices, such as transistors, of device substrate 822, and seal ring 810 does not form any functional circuits with active devices. In other words, seal ring 810 is not electrically connected to device substrate 822, though seal ring may be physically connected to device substrate 822, in some embodiments.

Seal ring 810 includes conductive lines 845 and conductive vias 850 disposed in dielectric layer 830, where conductive lines 845 and conductive vias 850 are arranged and configured to form a stack of interconnect structures (i.e., conductive line 845 and conductive via 850 pairs) that form at least one ring around circuit region 820. Seal ring 810 forms a portion of MLI 825, and seal ring 810 can extend partially or entirely through MLI 825. For example, seal ring 810 may form a portion of M0 layer to MX layer/V0 layer to V(X−1) layer. In another example, seal ring 810 forms a topmost layer of MLI 825, such as a portion of MX layer/V(X−1) layer. In yet another example, seal ring 810 forms a portion of intermediate layers of MLI 825, such as M3 layer to M6 layer/V3 layer to V5 layer. Conductive lines 845 and conductive vias 850 may thus be formed at the same time, with the same processes, with the same materials, or combinations thereof as conductive lines 835 and conductive vias 840. In such embodiments, dielectric layer 830, conductive lines 845, and conductive vias 850 can be configured and arranged to provide MY/V(Y−1) interconnect structures that are barrier-free graphite line/metal via interconnect structures, barrier-free ruthenium line/metal via interconnect structures, dual damascene interconnect structures, or combinations thereof, such as described herein. For example, seal ring 810 can include MY/V(Y−1) interconnect structures that are barrier-free graphite line/metal via interconnect structures, similar to those described above. In such embodiments, conductive lines 845 include barrier-free graphite plugs similar to graphite plugs 130A-130C, and conductive vias 850 include barrier-free metal vias similar to vias 124 and vias 225. Dimensions of graphite plugs of conductive lines 845 in seal ring 810 may be different than dimensions of graphite plugs of conductive lines 835 in circuit region 820. For example, widths of conductive lines 845 (i.e., graphite plugs) are greater than widths of conductive lines 835 (i.e., graphite plugs). In some embodiments, widths of conductive lines 845 are about 100 nm to about 180 nm, and widths of conductive lines 835 are about 8.5 nm to about 12 nm.

Figure 16:
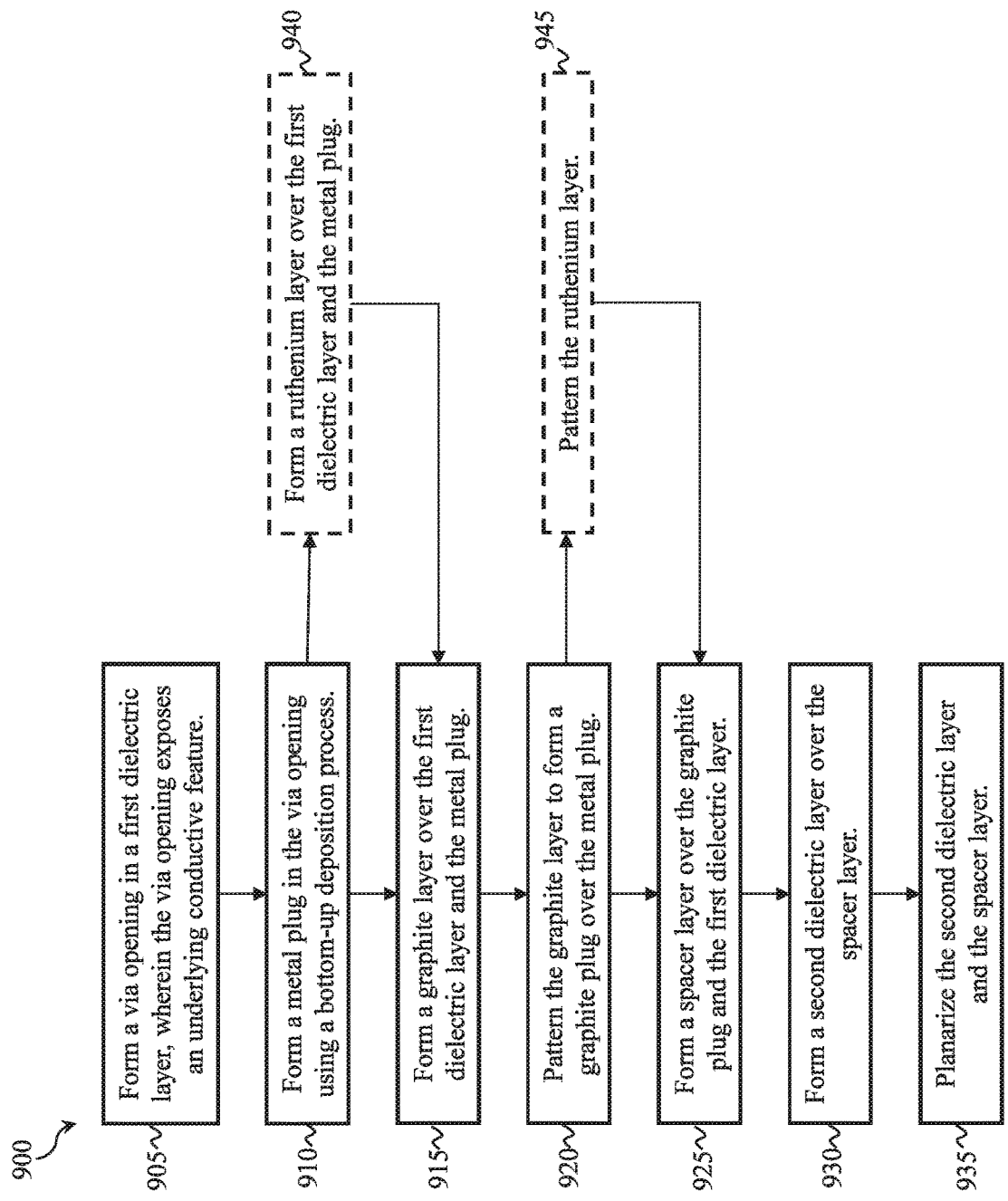
FIG. 16 is a flow chart of a method for fabricating an interconnect structure, in portion or entirety, according to various aspects of the present disclosure.

FIG. 16 is a flow chart of a method 900 for fabricating an interconnect structure, in portion or entirety, having barrier-free graphite lines and barrier-free metal vias as described herein according to various aspects of the present disclosure. The interconnect structure fabricated by method 900 and its configuration can reduce capacitance and/or resistance associated therewith, thereby reducing associated RC delay. At block 905, method 900 includes forming a via opening in a first dielectric layer. The via opening exposes an underlying conductive feature, such as a conductive line of an underlying routing layer. At block 910, a metal plug is formed in the via opening using a bottom-up deposition process. The metal plug may be a ruthenium plug, a tungsten plug, or a molybdenum plug. The metal plug physically contacts the first dielectric layer and the underlying conductive feature. At block 915, a graphite layer is formed over the first dielectric layer and the metal plug. At block 920, graphite layer is patterned to form a graphite plug over the metal plug. The graphite plug physically contacts the metal plug. At block 925, a spacer layer is formed over the graphite plug and the first dielectric layer. The spacer layer includes an electrically insulating material. At block 930, a second dielectric layer is formed over the spacer layer. At block 935, the second dielectric layer and the spacer layer are planarized, which exposes the graphite plug. In some embodiments, before block 915, method 900 proceeds to block 940 with forming a ruthenium layer over the first dielectric layer and the metal plug. In such embodiments, method 900 returns to block 915 after forming the ruthenium layer, and the graphite layer is formed over the ruthenium layer. Further, in such embodiments, method 900 proceeds to block 945 with patterning the ruthenium layer before forming the spacer layer at block 925. Additional steps can be provided before, during, and after method 900, and some of the steps described can be moved, replaced, or eliminated for additional embodiments of method 900.

The present disclosure provides for many different embodiments. Interconnects that facilitate reduced resistance and corresponding techniques for forming the interconnects are disclosed herein. An exemplary interconnect structure of a multilayer interconnect (MLI) of a device includes a first dielectric layer, a second dielectric layer disposed over the first dielectric layer, a metal plug disposed in the first dielectric layer, and a graphite plug disposed in the second dielectric layer. The metal plug physically contacts the first dielectric layer. The graphite plug physically contacts the metal plug and the first dielectric layer. In some embodiments, the metal plug is a tungsten plug. In some embodiments, the metal plug is a ruthenium plug. In some embodiments, the metal plug is a molybdenum plug.

In some embodiments, the interconnect structure further includes a spacer layer between sidewalls of the graphite plug and the second dielectric layer. The spacer layer is further between the first dielectric layer and the second dielectric layer and wherein the spacer layer includes an electrically insulating material. In some embodiments, the metal plug is a portion of a via layer of the MLI, the graphite plug is a portion of a routing layer of the MLI, and the routing layer and the via layer are connected to a transistor. In some embodiments, the metal plug is a portion of a via layer of the MLI, the graphite plug is a portion of a routing layer of the MLI, and the metal plug and the graphite plug form a portion of a seal ring.

In some embodiments, the metal plug is a first metal plug and the graphite plug is a first graphite plug. The interconnect structure further includes a second graphite plug disposed in a third dielectric layer and a second metal plug disposed in a fourth dielectric layer. The first dielectric layer is disposed over the third dielectric layer, and the third dielectric layer is disposed over the fourth dielectric layer. The first metal plug physically contacts the second graphite plug. The second metal plug physically contacts the fourth dielectric layer. The second metal plug physically contacts the second graphite plug.

In some embodiments, the metal plug is a first metal plug. The interconnect structure further includes a second metal plug disposed in a third dielectric layer and a third metal plug disposed in a fourth dielectric layer. The second metal plug physically contacts the third dielectric layer. The first dielectric layer is disposed over the third dielectric layer. The first metal plug physically contacts the second metal plug. The third metal plug physically contacts the second metal plug. The third metal plug physically contacts the fourth dielectric layer.

An exemplary device includes a transistor, a dielectric layer disposed over the transistor, and an interconnect structure disposed in the dielectric layer and electrically connected to the transistor. The interconnect structure has a conductive line disposed over a conductive via, the conductive line includes an electrically conductive non-metal material, and the conductive via includes a metal material.

In some embodiments, the electrically conductive non-metal material is graphite and the metal material is tungsten.

In some embodiments, the electrically conductive non-metal material is graphite and the metal material is ruthenium. In some embodiments, the electrically conductive non-metal material is graphite and the metal material is molybdenum.

In some embodiments, the metal material is a first metal material, and the conductive line includes a conductive plug and a conductive layer. The conductive layer is between the conductive plug and the conductive via, the conductive plug includes the electrically conductive non-metal material, and the conductive layer includes a second metal material that is different than the first metal material. In some embodiments, the first metal material is tungsten or molybdenum and the second metal material is ruthenium.

An exemplary method includes forming a via opening in a first dielectric layer, forming a metal plug in the via opening, forming a graphite layer over the metal plug and the first dielectric layer, patterning the graphite layer to form a graphite plug over the metal plug, and forming a second dielectric layer over the first dielectric layer and the graphite plug, wherein the graphite plug is embedded within the second dielectric layer. In some embodiments, forming the metal plug in the via opening includes performing a bottom-up deposition process.

In some embodiments, the method further includes, before forming the graphite layer, forming a ruthenium layer over the metal plug and the first dielectric layer and patterning the ruthenium layer. The graphite layer is formed over the ruthenium layer.

In some embodiments, patterning the graphite layer to form the graphite plug over the metal plug includes forming a mask layer over the graphite layer, forming a resist feature over the mask layer that overlaps the metal plug, etching the mask layer using the resist feature as a first etch mask, thereby forming a mask feature that overlaps the metal plug, and etching the graphite layer using the mask feature as a second etch mask. In some embodiments, the mask layer is a silicon oxide layer, etching the mask layer includes performing a silicon oxide etch, and etching the graphite layer includes performing an oxygen plasma etch.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An interconnect structure of a multilayer interconnect (MLI) of a device, the interconnect structure comprising:
   a first dielectric layer;
   a second dielectric layer disposed over the first dielectric layer;
   a first metal plug disposed in the first dielectric layer, wherein the first metal plug abuts the first dielectric layer;
   a graphite plug disposed in the second dielectric layer, wherein the graphite plug abuts the first metal plug and the first dielectric layer;
   a second metal plug disposed in a third dielectric layer, wherein the second metal plug abuts the third dielectric layer, the first dielectric layer is disposed over the third dielectric layer, and the first metal plug abuts the second metal plug; and a third metal plug disposed in a fourth dielectric layer, wherein the second metal plug is disposed on the third metal plug and the third metal plug abuts the fourth dielectric layer.

2. The interconnect structure of claim 1, wherein the first metal plug is a tungsten plug.

3. The interconnect structure of claim 1, wherein the first metal plug is a ruthenium plug.

4. The interconnect structure of claim 1, wherein the first metal plug is a molybdenum plug.

5. The interconnect structure of claim 1, further comprising a spacer layer between sidewalls of the graphite plug and the second dielectric layer, wherein the spacer layer is further between the first dielectric layer and the second dielectric layer and wherein the spacer layer includes an electrically insulating material.

6. The interconnect structure of claim 1, further comprising an adhesion layer disposed between and abutting the second metal plug and the third metal plug.

7. The interconnect structure of claim 1, wherein the first metal plug and the third metal plug are formed of a first metal, the second metal plug is formed of a second metal, and the first metal is different than the first metal.

8. The interconnect structure of claim 1, wherein the first metal plug is a portion of a via layer of the MLI, the graphite plug is a portion of a routing layer of the MLI, and the routing layer and the via layer are connected to a transistor.

9. The interconnect structure of claim 1, wherein the first metal plug is a portion of a via layer of the MLI, the graphite plug is a portion of a routing layer of the MLI, and the first metal plug and the graphite plug form a portion of a seal ring.

10. A device comprising:
a transistor;
a dielectric layer disposed over the transistor; and
an interconnect structure disposed in the dielectric layer and electrically connected to the transistor, wherein the interconnect structure has a conductive line disposed over a conductive via, the conductive line includes a conductive plug and a conductive layer, wherein the conductive layer is between the conductive plug and the conductive via, and further wherein the conductive plug includes an electrically conductive non-metal material, the conductive via includes a first metal material, and the conductive layer includes a second metal material that is different than the first metal material.

11. The device of claim 10, wherein the electrically conductive non-metal material is graphite and the first metal material is tungsten.

12. The device of claim 10, wherein the electrically conductive non-metal material is graphite and the first metal material is ruthenium.

13. The device of claim 10, wherein the electrically conductive non-metal material is graphite and the first metal material is molybdenum.

14. The device of claim 10, wherein the first metal material is molybdenum, and the second metal material is ruthenium.

15. The device of claim 10, wherein the first metal material is tungsten and the second metal material is ruthenium.

16. A method comprising:
forming a via opening in a first dielectric layer;
forming a metal plug in the via opening;
forming a graphite layer over the metal plug and the first dielectric layer;
patterning the graphite layer to form a graphite plug over the metal plug, wherein the patterning the graphite layer to form the graphite plug over the metal plug includes:
forming a mask layer over the graphite layer,
forming a resist feature over the mask layer that overlaps the metal plug,
etching the mask layer using the resist feature as a first etch mask, thereby forming a mask feature that overlaps the metal plug, and
etching the graphite layer using the mask feature as a second etch mask; and
forming a second dielectric layer over the first dielectric layer and the graphite plug, wherein the graphite plug is embedded within the second dielectric layer.

17. The method of claim 16, further comprising:
before forming the graphite layer, forming a ruthenium layer over the metal plug and the first dielectric layer, wherein the graphite layer is formed over the ruthenium layer; and
patterning the ruthenium layer.

18. The method of claim 16, wherein the forming the metal plug in the via opening includes performing a bottom-up deposition process.

19. The method of claim 16, wherein the forming the metal plug includes forming a tungsten plug.

20. The method of claim 16, wherein:
the mask layer is a silicon oxide layer and the etching the mask layer includes performing a silicon oxide etch; and
the etching the graphite layer includes performing an oxygen plasma etch.

* * * * *